(12) United States Patent
Oh et al.

(10) Patent No.: US 7,925,854 B2
(45) Date of Patent: *Apr. 12, 2011

(54) SYSTEM AND METHOD OF OPERATING MEMORY DEVICES OF MIXED TYPE

(75) Inventors: HakJune Oh, Kanata (CA); Hong Beom Pyeon, Kanata (CA); Jin-Ki Kim, Ottawa (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 461 days.

This patent is subject to a terminal disclaimer.

(21) Appl. No.: 11/771,241

(22) Filed: Jun. 29, 2007

(65) Prior Publication Data
US 2008/0140916 A1    Jun. 12, 2008

Related U.S. Application Data

(60) Provisional application No. 60/868,773, filed on Dec. 6, 2006, provisional application No. 60/870,892, filed on Dec. 20, 2006.

(51) Int. Cl.
*G06F 12/00* (2006.01)

(52) U.S. Cl. ........ 711/167; 711/148; 711/103; 711/104; 711/E12.084; 714/48; 710/9

(58) Field of Classification Search .................. None
See application file for complete search history.

(56) References Cited

U.S. PATENT DOCUMENTS

| | | | | |
|---|---|---|---|---|
| 4,360,870 A * | 11/1982 | McVey | ........................ | 710/9 |
| 5,249,270 A | 9/1993 | Stewart | | |
| 5,357,621 A | 10/1994 | Cox | | |
| 5,404,460 A | 4/1995 | Thomsen et al. | | |

(Continued)

FOREIGN PATENT DOCUMENTS
EP    1717985 A1    11/2006

OTHER PUBLICATIONS

Tal, Arie, "Two Technologies Compared: NOR vs. NAND", M-Systems, p. 5, Jul. 2003, retrieved from: http://www.dataio.com/pdf/NAND/MSystems/MSystems_NOR_vs_NAND.pdf.*
PCT Patent Application No. PCT/CA2007/002173 International Search Report Dated Apr. 7, 2008.
PCT Patent Application No. PCT/CA2007/002171 International Search Report dated Mar. 17, 2008.

(Continued)

*Primary Examiner* — Reginald G Bragdon
*Assistant Examiner* — Arvind Talukdar
(74) *Attorney, Agent, or Firm* — Shin Hung; Borden Ladner Gervais LLP

(57) ABSTRACT

A memory system architecture is provided in which a memory controller controls memory devices in a serial interconnection configuration. The memory controller has an output port for sending memory commands and an input port for receiving memory responses for those memory commands requisitioning such responses. Each memory device includes a memory, such as, for example, NAND-type flash memory, NOR-type flash memory, random access memory and static random access memory. Each memory command is specific to the memory type of a target memory device. A data path for the memory commands and the memory responses is provided by the interconnection. A given memory command traverses memory devices in order to reach its intended memory device of the serial interconnection configuration. Upon its receipt, the intended memory device executes the given memory command and, if appropriate, sends a memory response to a next memory device. The memory response is transferred to the memory controller.

36 Claims, 45 Drawing Sheets

U.S. PATENT DOCUMENTS

| | | | |
|---|---|---|---|
| 5,430,859 | A | 7/1995 | Norman et al. |
| 5,475,854 | A | 12/1995 | Thomsen et al. |
| 5,806,070 | A | 9/1998 | Norman et al. |
| 6,009,479 | A | 12/1999 | Jeffries |
| 6,044,426 | A | 3/2000 | Farmwald |
| 6,144,576 | A | 11/2000 | Leddige et al. |
| 6,148,363 | A | 11/2000 | Lofgren et al. |
| 6,304,921 | B1 | 10/2001 | Rooke |
| 6,317,812 | B1 | 11/2001 | Lofgren et al. |
| 6,453,365 | B1 | 9/2002 | Habot |
| 6,567,904 | B1 | 5/2003 | Khandekar et al. |
| 6,658,509 | B1 | 12/2003 | Bonella et al. |
| 6,715,044 | B2 | 3/2004 | Lofgren et al. |
| 6,799,235 | B2 | 9/2004 | Bormann et al. |
| 6,928,501 | B2 | 8/2005 | Andreas et al. |
| 6,944,697 | B2 | 9/2005 | Andreas |
| 6,950,325 | B1 | 9/2005 | Chen |
| 6,996,644 | B2 | 2/2006 | Schoch et al. |
| 7,031,221 | B2 | 4/2006 | Mooney et al. |
| 7,032,039 | B2 | 4/2006 | DeCaro |
| 7,356,639 | B2 | 4/2008 | Perego |
| 2003/0074505 | A1 | 4/2003 | Andreas |
| 2003/0221061 | A1 | 11/2003 | El-Batal et al. |
| 2004/0148482 | A1 | 7/2004 | Grundy et al. |
| 2004/0256638 | A1 | 12/2004 | Perego |
| 2005/0120136 | A1 | 6/2005 | Park |
| 2005/0160216 | A1 | 7/2005 | Norman |
| 2006/0031593 | A1 | 2/2006 | Sinclair |
| 2007/0076479 | A1 | 4/2007 | Kim et al. |
| 2007/0083701 | A1 | 4/2007 | Kapil |
| 2007/0109833 | A1 | 5/2007 | Pyeon et al. |

OTHER PUBLICATIONS

PCT Patent Application No. PCT/CA2007/002193 International Search Report Dated Apr. 7, 2008.

PCT Patent Application No. PCT/CA2007/002182 International Search Report dated Mar. 18, 2008.

PCT Patent Application No. PCT/CA2007/002147 Written Opinion dated Mar. 10, 2008.

King et al., "Communicating with Daisy Chained MCP42XXX Digital Potentiometers", 2001 Microtechnology Inc.

Microchip Product Description 24AA1025/24LC1025/24FC1025, 2006 Michropchip Technology Inc.

Intel, "Intel StrataFlash Wireless Memory (L18)", Order No. 251902, Revision 010, Aug. 2005.

Intel, "How to Use OTP Registers for Security Applications", Application Note 717, Oct. 1999, Order No. 292265-001.

The I 2C-Bus Specification, Version 2.1, Jan. 2000.

Spansion Data Sheet, S70GL01GN00 MirrorBit Flash 1024 Megabit, 3.0 Volt-only Page Mode Flash Memory Featuring 110 mm MirrorBit Process Technology, Jun. 1, 2005.

ST Product Description, "2 Mbit, Low Voltage, Serial Flash Memory With 40MHz SPI Bus Interface", Aug. 2005.

HyperTransport Technology Consortium, HyperTransport I/O Link Specification, Revision 3.00, Apr. 21, 2006.

Kennedy et al., "A 2Gb/s Point-to-Point Heterogeneous Voltage Capable DRAM for Capacity-Scalable Memory Subsystems", IEEE International Solid-State Circuits Conference, 2004.

Kim et al., A 3.6Gb/s/pin Simultaneous Bidirectional (SBD) I/O Interface for High-Speed DRAM, IEEE International Solid-State Circuits Conference, 2004.

IEEE Standard for High-Bandwidth Memory Interface Based on Scalable Coherent Interface (SCI) Signaling Technology (RamLink), IEEE Std. 1596.4-1996, The Institute of Electrical Electronics Engineers, Inc., pp. i-91, (Mar. 1996).

King et al., "Communicating with Daisy Chained MCP42XXX Digital Potentiometers", Microtechnology Inc., Company Document #DS00747A, Jan. 30, 2001.

Microchip Technology Inc., Product Description 24AA1025/24LC1025/24FC1025, Document #DS21941C, Feb. 16, 2006.

Samsung Electronics Product Description and Data Sheet, "K9XXG08UXM", Preliminary Flash Memory, May 2005.

Atmel Product Description "8-megabit 2.5-volt Only or 2.7-volt Only DataFlash", AT45DB081B, Rev.2225H-DFLASH-10/04, Oct. 2004.

Silicon Storage Technology, Inc. Specification, "16 Mbit SPI Serial Flash", Doc #S7 1271-00-000, Apr. 2005.

Samsung, "DDR2 Fully Buffered DIMM: 240pin FBDIMMs based on 512Mb C-die", Rev. 1.3, Sep. 2006, pp. 1-32.

Kennedy et al., "A 2Gb/s Point-to-Point Heterogeneous Voltage Capable DRAM for Capacity-Scalable Memory Subsystems", IEEE International Solid-State Circuits Conference, San Francisco, USA, Feb. 2004.

Kim et al., A 3.6Gb/s/pin Simultaneous Bidirectional (SBD) I/O Interface for High-Speed DRAM, IEEE International Solid-State Circuits Conference, San Francisco, USA, Feb. 2004.

* cited by examiner

| TYPE | HEX | Bit 7 | Bit 6 | Bit 5 | Bit 4 | Bit 3 | Bit 2 | Bit 1 | Bit 0 |
|---|---|---|---|---|---|---|---|---|---|
| NAND Flash | 00h | 0 | 0 | 0 | 0 | 0 | 0 | 0 | 0 |
| NOR Flash | 01h | 0 | 0 | 0 | 0 | 0 | 0 | 0 | 1 |
| DRAM | 02h | 0 | 0 | 0 | 0 | 0 | 0 | 1 | 0 |
| SRAM | 03h | 0 | 0 | 0 | 0 | 0 | 0 | 1 | 1 |
| PSRAM | 04h | 0 | 0 | 0 | 0 | 0 | 1 | 0 | 0 |
| DiNOR Flash | 05h | 0 | 0 | 0 | 0 | 0 | 1 | 0 | 1 |
| FeRAM | 06h | 0 | 0 | 0 | 0 | 0 | 1 | 1 | 0 |
| PCRAM | 07h | 0 | 0 | 0 | 0 | 0 | 1 | 1 | 1 |
| Serial EEPROM | 08h | 0 | 0 | 0 | 0 | 1 | 0 | 0 | 0 |
| RFU | . | . | . | . | . | . | . | . | . |
| RFU | . | . | . | . | . | . | . | . | . |
| RFU | . | . | . | . | . | . | . | . | . |
| MRAM | FFh | 1 | 1 | 1 | 1 | 1 | 1 | 1 | 1 |

FIG. 5B

| Operation | 1st Byte | 2nd Byte | 3rd Byte | 4th Byte | 5th Byte | 6th Byte | 7th Byte | 8th Byte | 9th Byte | ... | N-th Byte |
|---|---|---|---|---|---|---|---|---|---|---|---|
| Read | TYPE | TDA | CMD | RA | RA | RA | CA | CA | - | - | - |
| Write | TYPE | TDA | CMD | RA | RA | RA | CA | CA | DATA | DATA | DATA |
| Erase | TYPE | TDA | CMD | RA | RA | RA | - | - | - | - | - |
| Read Status | TYPE | TDA | CMD | - | - | - | - | - | - | - | - |
| Read Device Type | TYPE | TDA | CMD | - | - | - | - | - | - | - | - |
| Write Configuration Register | TYPE | TDA | CMD | DATA | - | - | - | - | - | - | - |
| Write Device Address | TYPE | TDA*1 | CMD | - | - | - | - | - | - | - | - |
| Reset | TYPE | TDA | CMD | - | - | - | - | - | - | - | - |

FIG. 10

|  | Bit 7 | Bit 6 | Bit 5 | Bit 4 | Bit 3 | Bit 2 | Bit 1 | Bit 0 |
|---|---|---|---|---|---|---|---|---|
| TDA (Target Device Address) | | | | | | | | |
| 1st Byte | DA[7] | DA[6] | DA[5] | DA[4] | DA[3] | DA[2] | DA[1] | DA[0] |
| RA (Row Address) | | | | | | | | |
| 1st Byte | Low | Low | Low | Low | Low | Low | RA[17] | RA[16] |
| 2nd Byte | RA[15] | RA[14] | RA[13] | RA[12] | RA[11] | RA[10] | RA[9] | RA[8] |
| 3rd Byte | RA[7] | RA[6] | RA[5] | RA[4] | RA[3] | RA[2] | RA[1] | RA[0] |
| CA (Column Address) | | | | | | | | |
| 1st Byte | Low | Low | Low | Low | CA[11] | CA[10] | CA[9] | CA[8] |
| 2nd Byte | CA[7] | CA[6] | CA[5] | CA[4] | CA[3] | CA[2] | CA[1] | CA[0] |

FIG. 11

| Operation | Device TYPE (1 Byte) | Device DA (1 Byte) | Command (1 Byte) | Row Address (3 Bytes) | Column Address (2 Bytes) | Input Data (1st to N-th Bytes) |
|---|---|---|---|---|---|---|
| Page Read | 00h | Valid | 00h | Valid*2 | Valid*2 | - |
| Random Data Read | 00h | Valid | 05h | - | Valid | - |
| Page Read for Copy | 00h | Valid | 35h | Valid | - | - |
| Target Address Input for Copy | 00h | Valid | 8Fh | Valid | - | - |
| Serial Data Input | 00h | Valid | 80h | Valid | Valid | Valid |
| Random Data Input | 00h | Valid | 85h | - | Valid | Valid |
| Page Program | 00h | Valid | 10h | - | - | - |
| Block Erase | 00h | Valid | 60h | Valid | - | - |
| Read Status | 00h | Valid | 70h | - | - | - |
| Read Device Type | 00h | Valid | 90h | - | - | - |
| Write Configuration Register | 00h | Valid | A0h | - | - | Valid (1 Byte) |
| Write Device Address | 00h | Valid*1 | 39h | - | - | Valid (1 Byte) |
| Reset | 00h | Valid | FFh | - | - | - |

FIG. 12

| Operation | Device TYPE (1 Byte) | Device DA (1 Byte) | Command (1 Byte) | Row Address (3 Bytes) | Column Address (2 Bytes) | Input Data (1st to N-th Bytes) |
|---|---|---|---|---|---|---|
| Read | 01h | Valid | 00h | Valid*2 | Valid*2 | - |
| Write to Buffer | 01h | Valid | 80h | Valid | Valid | Valid |
| Program Buffer to Flash (confirm) | 01h | Valid | 10h | - | - | - |
| Chip Erase | 01h | Valid | 20h | - | - | - |
| Sector Erase | 01h | Valid | 21h | Valid | - | - |
| Program/Erase Suspend | 01h | Valid | C0h | - | - | - |
| Program/Erase Resume | 01h | Valid | D0h | - | - | - |
| Read Status | 01h | Valid | 70h | - | - | - |
| Read Device Type | 01h | Valid | 90h | - | - | - |
| Write Configuration Register | 01h | Valid | A0h | - | - | Valid (1 Byte) |
| Write Device Address | 01h | Valid*1 | 39h | - | - | Valid (1 Byte) |
| Reset | 01h | Valid | FFh | - | - | - |

FIG. 13

SYSTEM AND METHOD OF OPERATING MEMORY DEVICES OF MIXED TYPE

CROSS REFERENCE TO RELATED APPLICATIONS

This application claims the benefits of U.S. Provisional Patent Application No. 60/868,773 filed Dec. 6, 2006; U.S. Provisional Patent Application No. 60/870,892 filed Dec. 20, 2006; and U.S. patent application Ser. No. 11/622,828 filed Jan. 12, 2007, the disclosures of which are expressly incorporated herein by reference in their entirety.

FIELD OF THE INVENTION

The present invention relates generally to semiconductor device systems. More particularly, the present invention relates to an apparatus and a method for controlling semiconductor devices, such as, for example, memory systems with memory devices of varying or mixed type.

BACKGROUND OF THE INVENTION

Computer-based systems contain semiconductor devices, such as, for example, memory devices and processing devices. Memory is where information is stored while waiting to be operated on by the Central Processing Unit (CPU) of the computer. Memory is controlled by a memory controller, which can form part of the CPU or be separate from the CPU. The memory controller has an interface with the memory for communicating information. Known interfaces include parallel interfaces and serial interfaces.

Parallel interfaces use a large number of pins to read and write data. Unfortunately, as the number of input pins and wires increases, so do a number of undesired effects. These undesired effects include inter-symbol interference, signal skew and cross talk. Therefore, there is a need in the art for memory modules that have increased memory capacities and/or operating speeds while minimizing the number input pins and wires for accessing the memory modules.

Serial interfaces use fewer pins to read and write data. Serial flash memory is now available, but this tends to be very slow. For example, many conventional memories are using serial bus interface schemes that operate in the range of 1 MHz-20 MHz with the SPI (Serial Peripheral Interface) or I$^2$C (Inter-Integrated Circuit) compatible interface. However, those serial interface standards are usually slower than their parallel counterparts.

With reference to FIGS. 1A, 1B, 1C and 1D, shown are block diagrams of four primary flash memory architectures. The four primary flash-memory architectures include a traditional XIP model as shown in FIG. 1A, a shadow model as shown in FIG. 1B, a store-and-download model with NAND as shown in FIG. 1C, and a newer store-and-download model with hybridized NAND flash memory as shown in FIG. 1D.

Referring to FIG. 1A, the traditional XIP model has a NOR flash memory 102 and volatile memory 103, which is likely SRAM (Static Random Access Memory) or DRAM (Dynamic Random Access Memory), connected to an application processor 101. In the XIP model, the NOR flash memory 102 executes code, while the volatile memory 103 accounts for constantly changing system elements, such as variables, stack, and heat. In the XIP model, the NOR flash memory 102 can also provide data and code storage as well. The advantage of the XIP model is simplicity, but the disadvantage is its slow write speed.

Referring to FIG. 1B, the shadow model has a NOR flash memory 105, NAND flash memory 106, and volatile memory 107, which is likely SRAM or DRAM, connected to an application processor 104. Users boot a system with the NOR flash memory 105 and use the NAND flash memory 106 for storage. The volatile memory 107 handles all of the execution. The shadow model is an expensive model in that it is using the NOR flash memory 105, which is relatively pricey, only to boot up the system. The architecture is also a bit more complex, which means that it consumes more design time and cost. The shadow model also tends to be power-hungry because the volatile memory is constantly active.

To overcome the space issue, which is a huge factor, for example, in mobile handheld devices, the store-and-download architecture is employed as shown in FIG. 1C. The store-and-download architecture has a NAND flash memory 110 and volatile memory 111, which is likely SRAM or DRAM, connected to an application processor 108. The store-and-download architecture has no NOR flash memory, but there is an OTP (one-time-programmable) storage 109 or ROM (Read Only Memory) core designed into the application processor 108. The application processor 108 loads information into the volatile memory 111, which accesses the NAND flash memory 110 for data storage. The architecture is a bit more complex and requires more initial engineering costs, but ultimately, the unit cost of the system is less expensive. The main difficulty of the model is that users must employ extensive error-correction and error-detection coding because NAND flash memory is typically less reliable. Storing and downloading designs tend to require more power, as the RAM takes a more active role.

Referring to FIG. 1D, the hybrid store and download model has a hybrid NAND flash memory 113 and volatile memory 114, which is likely SRAM or DRAM, connected to an application processor 112. The hybrid NAND flash memory 113 mixes SRAM, control logic and NAND flash memory to create a memory device that is supposed to look like a NOR flash device. This hybrid model reads much faster than a standard NAND flash device and at the same speed as a NOR flash device. It also offers better write performance than NOR flash devices. Hybrid NAND flash memories are now available. Hybrid model requires less error-correction and error-detection coding than store-and-download models with standard NAND flash memories. The unit cost for hybridized NAND flash memories is, for example, 30 to 40% less than NOR flash memories at the same density. The cost of stand-alone NAND flash memories is slightly less than that of hybridized NAND flash memories.

The memory systems using any of the four primary flash memory architectures need much time for engineering design, software development and verification.

SUMMARY OF THE INVENTION

According to a broad aspect, there is provided a system or apparatus comprising memory devices of varying or mixed type, the memory devices being serially interconnected, so that input data is serially transferred from device to device.

According to another broad aspect, there is provided a semiconductor device for use in a serial interconnection configuration of a plurality of devices of mixed type wherein the plurality of devices are serially interconnected. A first device of the serial interconnection configuration receives a serial input. The serial input is propagated through the serial interconnection configuration. The serial input contains a device type identification, a command and a device address identification. The device executes the command based on the device type identification and the device address identification.

The semiconductor device may include a device controller for controlling operation of the device in response to the received serial input.

For example, the semiconductor device may further include a device type holder for holding a device type identification, the held type identification being provided for indicating the type of the device; and an address holder for holding a device address assigned in response to the serial input provided, the assigned address being provided for indication of the address of the device.

According to another broad aspect, there is provided a system comprising: a plurality of devices of mixed type, the devices being configured in a serial interconnection configuration wherein the devices are serially interconnected. Each of the devices has serial input and output connections. The system further comprises a serial output/input controller having a serial output connection for providing a serial input to the serial input connection of a first device of the serial interconnection configuration. The serial input is propagated through the serial interconnection configuration. The serial output/input controller has a serial input connection for receiving a serial output from a last device of the serial interconnection configuration. The serial input contains a device type identification, a command and a device address identification.

For example, the plurality of devices is configured in one serial interconnection configuration, the type of the devices being mixed. Each of the devices may include a device controller for controlling operation of the device in response to received serial input. Also, each of the devices may further comprise: a device address indicator for indicating a device address to be assigned to the device; and a device type indicator for indicating a device type identification of that device.

According to another broad aspect, there is provided a method for operating a plurality of devices of mixed type, the devices being configured in at least one serial interconnection configuration wherein the devices are serially interconnected, the method comprising: providing a serial input to a first device of the serial interconnection configuration, the serial input being propagated through the serial interconnection configuration, the serial input containing a device type identification, a command and a device address identification.

The method may further comprise: holding a device type identification of the device; and holding a device address assigned in response to the serial input provided. The method may further comprise determining whether the received device type identification matches the held device type identification. Advantageously, the received device type identification matches the held device type identification, a device type match result is provided; and the received device type identification does not match the held device type identification, a non-device type match result.

The method may further comprise determining whether the received device address identification matches the held device address. Advantageously, where the received device address identification matches the held device address, a device address match result is provided; and where the received device address identification does not match the held device address, a non-device address match result is provided. The method may execute the received command of the serial input in response to the device type match result and the device address match result.

According to another broad aspect, there is provided an apparatus for operating a plurality of devices of mixed type, the devices being configured in at least one serial interconnection configuration wherein the devices are serially interconnected, the apparatus comprising: a controller for providing a serial input to a first device of the serial interconnection configuration, the serial input being propagated through the serial interconnection configuration, the serial input containing a device type identification, a command and a device address identification.

For example, each of the devices has serial input and output connections and the controller has a serial output connections connected to the serial input connection of the first device and a serial input connection connected to the serial output connection of a last device of the serial interconnection configuration.

According to another broad aspect, there is provided a method comprising: assigning device addresses to a plurality of devices of mixed type, the devices being configured in at least one serial interconnection configuration wherein the devices are serially interconnected; and accessing the devices of the serial interconnection configuration based on a device type and a device address.

The method may further comprise establishing addresses in each of the devices of one type. For example, the step of establishing comprises: providing a serial input containing a device type identification, a device address identification and an address number to a first device of the serial interconnection configuration. The step of accessing may comprise: enabling at least one device of a first type in the serial interconnection configuration to be processed; and enabling at least one device of a second type in the serial interconnection configuration to be processed, during the process of the device of the first type, process time of the device of the first type being greater than that of the device of the second type.

According to an embodiment of the present invention, there is provided a memory system architecture in which a memory controller controls memory devices that are interconnected with serial links. The memory controller has an output interface for sending memory commands, and an input interface for receiving memory responses for those memory commands requisitioning such responses. Each memory device may be of any memory type, such as NAND flash or NOR flash for example. Each memory command is specific to the memory type of the intended memory device. A data path for the memory commands and the memory responses is provided through the links and interconnected devices. A given memory command may traverse many memory devices in order to reach its intended memory device. Upon its receipt, the intended memory device executes the given memory command and, if appropriate, sends a memory response to the memory controller.

In one embodiment, the memory commands sent by the memory controller are propagated through the serially interconnected memory devices in response to clocks. The command execution of one memory device is not overlapped with that of another memory device (e.g., a next device) in clock timings. Also, the command execution of memory devices can be overlapped with each other. In an address assignment operation, an address number changing by one device is completed before another device performs an address number changing.

According to an embodiment of the present invention, there is provided a memory devices which have memory types of, for example, NAND Flash EEPROM, NOR Flash EEPROM, AND Flash EEPROM, DiNOR Flash EEPROM, Serial Flash EEPROM, DRAM, SRAM, ROM, EPROM, FRAM, MRAM, and PCRAM. In a memory system having a serial interconnection configuration of mixed type memory devices, based on the target addresses, the memory type of each device can be read.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 5B is a table of an example encoding scheme for each memory device type;

FIG. 10 is a table of example predetermined formats for memory operations with type-dependent addressing;

FIG. 11 is a table of an example encoding scheme for type-dependent addressing;

FIG. 12 is a table of an example encoding scheme for NAND flash commands with type-dependent addressing;

FIG. 13 is a table of an example encoding scheme for NOR flash commands with type-dependent addressing;

DETAILED DESCRIPTION

In the following detailed description of sample embodiments of the invention, reference is made to the accompanying drawings, which form a part hereof, and in which is shown by way of illustration specific sample embodiments in which the present invention may be practiced. These embodiments are described in sufficient detail to enable those skilled in the art to practice the present invention, and it is to be understood that other embodiments may be utilized and that logical, mechanical, electrical, and other changes may be made without departing from the scope of the present invention. The following detailed description is, therefore, not to be taken in a limiting sense, and the scope of the present invention is defined by the appended claims.

Generally, the present invention provides apparatus and method for controlling semiconductor devices, such as, for example, memory systems with memory devices of mixed type.

Embodiments of the present invention are now described in the context of memory system. A memory system includes a memory controller and a serial interconnection configuration of memory devices.

Some memory subsystems employ multiple memory devices, such as, for example, flash memory devices, with interfaces. Here, the command string may be fed to all of the devices even though the command may only be performed on one of the devices. To select the device on which the command is to be performed, the command string may contain a device identifier (ID) or a device address that identifies the memory device to which the command is directed. Each device receiving the command string compares the ID contained in the command string to an ID associated with the device. If the two match, the device will assume that the command is directed to the device to execute the command.

As mentioned previously, there are many different memory device types with different interface specifications. Designing memory systems with varying or mixed device types using traditional architectures involves a lot of time in engineering design, software development, and verification. Also, parallel interface schemes can involve too much physical wiring or routings on a PCB (Printed Circuit Board) or on a MCP (Multi Chip Package), which can cause various noise problems in higher speed operation. More signal lines means more complex board designs and more space requirements as systems grow in density and in features. There is a need for improved memory system architecture.

Details of serial interconnection of memory devices are disclosed in U.S. patent application Ser. No. 11/324,023 filed Dec. 30, 2005, U.S. Provisional Patent Application No. 60/787,710 entitled "Serial Interconnection of Memory Devices" filed Mar. 28, 2006, and U.S. Provisional Patent Application No. 60/802,645 entitled "Serial Interconnection of Memory Devices" filed May 23, 2006, the contents of which are entirely incorporated herein by reference.

Figure 1D:
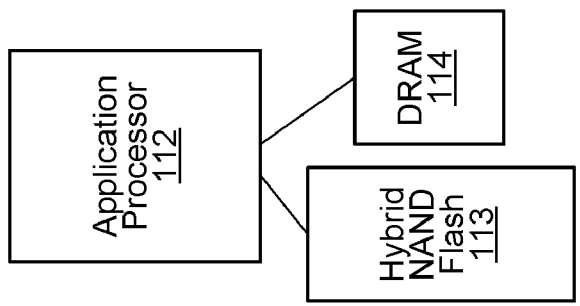
FIGS. 1A, 1B, 1C and 1D are block diagrams of four flash memory architectures.
Figure 1C:
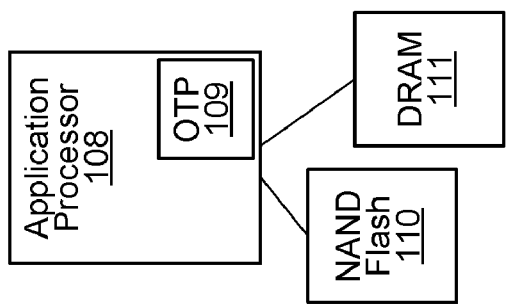
Figure 1B:
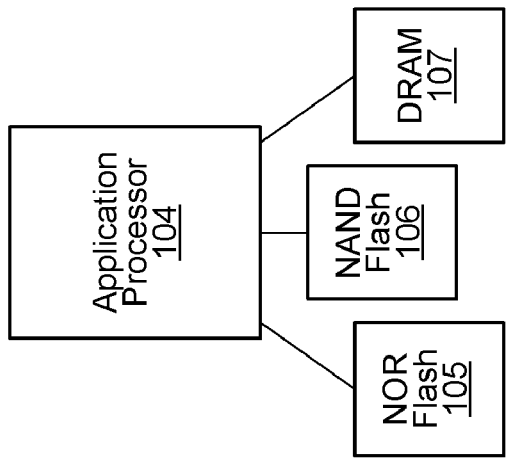
Figure 1A:
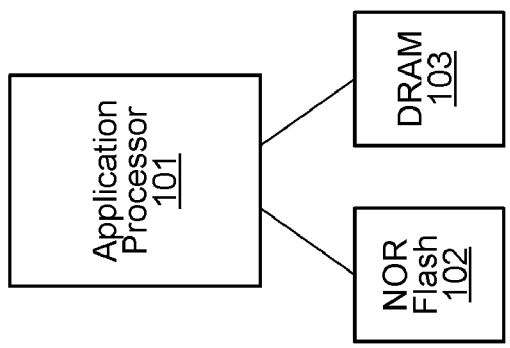
Figure 2A:
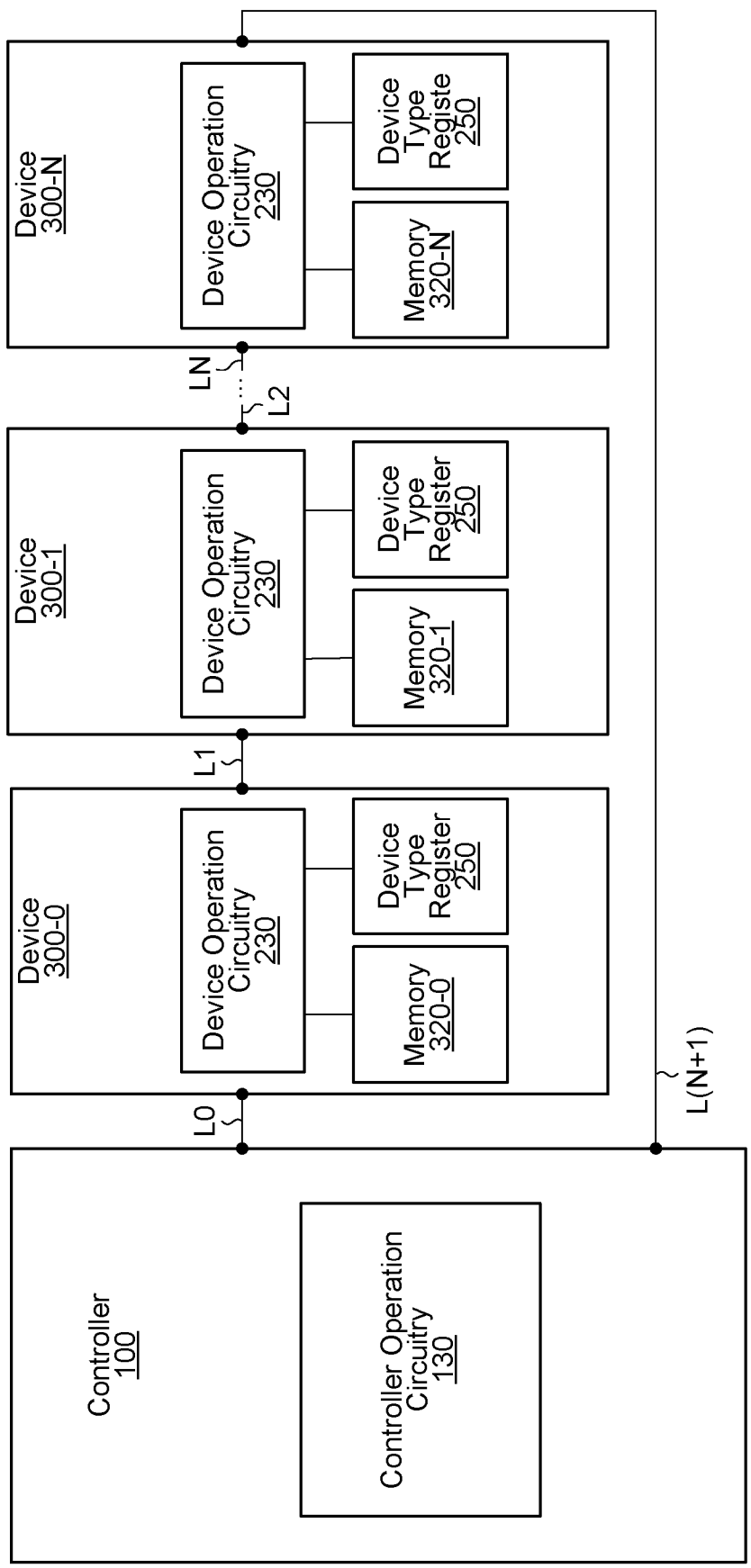
FIG. 2A is a block diagram of a memory system according to an embodiment of the present invention.

FIG. 2A shows a memory system according to an embodiment of the present invention. Referring to FIG. 2A, a memory system includes a controller 100 and a plurality of devices 300-0, 300-1, . . . , and 300-N in a serial interconnection configuration. N is an integer greater than one. In this particular example, the number of the serially interconnected memory devices is (N+1). The controller 100 and the devices 300-0, 300-1, . . . , and 300-N are interconnected using any appropriate connections, such as, for example, links. In the illustrated example, the links are serial links. The controller 100 and the devices 300-0, 300-1, . . . , and 300-N are interconnected through serial links L0, L1, L2, . . . , LN and L(N+1).

The controller 100 has controller operation circuitry 130. Each of the devices 300-0, 300-1, . . . , and 300-N has device operation circuitry 230 that performs memory operation control and memory initialization functions. The devices 300-0, 300-1, . . . , and 300-N have respective memory-type specific components such as respective memories 320-0, 320-1, . . . , and 320-N. Each of the devices 300-0, 300-1, . . . , and 300-N has a memory type from a plurality of supported memory types. The plurality of supported memory types is defined on an implementation-specific basis. Information on or identification of the memory type of each device is stored in a register 250 thereof. However, the types of the devices are unknown to the controller 100. Each of the controller operation circuitry and the device operation circuitry includes input and output circuitry, e.g., interface circuitry.

Figure 2B:
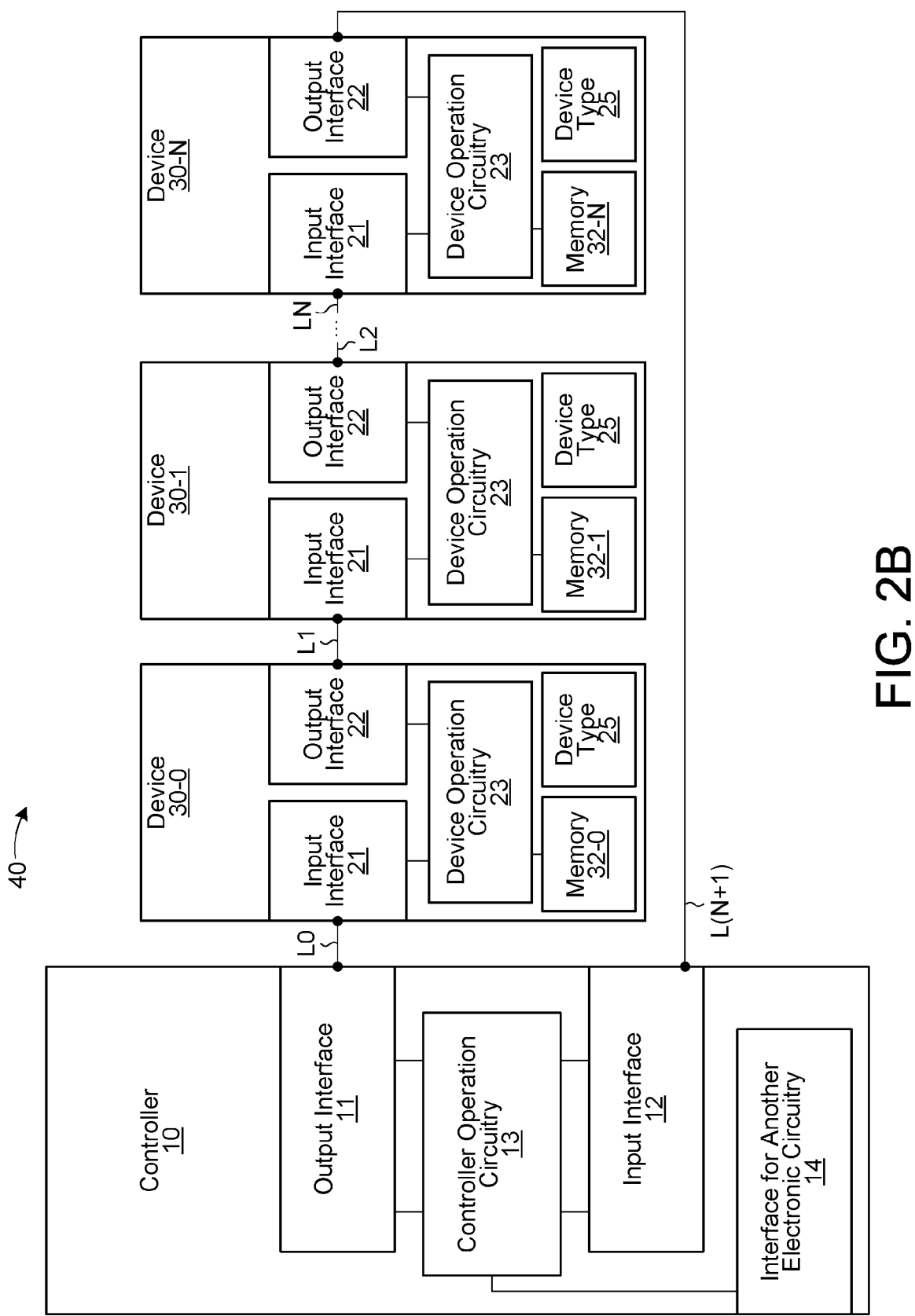
FIG. 2B is a block diagram of a memory system according to an embodiment of the present invention.

FIG. 2B shows an example memory system according to one embodiment of the present invention. Referring to FIG. 2B, the memory system 40 includes a memory controller 10 and a plurality of memory devices 30-0, 30-1, . . . , and 30-N in a serial interconnection configuration. N is an integer greater than one. In this particular example, the number of the serially interconnected memory devices is (N+1). The memory controller 10 and the memory devices 30-0, 30-1, . . . , and 30-N are interconnected using, such as, for example, serial links L0, L1, L2, . . . , LN and L(N+1).

The memory controller 10 has an output interface 11, an input interface 12 and controller operation circuitry 13. In some implementations, as shown in the illustrated example, the memory controller 10 also has another interface 14 for connection with another electronic circuit (not shown). The memory controller 10 may have other components, but they are not shown for sake of simplicity.

Some components of the memory devices 30-0, 30-1, . . . , and 30-N are identically numbered. For instance, each of the memory devices 30-0, 30-1, . . . , and 30-N has an input interface 21, an output interface 22 and memory device operation circuitry 23 that performs memory operation control and memory initialization functions. However, the memory devices 30-0, 30-1, . . . , and 30-N have respective memory-type specific components such as respective memory cores 32-0, 32-1, . . . , and 32-N. Each of the memory devices 30-0, 30-1, . . . , and 30-N has a device type from a plurality of supported memory types. The plurality of supported memory types is defined on an implementation-specific basis. This can be fixed, or in some embodiments subject to change, for example, by adding a memory device type over time. While a given configuration may not necessarily include memory devices of each of the plurality of supported memory device types, the memory controller 10 and interfaces are designed to allow for this functionality. There are many possibilities for the plurality of supported memory device types.

The plurality of supported memory types might for example include any two or more of NAND Flash EEPROM, NOR Flash EEPROM, AND Flash EEPROM, DiNOR Flash EEPROM, Serial Flash EEPROM, DRAM, SRAM, ROM, EPROM, FRAM, MRAM (Magnetoresistive Random Access Memory), and PCRAM. Other combinations of supported memory types are also possible.

Each of the memory devices 30-0, 30-1, . . . , and 30-N is aware of its memory type. This might for example be stored in a register as indicated by 25; however, more generally, each of the memory devices 30-0, 30-1, . . . , and 30-N may be provided with any appropriate circuitry for maintaining an identification of its memory device type. Other mechanisms by which each of the memory devices 30-0, 30-1, . . . , and 30-N is aware of its device type are also possible. Each of the memory devices 30-0, 30-1, . . . , and 30-N may have other components, but they are not shown for sake of simplicity.

In operation, the controller operation circuitry 13 of the memory controller 10 performs memory operation control and memory initialization functions. The controller operation circuitry 13 sends memory commands over the output interface 11. A data path for each memory command is provided by the combination of the memory devices 30-0, 30-1, . . . , and 30-N and the serial links L0, L1, L2, . . . , LN and L(N+1). For example, if a memory command is intended for the second memory device 30-1, then the memory command traverses the first memory device 30-0 over the serial links L0 and L1. If the memory command requisitions a response from the second memory device 30-1, the response will traverse the third memory device, . . . , and the N-th (last) device 30-N over the serial links L2, . . . , LN and L(N+1) back to the memory controller 10.

As noted above, each of the memory devices 30-0, 30-1, . . . , and 30-N may be any one of the plurality of supported device types. The controller operation circuitry 13 of the memory controller 10 is operable to send over the output interface 11, memory commands specific to the device type and receive over the input interface 12 memory responses for those memory commands requisitioning such responses. For example, if the controller operation circuitry 13 issues a command intended for the second memory device 30-1, then the command that is issued is specific to the device type of the second memory device 30-1, which may be different from the device type of other memory devices. Each of the memory devices 30-0, 30-1, . . . , and 30-N executes those memory commands that are addressed to the memory device, and forwards over the output interface 22 those memory commands that are addressed to another memory device. The memory system 40 can be expanded as appropriate in terms of different device types or mixed memory device type as well as memory density expansion without sacrificing system's overall performance.

Figure 2C:
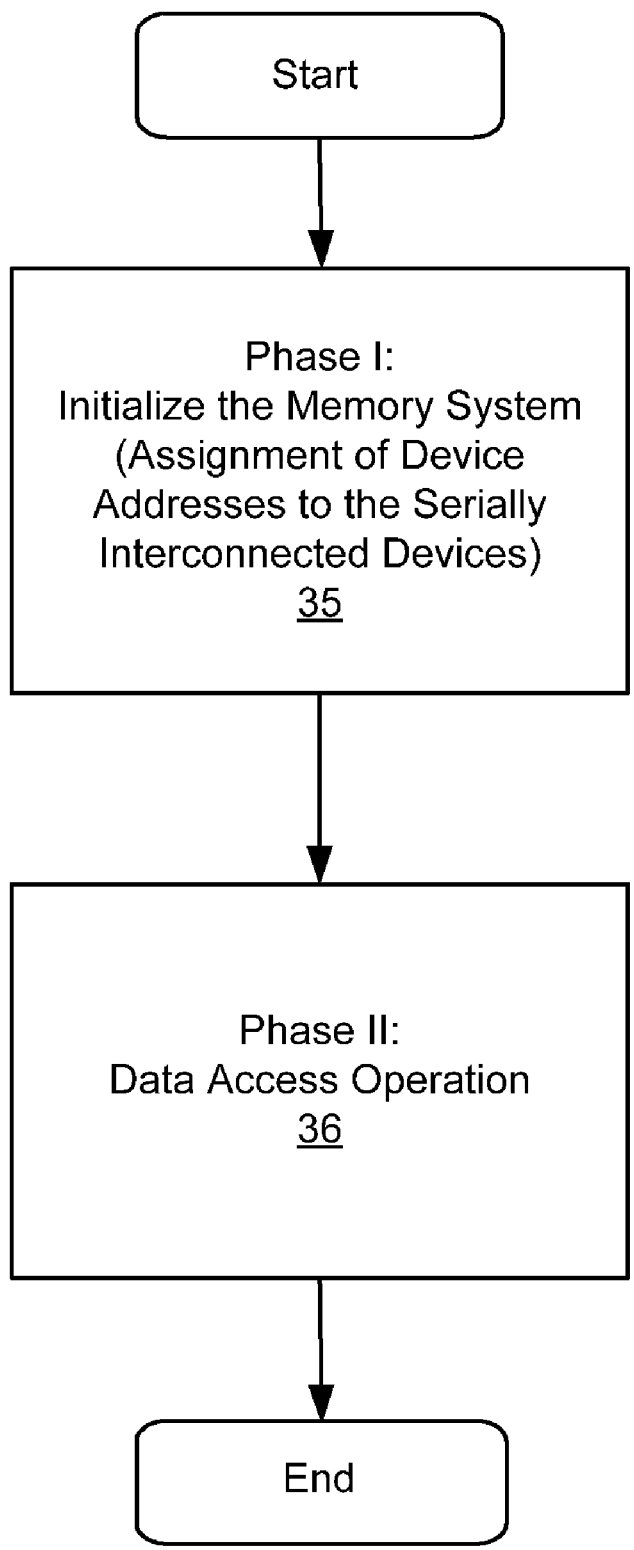
FIG. 2C is a flowchart illustrating operations of the memory system shown in FIG. 2B.

In general, the memory system 40 performs operations of two phases: an initialization phase as indicated by 35 and a normal operation phase as indicated by 36, as shown in FIG. 2C. In the initialization phase 35, the memory devices 30-0, 30-1, . . . , and 30-N are assigned with device addresses. The assigned device addresses are held in the memory devices. Thereafter, in the normal operation phase 36, a target or addressed memory device performs data access operations.

The controller operation circuitry 13 of the memory controller 10 sends memory commands over the output interface 11 for controlling the memory devices 30-0, 30-1, ..., and 30-N. There are many ways that this can be accomplished. For example purposes, first and second implementations are described below; however, other implementations are possible.

In the first implementation, the controller operation circuitry 13 sends memory commands. Each of the commands has a first portion and a second portion that in combination uniquely identify a selected memory device of the plurality of memory devices. In some implementations, the first portion identifies a device type of the selected memory device while the second portion identifies a device address of the selected memory device. Each memory command also has a command portion identifying a selected command to be executed by the selected memory device. Each memory command may also include other portions as appropriate, for example, further address information and data.

In the first implementation, when a memory device, for example, the first memory device 30-0 receives a memory command and then, the memory device operation circuitry 23 thereof determines whether the memory command is addressed to the memory device (e.g., the first memory device 30-0) in response to the first portion and the second portion of the memory command in combination. For example, the memory device operation circuitry 23 first interprets the first portion indicating the device type. If the device type indicated by the first portion is different from the device type of the first memory device 30-0 provided by the device type register 25, the memory device operation circuitry 23 of that device will not need to look at any further portions of the received memory command. It is, thus, determined that the received command is addressed to one of the other memory devices 30-1, ..., and 30-N. Accordingly, the memory device operation circuitry 23 forwards the memory command over the output interface 22. However, if the device type indicated by the first portion is identical to the device type of the first memory device 30-0, then the memory device operation circuitry 23 determines whether the device address indicated by the second portion matches the device address of the first memory device 30-0. If there is a match between the two device addresses, then the memory device operation circuitry 23 executes the selected command indicated by the command portion. Otherwise, the memory device operation circuitry 23 forwards the memory command over the output interface 22.

In the second implementation, the controller operation circuitry 13 of the memory controller 10 controls the plurality of memory devices by sending memory commands. Each of the memory commands includes a first portion that uniquely identifies a selected memory device of the plurality of memory devices. The first portion identifies the device address of the selected memory device. In the second implementation, there is no need for memory commands to include a device type. Each memory command also has a command portion identifying a selected command to be executed by the selected memory device. As before, each memory command may also include other portions as appropriate. In the second implementation, when a memory device, for example, the first memory device 30-0 receives a memory command and then, the memory device operation circuitry 23 thereof determines whether the memory command is addressed to that device (i.e., the first memory device 30-0) in response to the first portion of the memory command. The memory device operation circuitry 23 determines whether the device address indicated by the first portion matches the device address of the first memory device 30-0. If there is a match between the two device addresses, then the memory device operation circuitry 23 executes the selected command indicated by the command portion. Otherwise, the memory device operation circuitry 23 forwards the memory command over the output interface 22.

In some implementations, the controller operation circuitry 13 of the memory controller 10 is operable to send memory commands over the output interface 11 in response to requests received over the interface 14, and is further operable to respond to the requests using memory responses received over the input interface 12. The interface 14 may be any appropriate interface to another device or system (not shown) that uses the memory system 40.

There are many possibilities for the memory commands. These might include one or more of read operations, write operations, erase operations, read status operations, read ID operations, write configuration register operations, write address operations, and reset operations. There may be other memory commands.

The way in which the memory controller 10 sends memory commands may depend on the manner in which the device addresses are assigned. Example implementations for assigning the device addresses are provided below.

There are many ways for the device addresses to be assigned to the memory devices 30-0, 30-1, ..., and 30-N. In some implementations, the device addresses are predetermined or hard-wired. In other implementations, the controller operation circuitry 13 assigns the device addresses during an initialization stage. For example purposes, first and second implementations are described below; however, other implementations are possible.

In the first implementation, the controller operation circuitry 13 is operable to, for each device type of the plurality of supported device types, send over the output interface 11 a respective initialization message for assigning the device address to each memory device of that device type. Each of the memory devices 30-0, 30-1, ..., and 30-N receives and processes the initialization messages. For example, the first memory device 30-0 receives the initialization messages over the first input interface 21. For each initialization message received, if the initialization message is indicated to be for another device type than that of the first memory device 30-0, then the memory device operation circuitry 23 forwards the initialization message over the output interface 22. However, if the initialization message is indicated to be for the device type of the first memory device 30-0, then the memory device operation circuitry 23 determines the device address from the initialization message. This involves reading a device address from the initialization message. In some implementations, the device address as it is read from the initialization message becomes the device address of the first memory device 30-0. The memory device operation circuitry 23 forwards the initialization message over the output interface 22 with a new device address. Each of the other memory devices 30-1, ..., and 30-N performs a similar initialization process. For each respective initialization message sent, the controller operation circuitry 13 receives over the input interface 12 a respective initialization response from which the device address of each memory device of the device type can be determined unless there are no memory devices of the device type.

For example, in some implementations, for each memory device that is assigned a device address, the new device address that is forwarded to the next device is an increment of the device address. Therefore, if the first memory device of a given device type is assigned an address of 0, then the last memory device of the given device type will be assigned an address of m−1, where m is the number of memory devices of the given device type. By receiving an initialization response over the input interface 12 indicating an incremented device address of the last memory device of the given device type, the controller operation circuitry 13 can determine the device address of each memory device of the given device type. Note that where there are multiple device types, the memory controller 10 will not know which physical devices are of which type. Rather, the memory controller 10 knows how many memory devices of each type there are. For example, there might be four NAND devices and four NOR devices. The four NAND devices have type=NAND and address=0, 1, 2, 3, respectively; and the four NOR devices have type=NOR, address=0, 1, 2, 3, respectively. Then, irrespective of the physical address of the NAND and NOR memory devices, a command containing type and address portions will always find the target device. By implementing two different sets of device numbering (i.e., the device type and the device address), the memory controller 10 does not need to consider which device address is assigned for which device types in the memory system 40.

In the second implementation, the controller operation circuitry 13 of the memory controller 10 is operable to send over the output interface 11 an initialization message for assigning the device address to the memory devices 30-0, 30-1, ..., and 30-N. The memory devices 30-0, 30-1, ..., and 30-N receive and process the initialization message. For example, the first memory device 30-0 receives the initialization message over the input interface 21 and the memory device operation circuitry 23 thereof reads a device address from the received initialization message. In some implementations, the device address as it is read from the initialization message becomes the device address of the first memory device 30-0. The memory device operation circuitry 23 forwards the initialization message over the output interface 22 with a new device address. Each of the other memory devices 30-1, ..., and 30-N performs a similar initialization process. Eventually, the controller operation circuitry 13 of the memory controller 10 receives over the input interface 12 an initialization response from which the device address of each memory device can be determined.

For example, for each of the memory devices 30-0, 30-1, ..., and 30-N, the new device address that is forwarded to the next device is an increment of the device address. Therefore, if the first memory device 30-0 is assigned an address of 0, then the last memory device 30-N will be assigned an address of N, where the number of memory devices is (N+1). By receiving the initialization response over the input interface 12 indicating an incremented device address of the last memory device 30-N, the controller operation circuitry 13 can determine the device address of each memory device.

According to the second implementation described above, once the device address of each of the memory devices 30-0, 30-1, ..., and 30-N has been assigned, the controller operation circuitry 13 determines the device type of each memory device. For each device address, the controller operation circuitry 13 sends over the output interface 11 an additional initialization message for determining the device type of the memory device of the device address. Each of the memory devices 30-0, 30-1, ..., and 30-N receives and processes the additional initialization messages.

For example, upon the first memory device 30-0 receiving an additional initialization message over the input interface 21, the first memory device 30-0 determines based on the device address indicated in the additional initialization message whether the additional initialization message is intended for the first memory device 30-0. If it is, then the first memory device 30-0 responds to the additional initialization message over the output interface 22 with an identification of its device type. If the additional initialization message is intended for one of the other memory device 30-1, ..., and 30-N, then the first memory device 30-0 forwards the additional initialization message over the output interface 22. Each of the other memory devices 30-1, ..., and 30-N performs similar processing of the additional initialization messages. The controller operation circuitry 13 of the memory controller 10 receives over the input interface 12 for each memory device an initialization response indicating the device type of the memory device.

It is to be understood that the first and second implementations described above for the controller operation circuitry 13 are very specific for example purposes only. Variations and modifications are possible. For example, the first implementation is described above to involve a plurality of initialization messages for assigning the device address to each memory device; however, alternatively, there may be one or more initialization messages for this purpose. Also, the second implementation is described above to involve a plurality of additional initialization messages for determining the device type of each memory device; however, alternatively, the there may be one or more additional initialization messages for this purpose. In the examples described, the address of the received initialization message is established as the device address and a new address is generated and sent to the next device. In another implementation, each memory device receives an address and increments it before establishing this as the device address. A detailed example of this implementation is described in commonly assigned co-pending U.S. patent application Ser. No. 11/529,293 "Packet Based ID Generation for Serially Interconnected Devices" filed Sep. 29, 2006, which is hereby incorporated by reference in its entirety.

The examples provided above refer to interfaces. It is to be understood that there are many possibilities for such interfaces. Specific interfaces are provided in the examples that are described below. More generally, any appropriate interface may be implemented.

In some implementations, the memory controller 10 has a reset output (not shown) for connection with each of the memory devices 30-0, 30-1, ..., and 30-N. Examples of this are provided in the examples that are described below. More generally, the memory system 40 may be reset using any appropriate resetting implementation.

In some implementations, the memory controller 10 has a serial clock output (not shown) for connection with each of the memory devices 30-0, 30-1, ..., and 30-N. Examples of this are provided in the examples that are described below. More generally, the memory system 40 may be provided with a serial clock using any appropriate clock implementation.

In some implementations, the memory controller 10 has a chip select (not shown) for connection with each of the memory devices 30-0, 30-1, ..., and 30-N. Examples of this are provided in the examples that are described below. More generally, the memory devices 30-0, 30-1, ..., and 30-N can be enabled using any appropriate device enabling implementation.

FIG. 2C shows operations of the memory system shown in FIG. 2B. Referring to FIGS. 2B and 2C, the controller operation circuitry 13 of the controller 10 sends memory commands over the output interface 11 for controlling the devices 30-0, 30-1, ..., and 30-N. The controller operation circuitry 13 controls the devices 30-0, 30-1, ..., and 30-N, by sending memory commands. There are many ways that this can be accomplished. For example purposes, some example implementations are described below; however, other implementations are possible.

In general, the memory system 40 performs operations of two phases: an initialization phase as indicated by 35; and a normal operation phase as indicated by 36. In the initialization phase 35 (or an initialization mode), the devices 30-0, 30-1, . . . , and 30-N are assigned with device addresses. The assigned device addresses are held in the devices 30-0, 30-1, . . . , and 30-N. Thereafter, in the normal operation phase 36 (or a normal operation mode), a target or addressed memory device performs data access operations.

In an example of the initialization phase 35, the controller operation circuitry 13 sends memory commands. The commands have portions of a device address assignment to assign unique addresses to the devices and of a device address related number. In one implementation, the device address related number of the command from the controller operation circuitry 13 is an initial value or number and the initial number is incremented by each of the devices. Each of the incremented number is held in a respective device as its device address.

In an example of the normal operation phase 36, the controller operation circuitry 13 of the controller 10 sends memory commands. The memory commands include a first portion that uniquely identifies a selected memory device of the plurality of memory devices, with the device address. No device type is included in the memory commands. Each memory command also has a command portion identifying a selected command to be executed by the selected memory device. Each memory command may also include other portions as appropriate. When a memory device, for example, the first device 30-0 receives a memory command and then, the device operation circuitry 23 thereof determines whether the memory command is addressed to that device (i.e., the first device 30-0) in response to the first portion of the memory command. The device operation circuitry 23 determines whether the device address indicated by the first portion matches the device address of the first device 30-0. If there is a match between the two device addresses, the device operation circuitry 23 of the device 30-0 will execute the selected command indicated by the command portion. Otherwise, the device operation circuitry 23 forwards the memory command over the output interface 22 to a next device (e.g., the second device 30-1).

In some implementations, the controller operation circuitry 13 of the controller 10 is operable to send memory commands over the output interface 11 in response to requests received over the interface 14, and is further operable to respond to the requests using memory responses received over the input interface 12. The interface 14 may be any appropriate interface to another device or system (not shown) that uses the memory system 40.

There are many possibilities for the memory commands. These might include one or more of read operations, write operations, erase operations, read status operations, read DA operations, write configuration register operations, write address operations and reset operations. There may be other memory commands.

The way in which the controller 10 sends memory commands may depend on the manner in which the device addresses are assigned. Example implementations for assigning the device addresses are provided below.

In the following description and figures, some reference signs are used for signals and connections. For example, "SCLK" represents a clock signal and a clock input connection of a memory device; "SIP" represents a serial input port signal and a serial input port connection; "SOP" represents a serial output port signal and a serial output port connection; "IPE" represents an input port enable signal and an input port enable connection; "OPE" represents an output port enable signal and an output port enable connection; "CS#" represents a chip select signal and a chip select input connection or port; "RST#" represents a reset signal and a reset input connection or port. Also, the same reference signs are used for the same or corresponding blocks, connections, signals and circuitry.

FIGS. 3A, 3B, 3C, 3D, 3E and 3F show specific example memory systems according to embodiments of the present invention. It is to be understood that these Figures are very specific and are provided for example purposes only.

Figure 3A:
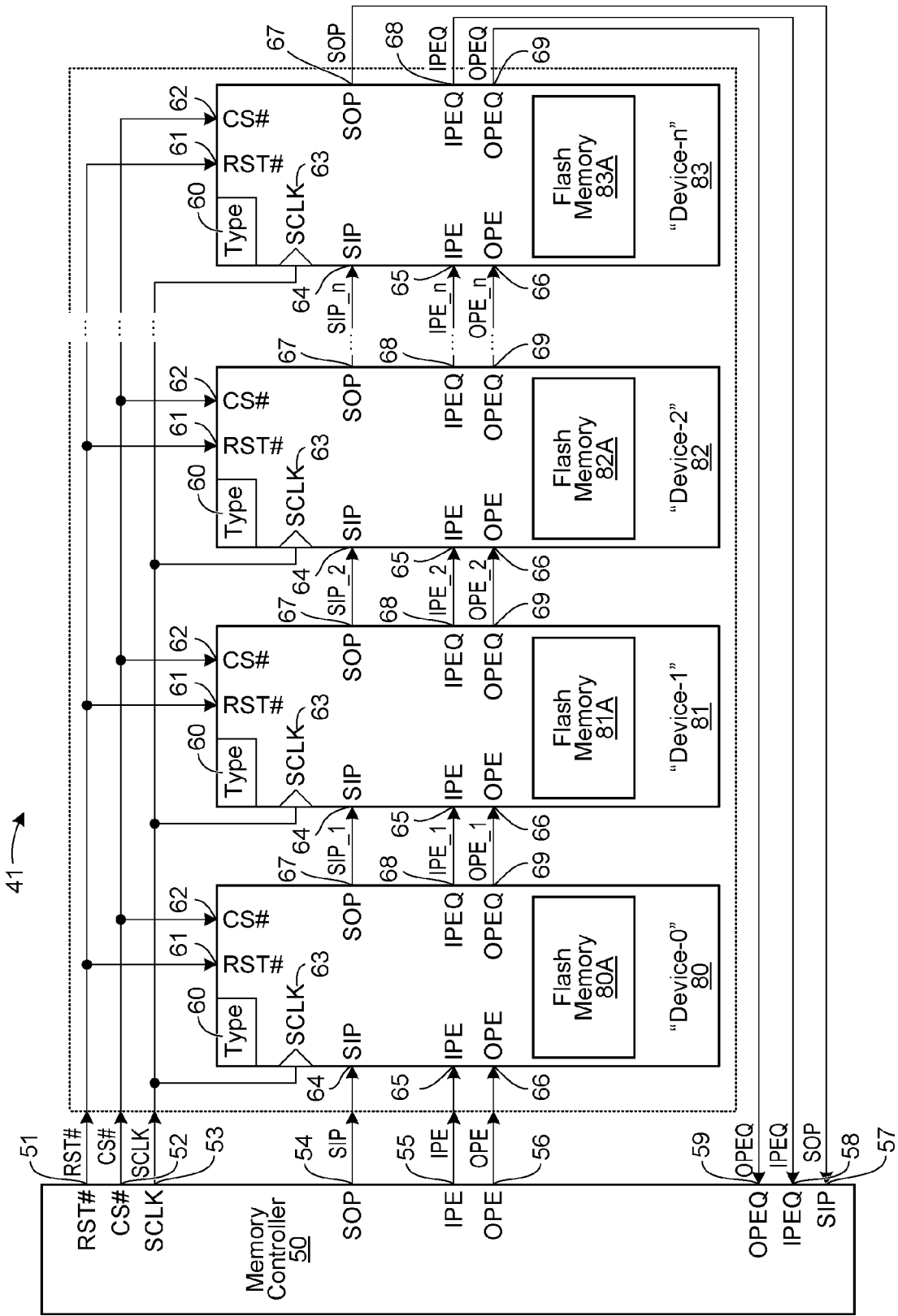
FIGS. 3A, 3B, 3C, 3D and 3E are schematics of specific example memory systems according to embodiments of the present invention.

FIG. 3A shows a general configuration of an example memory system. A memory system 41 includes a memory controller 50 and a plurality (n+1) of memory devices, n being an integer. In this particular example, the memory controller 50 and the memory devices are connected with serial links. The serial interconnection configuration includes first device 80 ("Device-0"), second device 81 ("Device-1"), third device 82 ("Device-2"), . . . , and (n+1)-th device 83 ("Device-n").

Referring to FIG. 3A, the memory controller 50 has a reset port 51, a chip select port 52, and a serial clock port 53 connected to each of the memory devices 80, 81, 82, . . . and 83. Accordingly, each of the memory devices 80, 81, 82, . . . , and 83 has a reset port 61, a chip select port 62, and a serial clock port 63. The memory controller 50 has an output interface including a serial output 54, an input enable 55, and output enable 56 connected to the first memory device 80. Accordingly, the first memory device 80 has an input interface including a serial input 64, an input enable 65, and an output enable 66. The first memory device 80 also has an output interface including a serial output 67, an input enable echo 68 and an output enable echo 69. Each of the other memory devices 81, 82 and 83 has corresponding input interfaces 64, 65, 66 and output interfaces 67, 68, 69 so that the memory devices 80, 81, 82, . . . , and 83 are interconnected through serial links. The memory controller 50 has an input interface including a serial input 57, an input enable echo 58 and an output enable echo 59 for connection with the output interfaces 67, 68 and 69 of the last memory device 83.

The memory controller 50 has components (not shown) similar to those of the memory controller shown in FIG. 2B, but they are not shown for sake of simplicity.

The memory devices 80, 81, 82, . . . , and 83 have memory-type specific components such as memories 80A, 81A, 82A, . . . , and 83A, respectively. In the illustrated example, however, their device types are not specified. Each of the memory devices 80, 81, 82, . . . and 83 has interface circuitry (not shown) between its interfaces and its memory. Each of the memory devices 80, 81, 82, . . . , and 83 also has a register 60 for maintaining an identification of its device type. In other implementations, each of the memory devices 80, 81, 82, . . . , and 83 has alternative circuitry for maintaining the identification of its device type. Each of the memory devices 80, 81, 82, . . . , and 83 may have other components, but they are not shown for sake of simplicity.

In operation, the memory system 41 operates in a similar manner as the memory system 40 described above with reference to FIG. 2B. However, for explanatory purposes, further example details of the operation of the memory system 41 are provided below with reference to additional Figures.

Figure 3B:
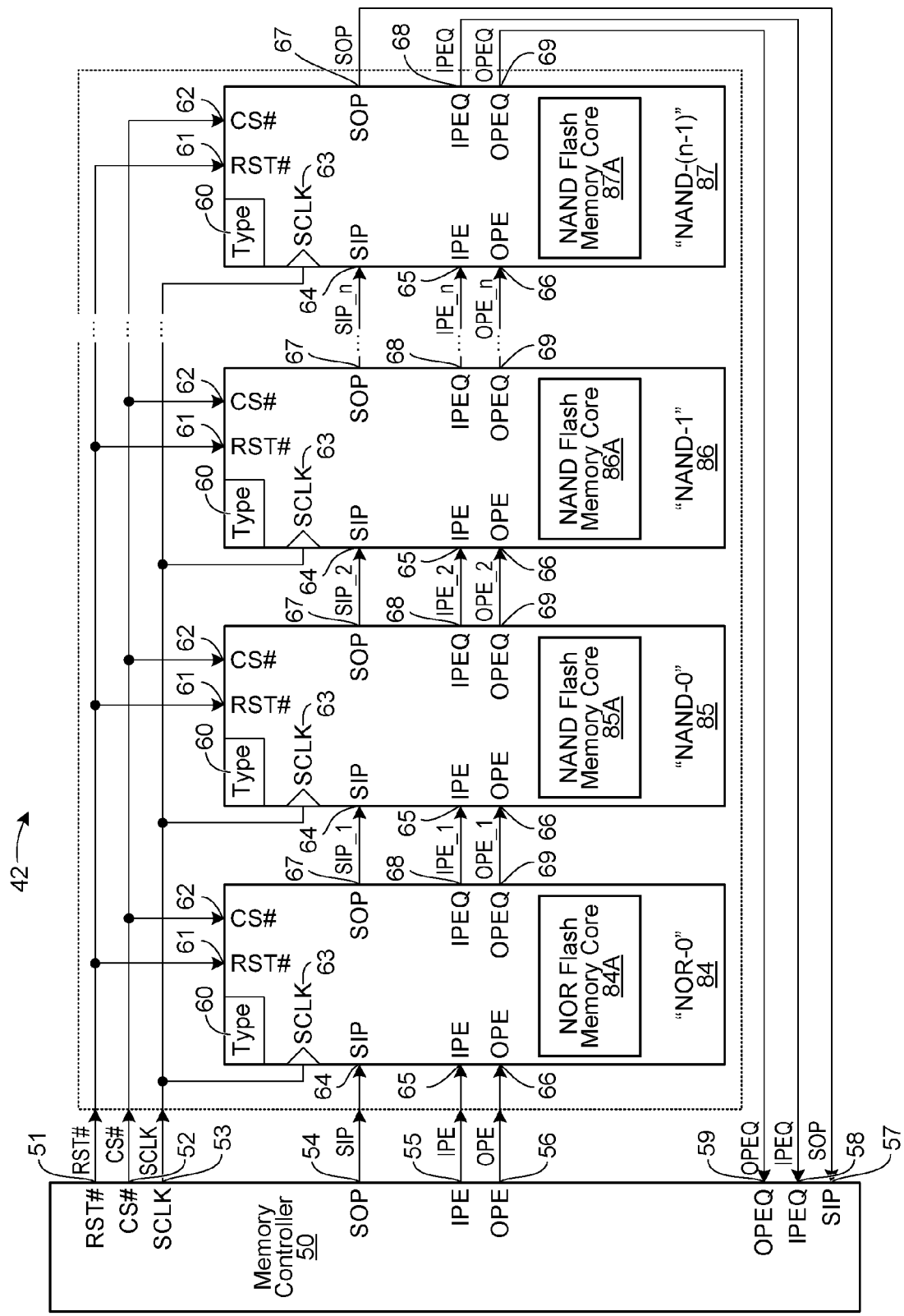

FIG. 3B shows a first specific example memory system 42. The memory system 42 is similar to the memory system 41 shown in FIG. 3B. The memory system 42 includes (n+1) memory devices 84, 85, 86, . . . , and 87 having the memory cores 84A, 85A, 86A, 87A that are the same as the FIG. 3B example. In the particular example shown in FIG. 3B, the first memory device 84 has a NOR flash memory core 84A and the second, third, . . . , and (n+1)-th memory devices 85, 86, . . . , and 87 have NAND flash memory cores 85A, 86A, . . . , and 87A, respectively. The FIG. 3C example differs from the FIG. 3B example in that the type-wise addressing scheme is employed, namely the first addressing scheme introduced previously. The types plus addresses are indicated as 'NOR-0', 'NAND-0', 'NAND-1', . . . , and 'NAND-(n−1)', assuming there is one NOR device and 'n' NAND devices.

As noted above, the memory devices 84, 85, 86, . . . , and 87 may be of any appropriate device type. To illustrate this point, additional example memory systems having varying or mixed device types are provided with reference to FIGS. 3D, 3E and 3E.

Figure 3C:
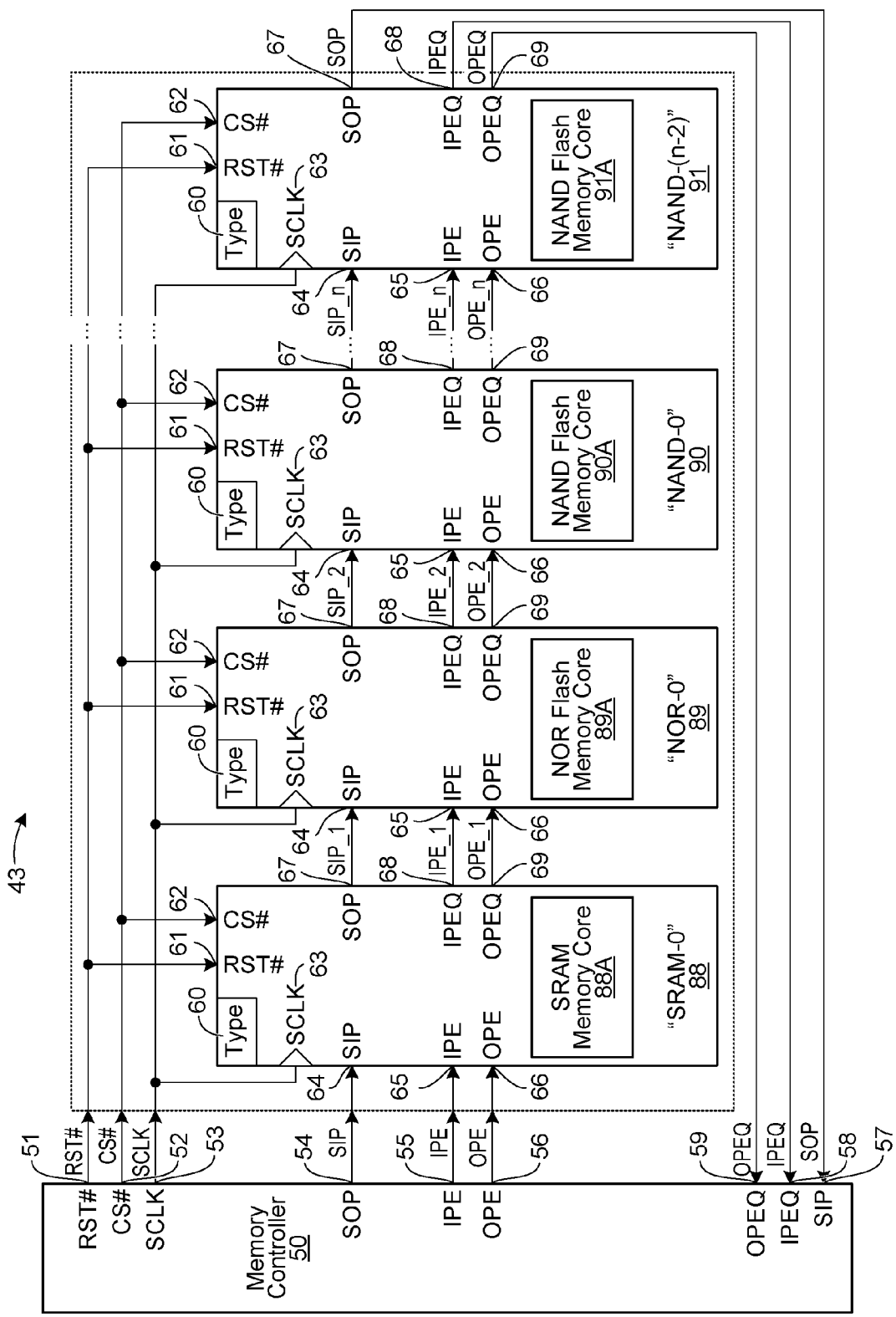

FIG. 3C shows a second specific example memory system 43. The memory system 43 is identical to the memory system 42 shown in FIG. 3C, except the memory system 43 has different memory devices. In the particular example shown in FIG. 3C, the memory system 43 includes a plurality (n+1) of memory devices 88, 89, 90, . . . , and 91 having mixed memory cores 88A, 89A, 90A, . . . , and 91A, respectively. The first memory device 88 has an SRAM memory core 88A and the second memory device 89 has a NOR flash memory core 89A. The third, . . . , and (n+1)-th memory device 91 have NAND flash memory cores 90A, . . . , and 91A, respectively. The memory devices are addressed using the type-wise addressing scheme. The types plus addresses are indicated as 'SRAM-0', 'NOR-0', 'NAND-0', . . . , and 'NAND-(n−2)', assuming there is one SRAM device, one NOR device and '(n−1)' NAND devices.

Figure 3D:
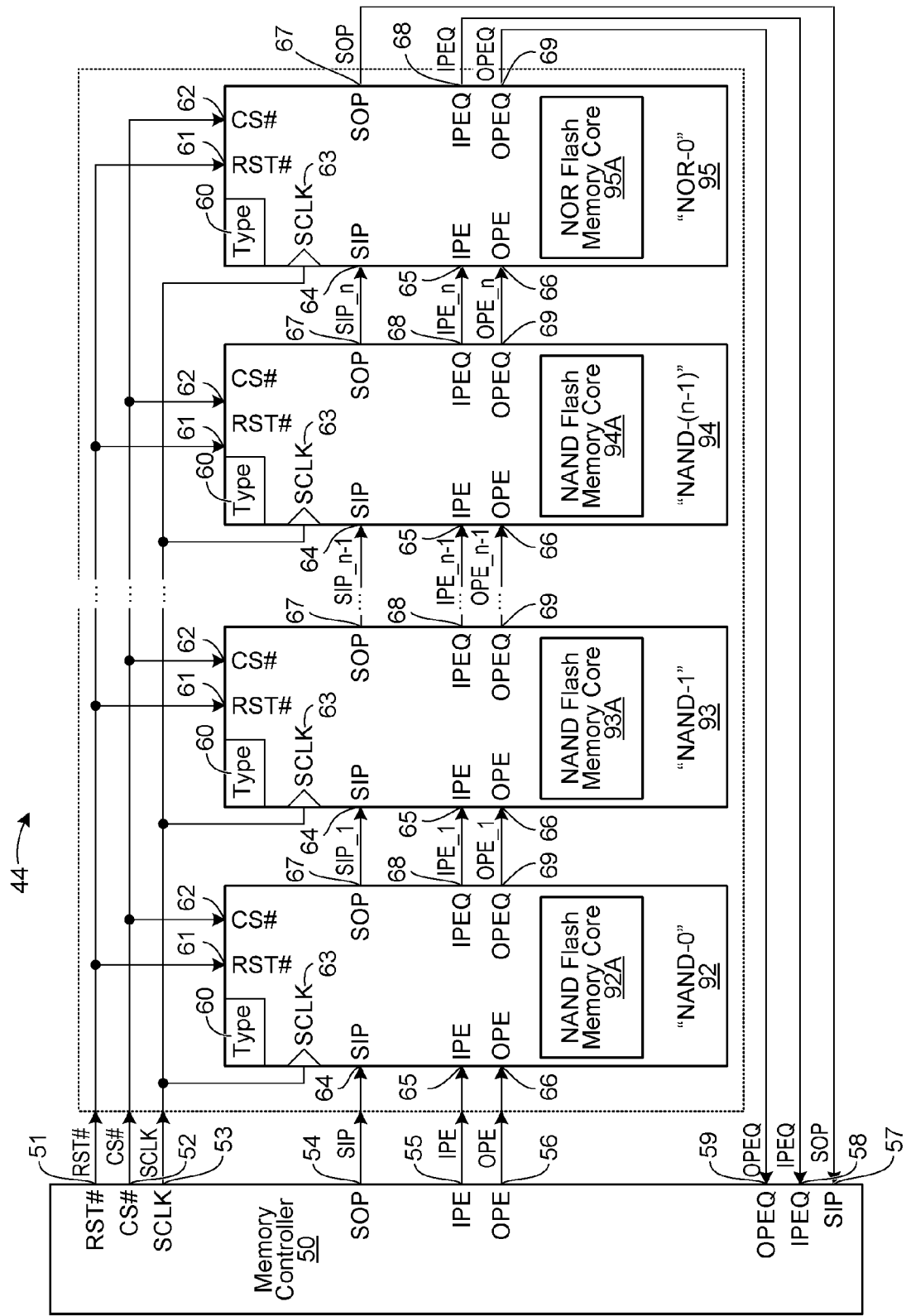

FIG. 3D shows a third specific example memory system 44 including a plurality (n+1) of memory devices. Referring to FIG. 3D, the memory system 44 is identical to the memory system 42 shown in FIG. 3C, except the memory system 44 has different memory devices 92, 93, . . . , 94 and 95. In the particular shown in FIG. 3E, the memory cores 92A, 93A, 94A, . . . , and 95A of the memory devices 92, 93, . . . , 94 and 95 are mixed. In the illustrated example, the first, second, third, . . . , and n-th memory devices 92, 93, . . . , and 94 have NAND flash memory cores 92A, 93A, . . . , and 94A, respectively. The last ((n+1)-th) memory device 95 has a NOR flash memory core 95A. The memory devices are addressed using the type-wise addressing scheme. The types plus addresses are indicated as 'NAND-0', 'NAND-1', 'NAND-(n−1)', and 'NOR-0', assuming there is 'n' NAND devices and one NOR device. Note the memory controller 50 would not be aware of the difference in physical layout between the examples of FIGS. 3B and 3D.

Figure 3E:
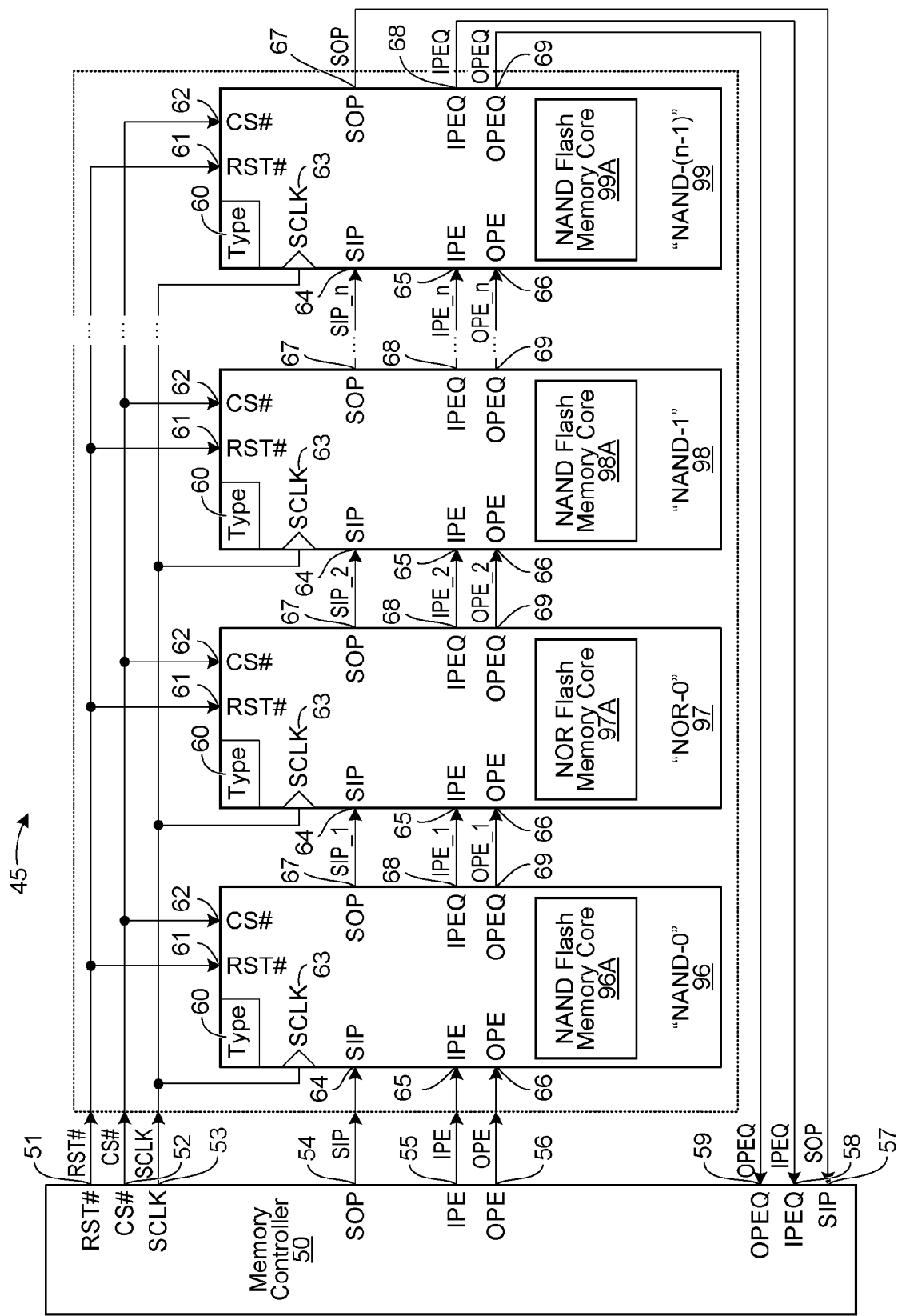

FIG. 3E shows a fourth specific example memory system 45. The memory system 45 is identical to the memory system 42 shown in FIG. 3C, except the memory system 45 has different memory devices 96, 97, 98, . . . , and 99. In the particular example shown in FIG. 3E, the memory cores 96A, 97A, 98A, . . . , and 99A of the memory devices 96, 97, 98, . . . , and 99 are mixed. In the illustrated example, the first memory device 96 has a NAND flash memory core 96A. The second memory device 97 has a NOR flash memory core 97A. The third, . . . , and the last ((n+1)-th) memory devices 98, . . . , and 99 have NAND flash memory cores 98A, . . . , and 99A, respectively. The memory devices are addressed using the type-wise addressing scheme. The types plus addresses are indicated as 'NAND-0', 'NOR-0', 'NAND-1', . . . and 'NAND-(n−1)', assuming there is 'n' NAND devices and one NOR device. Note that the memory controller 50 would not be aware of the difference in physical layout between the examples of FIGS. 3B-3E.

It can be seen that the four examples of FIGS. 3B-3E can be implemented with an identical circuit layout, identical memory controller 50, and 'lots' or 'sockets' for the memory devices, assuming that the memory controller 50 is capable of interacting with at least NOR flash devices, NAND flash devices and SRAM devices. Then, an arbitrary arrangement of the supported device types can be installed in the 'lots' or 'sockets', FIGS. 3B, 3C, 3D and 3E being respective examples of this.

Figure 3F:
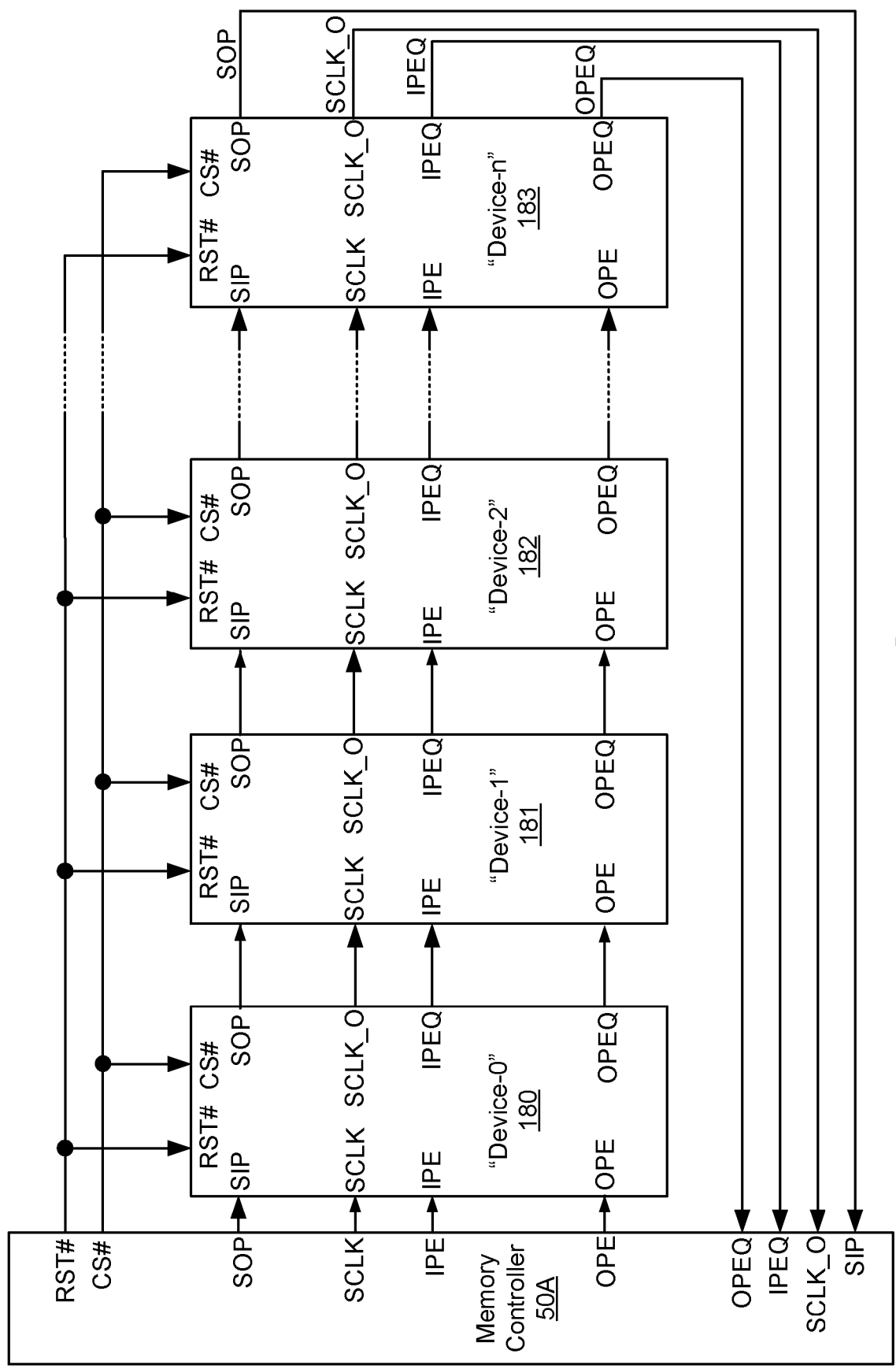
FIG. 3F is a schematic of another example memory system according to an embodiment of the present invention.

In each of the examples illustrated in FIGS. 3A-3E, reset, chip select and serial clock signals are provided in a multi-drop manner. In another implementation as shown in FIG. 3F, the serial clock is connected in point-to-point ring type scheme with the addition of output echo clock signal, 'SCLK_O'. The SCLK is a system clock to synchronize a memory controller 50A and memory devices 180, 181, 182, . . . , and 183. The echo clock signal output from each memory device is fed to the clock input SCLK of the next memory device. The memory controller 50A and the memory devices 180, 181, 182, . . . , and 183 operate as a master device and slave devices, respectively. The assigned addresses are indicated as 'Device-0', 'Device-1', 'Device-2', . . . , and 'Device-n', assuming there are (n+1) memory devices.

In the examples presented, clocking is based on SDR (Single Data Rate); however, it is to be understood that other appropriate clocking schemes may be contemplated. Other appropriate clocking schemes may, for example, include DDR (Double Data Rate), QDR (Quad Data Rate), rising edge SDR or falling edge SDR. There may be other appropriate clocking schemes that may be contemplated.

Figure 3G:
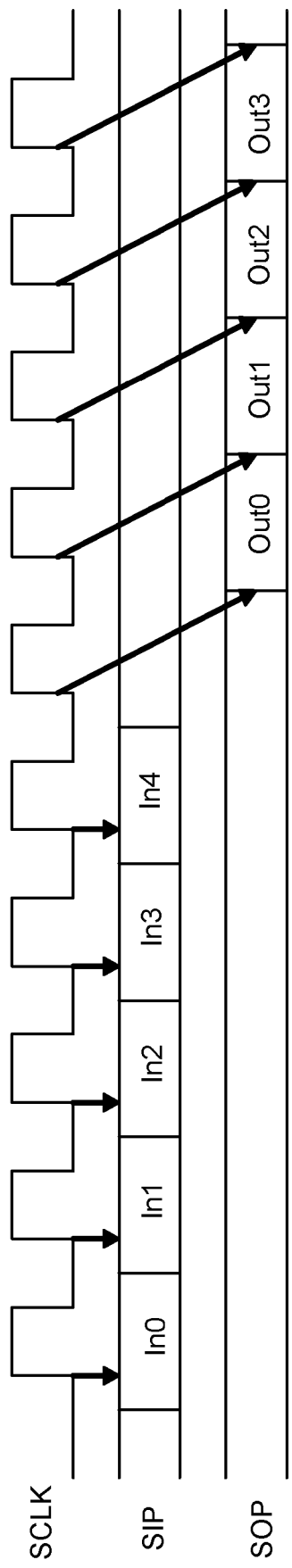
FIG. 3G is a timing diagram of example single data rate operation of memory devices.

FIG. 3G shows a relative timing sequence for an example SDR operation of memory devices. FIG. 3G shows operation in one port. Referring to FIGS. 3A and 3G, the operation is that information transferred to the devices 80, 81, 82, . . . , and 83 can be captured at different times of the clock signal SCLK fed to the serial clock ports 63 the devices. In an example of the SDR implementation, information fed to one of the devices at its serial input 64 can be captured at the rising edge of the clock signal SCLK. In the SDR operation, the chip select signal is commonly connected to enable all devices at the same time, so that input data of the first device is transferable through the serial interconnection configuration. Alternatively, in the SDR operation, information fed to the device at the SIP connection may be captured at the falling edge of the clock signal SCLK.

Figure 3H:
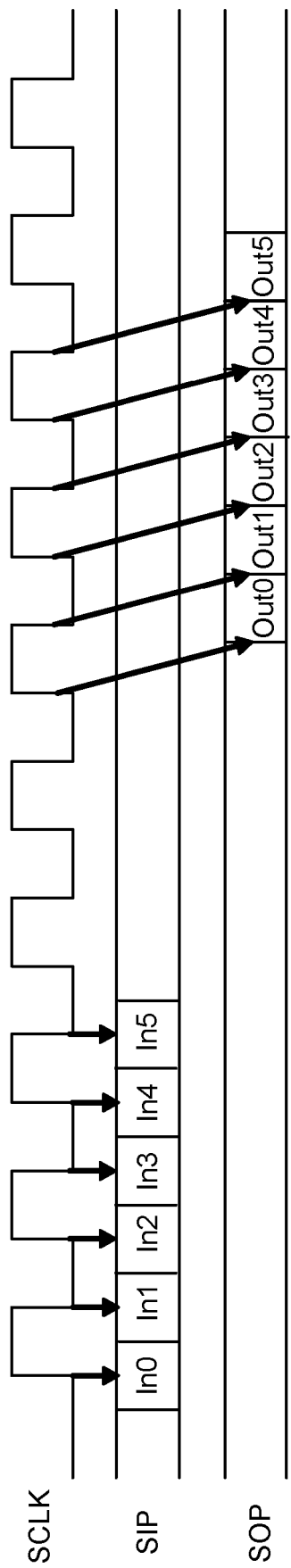
FIG. 3H is a timing diagram of example double data rate operation of memory devices.

FIG. 3H shows a relative timing sequence for an example DDR operation of memory devices. FIG. 3H shows operation in one port. In the DDR operation, both of the rising and falling edges of the clock signal SCLK can be used to capture information fed to the serial input 64.

Figure 4A:
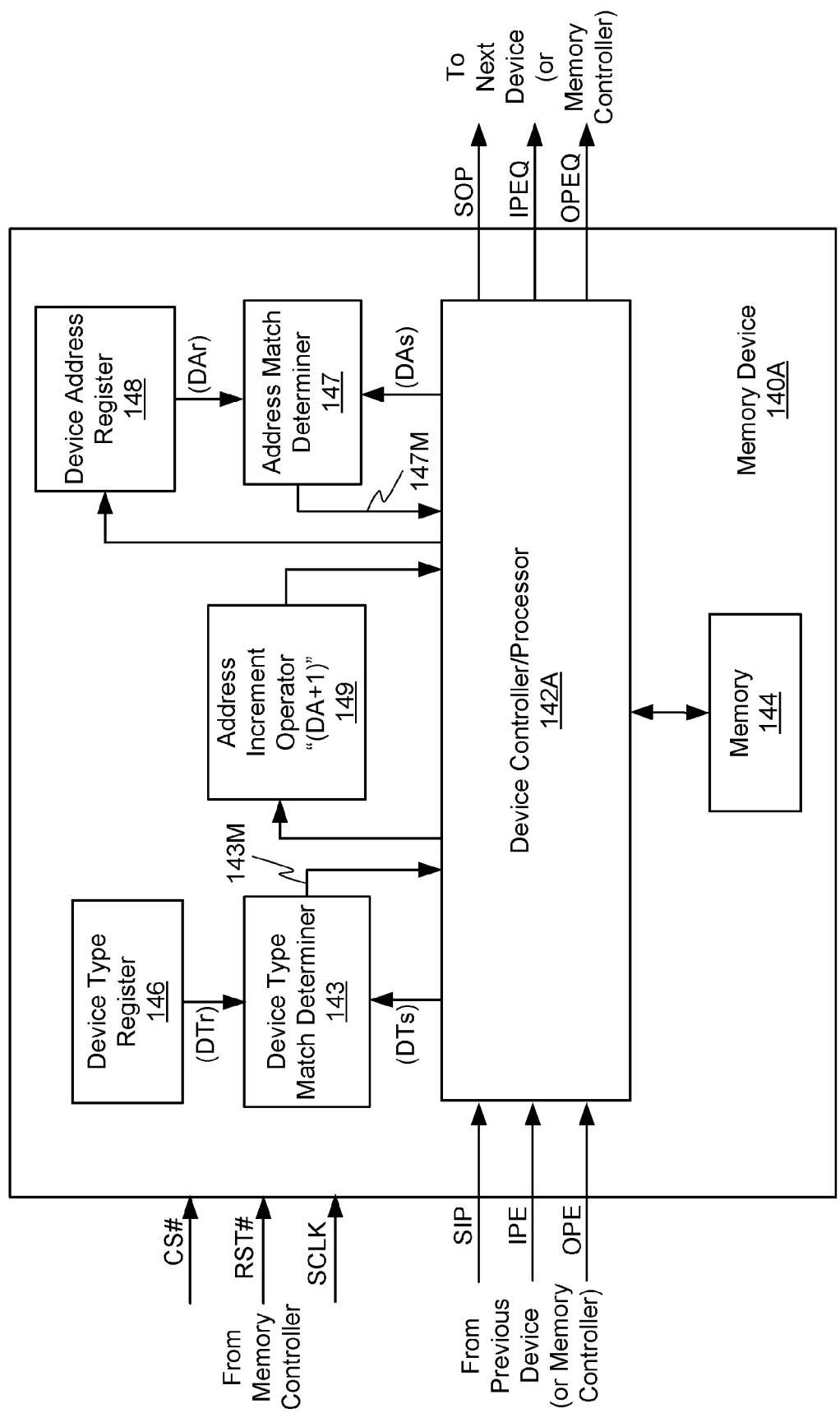
FIG. 4A is a schematic of an example memory device used as the memory devices shown in FIGS. 3A, 3B, 3C, 3D and 3E.
Figure 5A:
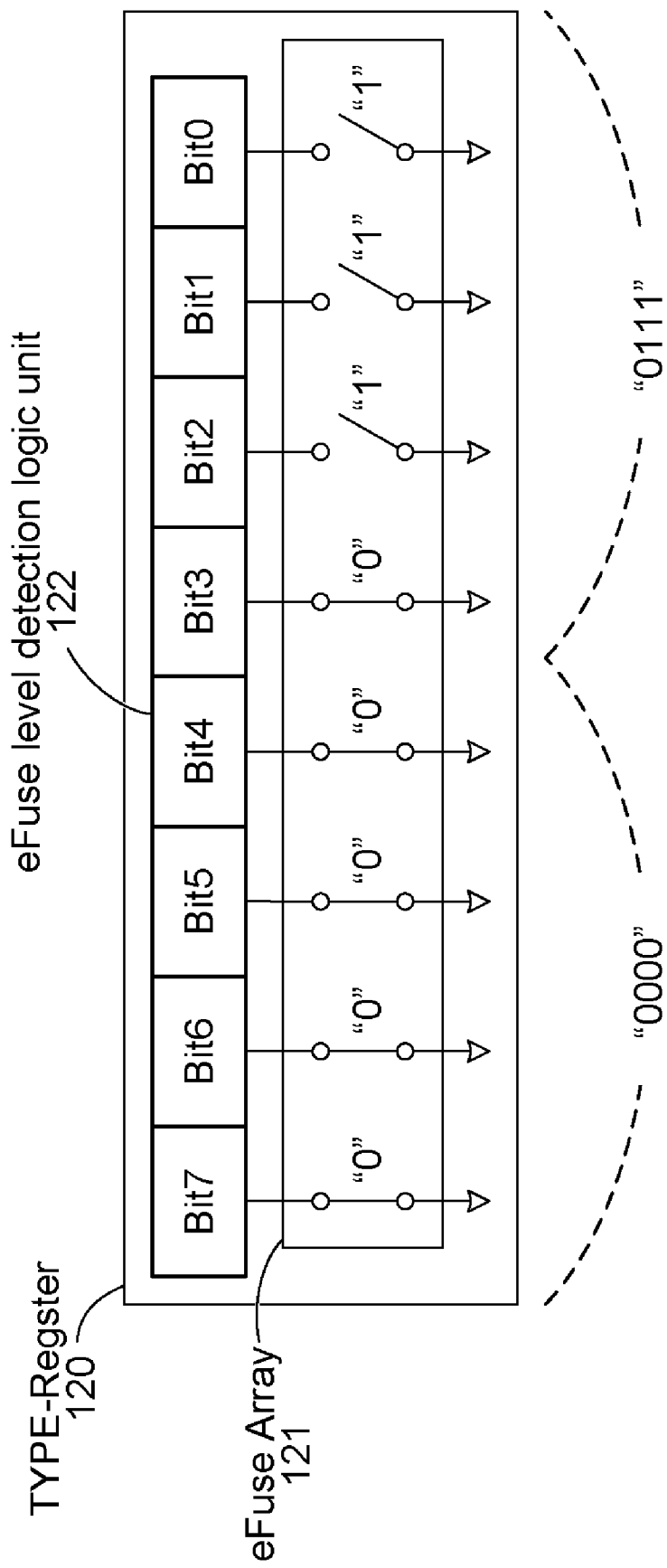
FIG. 5A is a schematic of an example register block used to identify a memory type of a memory device.

FIG. 4A shows an example memory device block used as memory devices shown in FIGS. 3A-3E. Referring to FIG. 4A, a memory device 140A represents any one of the memory devices and includes a device controller/processor 142A, a device type match determiner 143, a memory 144, a device type register 146, an address match determiner 147, a device address register 148 and an address increment operator 149. The device controller/processor 142A controls the operations of the memory device 140A. The memory 144 includes any type of memories, such as, for example, NAND flash memory, NOR flash memory, SRAM, DRAM. The device type register 146 includes the register 60 for maintaining an identification of its device type as shown in FIGS. 3A-3E. The device address register 148 holds an assigned device address (DA) by the device controller/processor 142A of that memory device 140A. Details of the device type register 146 are shown in FIG. 5A. The device type match determiner 143 and the address match determiner 147 perform relevant match determination functions under control by the device controller/processor 142A. The address increment operator 149 performs a function of a device address increment (i.e., "DA+1").

The device 140A has a reset port "RST#", a chip select port "CS#" and a serial clock port "SCLK" connected to the memory controller (e.g., the memory controller 50 as shown in FIG. 3A). The device controller/processor 142A is connected to a serial input "SIP", an input enable "IPE" and an output enable "OPE" of that memory device connected to the previous memory device or the memory controller. Also, the device controller/processor 142A is connected to a serial output "SOP", an input enable echo "IPEQ" and an output enable echo "OPEQ" of that memory device connected to the next memory device. The memory 144 corresponds to the flash memory core. The device type register 146 corresponds to the type register 60 for maintaining an identification of its device type.

An example format of a memory command issued by the memory controller is:

| Memory Command (1) | | | |
|---|---|---|---|
| TYPE (aah) | TDA (bbh) | CMD (cch) | DATA (ddh) |

TYPE is a device type for identification of a specific memory device type. TDA is a target device address for identification of an address of a specific memory device. CMD is an operation command to be executed by the target memory device. DATA contains information (a number or value) on process or control for the memory device. Examples of various operation commands CMD are shown in Table 1.

TABLE 1

| Operation | Command (1 Byte) |
|---|---|
| Page Read | 00h |
| Random Data Read | 05h |
| Page Program | 10h |
| Chip Erase | 20h |
| Sector Erase | 21h |
| Page Read for Copy | 35h |
| Write Device Address | 39h |
| Block Erase | 60h |
| Read Status | 70h |
| Serial Data Input (Write to Buffer) | 80h |
| Random Data Input | 85h |
| Target Address Input for Copy | 8Fh |
| Read Device Type | 90h |
| Write Configuration Register | A0h |
| Program/Erase Suspend | C0h |
| Program/Erase Resume | D0h |
| Reset | FFh |

Again, referring to FIG. 4A, the device controller/processor 142A determines whether the memory command is addressed to that memory device 140A in response to the device type and the device address contained in the serial input (SI). For example, the device type match determiner 143, under control by the device controller/processor 142A, determines whether the device type ('DTs') in the SI, matches the device type ('DTr') held in the device type register 146. In a case of a match between them, the device type match determiner 143 provides a type match indication 143M to the device controller/processor 142A. Then, the address match determiner 147, under control by the device controller/processor 142A, determines whether the device address ('DAs') contained in the SI matches the device address ('DAr') held in the device address register 148. In a case of a match between them, the address match determiner 147 provides an address match indication 147M to the device controller/processor 142A.

In the operation of the initialization phase 35 as shown in FIG. 2C, in response to the type match indication 143M and the address match indication 147M, the device controller/processor 142A provides the device address (DA) contained in the SI to the address increment operation 149 that perform a calculation of "+1". Thus, a calculated or incremented address (DA+1) is outputted to the device controller/processor 142A. The incremented device address is fed to the next device through the SOP. In a case where neither the type match indication 143M nor the address match indication 147M is provided, the device controller/processor 142A forwards the command over the SOP to the next device.

In the normal operation of the data access phase 36 as shown in FIG. 2C, in response to the type match indication 143M and the address match indication 147M, the device controller/processor 142A executes the received command contained in the SI. In a case where neither the type match indication 143M nor the address match indication 147M is provided, the device controller/processor 142A forwards the command over the SOP to the next device.

Figure 4B:
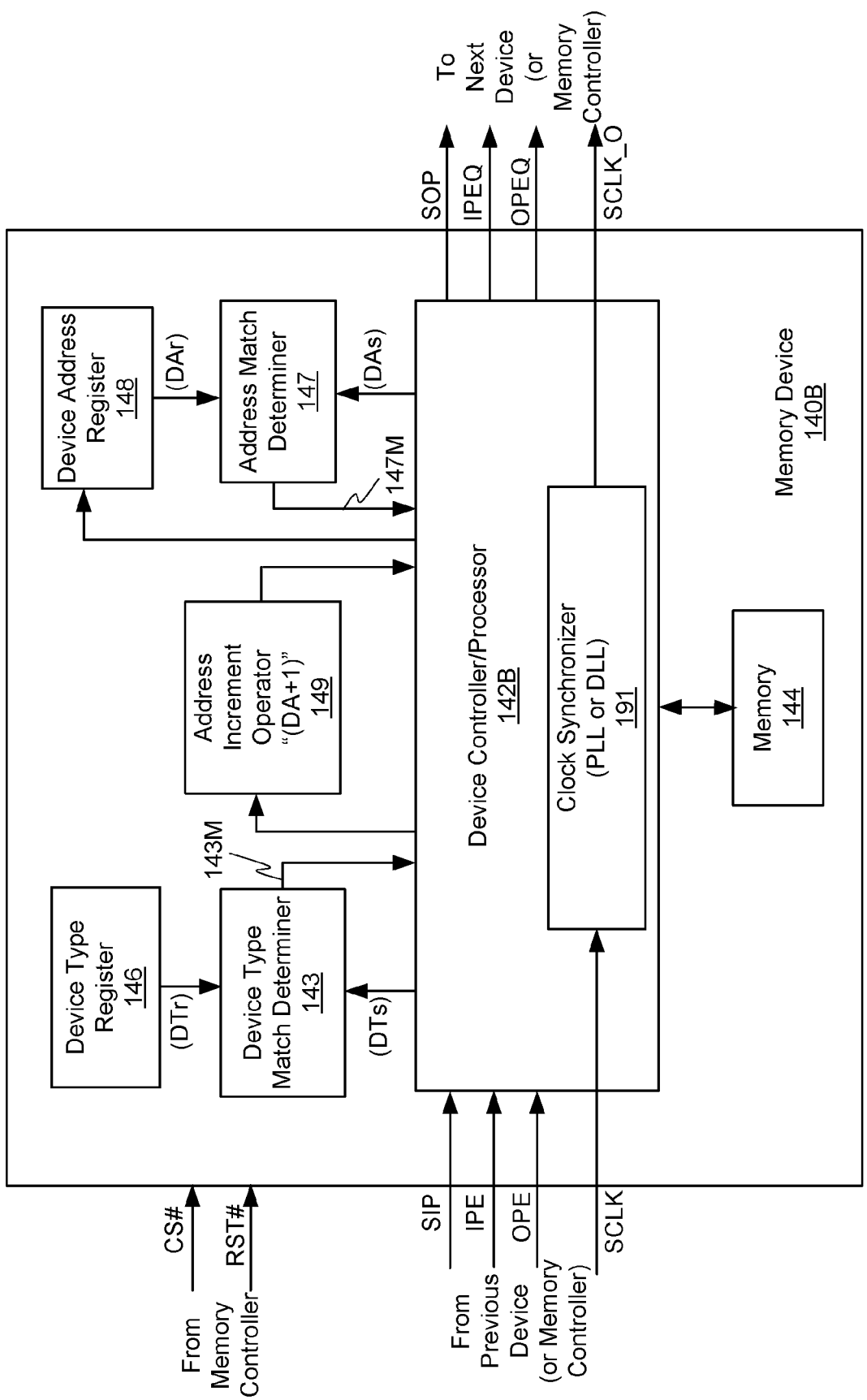
FIG. 4B is a schematic of an example memory device used as the memory devices shown in FIG. 3F.

FIG. 4B shows an example memory device used as the memory devices shown in FIG. 3F. A memory device 140B shown in FIG. 4B represents any one of the memory devices shown in FIG. 3F. The memory device 140B is similar to the memory device 140A shown in FIG. 4A. A device controller/processor 142B of the memory device 140B includes a clock synchronizer 191 for outputting an output clock synchronized with an input clock that is fed thereto. The clock synchronizer 191 may include a phase-locked loop (PLL) or a delay-locked loop (DLL) that provides the output echo clock signal SCLK_O of the clock signal SCLK input from the previous memory device. Other operations of the device 140B are the same as those of the device 140A shown in FIG. 4A.

In the examples presented above with reference to FIGS. 3A-3F, each of the memory devices has a register (e.g., the device type register 146). Flash memories (e.g., NAND flash, NOR flash memories) contain factory programmed registers inside the device utilizing spare sections of flash cell core arrays in order to identify useful information, for example, a manufacturer code, a memory density, a page size, a block size, a number of banks, an I/O configuration, or any critical AC/DC characteristics. However, as noted above, in some implementations, the register is used for maintaining an identification of device type. There are many ways for a register to indicate a device type. An example is provided below with reference to FIG. 5A.

Referring to FIG. 5A, an example register block 120 has a type-register, which is a kind of physical hard programmable register unit. The register block 120 has an eFuse (electrically programmable fuse) array 121 and an eFuse level detection logic unit 122. In the illustrated example, the eFuse array 121 is shown with an eight-bit configuration of bits 7, 6, 5, ..., 1 and 0. In this particular example, first four bits 7-4 are '0000' and second four bits 3-0 are '0111'. This represents '07h' (=00000111), for example. In a specific implementation, this configuration indicates a PCRAM memory type. Different configurations may indicate different device types. In the illustrated example, 'closed' and 'open' fuses indicate '0' and '1', respectively. Such '0' and '1' logics are detected by the eFuse level detection logic unit 122 and detected bit status (bits 7-0) are provided to the device controller/processor 142A shown in FIG. 4A. Alternatively, the register block 120 may have conventional poly or metal Fuse, OTP (One Time Programmable memory), or any non-volatile programmable components.

FIG. 5B shows a table of an example encoding scheme for each device type. In the table, 'RFU' means 'Reserved for Future Usage'. Referring to FIG. 5B, the table defines the encoding scheme for each of 10 memory types: NAND Flash, NOR Flash, DRAM, SRAM, PSRAM, DiNOR Flash, FeRAM, PCRAM, Serial EEPROM, and MRAM. For example, the SRAM memory type has an encoding scheme of '03h'. The NAND flash type is assigned as '00h', while NOR flash type is assigned as '01h'. In this example, the bit structure is the MSB (most significant bit) to the LSB (least significant bit). In other implementations, it can be reversed in order, which starts from the LSB first instead of MSB. Some register configurations are reserved for future use (RFU).

There are many ways to implement the initialization phase 35 shown in FIG. 2C. As noted above, each memory device has a memory type. A process for assigning the device addresses with type-dependent addressing is described below with reference to FIG. 6A.

Figure 6A:
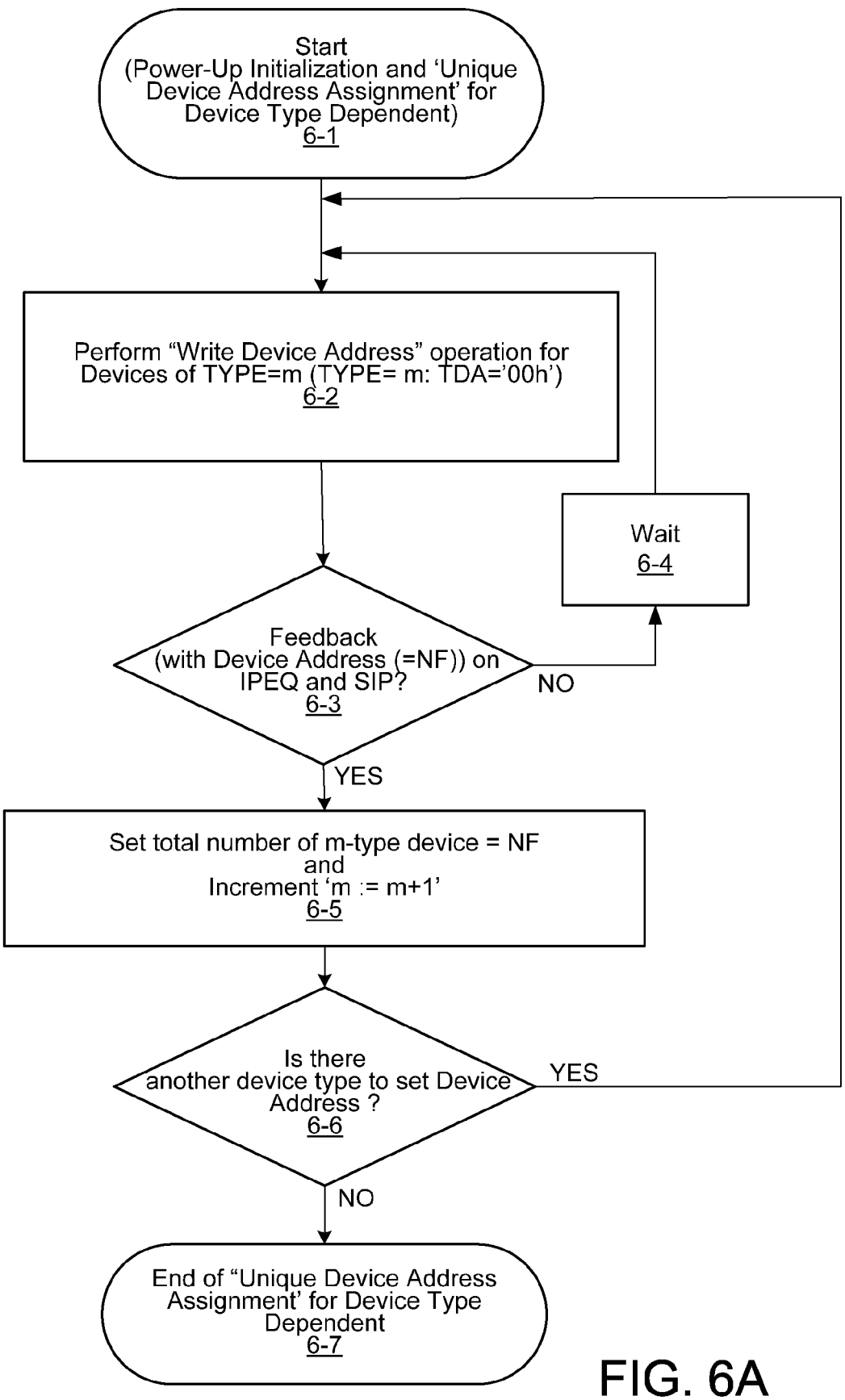
FIG. 6A is a flowchart of a method of assigning device addresses with type-dependent addressing.

FIG. 6A shows a method of assigning device addresses with type-dependent addressing. It is to be understood that this process is very specific for example purposes only. The method is applicable to any memory system wherein a plurality of memory devices is serially interconnected (e.g., the memory system shown in FIG. 3B).

Referring to FIGS. 3B and 6A, when there is a power-up initialization (step 6-1), then the memory controller 50 performs a write device address operation for memory devices of device type 'm' (step 6-2). The write device address operation has a target device address (TDA) of '00h' because all memory devices have a device address initially set to '00h' during power-up. When the write device address operation traverses each memory device, its target device address remains '00h' so that each memory device processes the write device address operation. The write device address operation traverses each of the memory devices. Each memory device of the device type 'm' is assigned its device address based on the device address indicated by the write device address operation. Each memory device that is assigned its device address increments the device address indicated by the write device address operation before forwarding it along to the next memory device.

Eventually, the write device address operation makes its way back to the memory controller 50. If the write device address operation arrives back at the memory controller 50 as indicated by signals input enable echo (IPEQ) and serial input (SIP) (YES at step 6-3) with a wait (step 6-4), the memory controller 50 will determine the number of memory devices of the device type 'm' to be equal to the device address ("NA") indicated by the write device address operation and the memory controller 50 increments 'm' (step 6-5). Thereafter, the memory controller 50 determines based on the value of 'm' if there are additional device types (step 6-6). If there is an additional device type (YES at step 6-6), the operation will go back to step 6-2. For each additional device type, the memory controller 50 repeats steps 6-2 through 6-5. The memory controller 50 attempts to assign device addresses to memory devices of every possible device type corresponding to every possible value for 'm'. This is performed because the memory controller 50 may not know in advanced as to what device types are present in the memory system. When there are no more additional device types (NO at step 6-6), then the process ends (step 6-7).

Figure 6B:
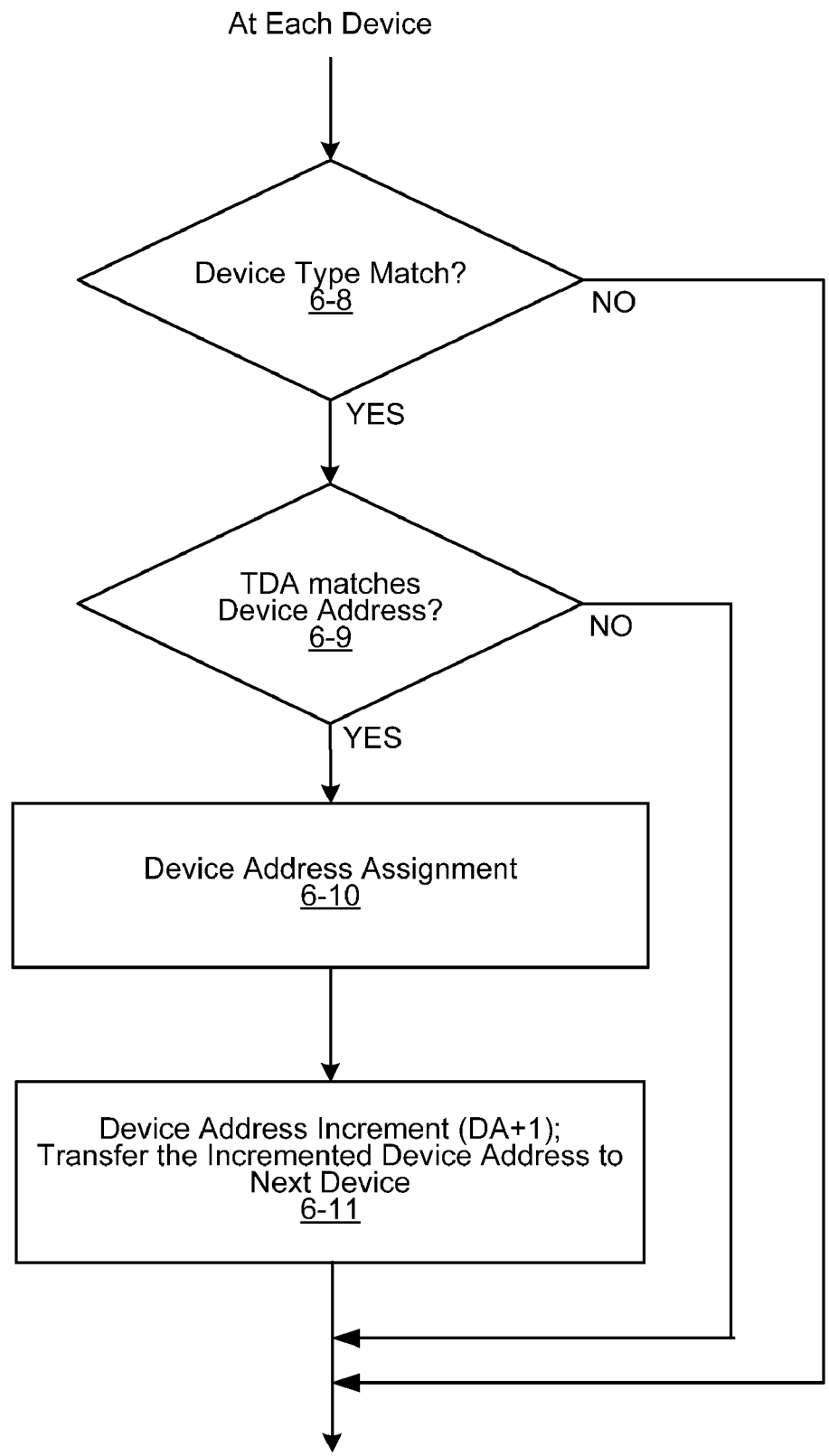
FIG. 6B is a flowchart of details of a device address assignment step of the method shown in FIG. 6A.
Figure 7A:
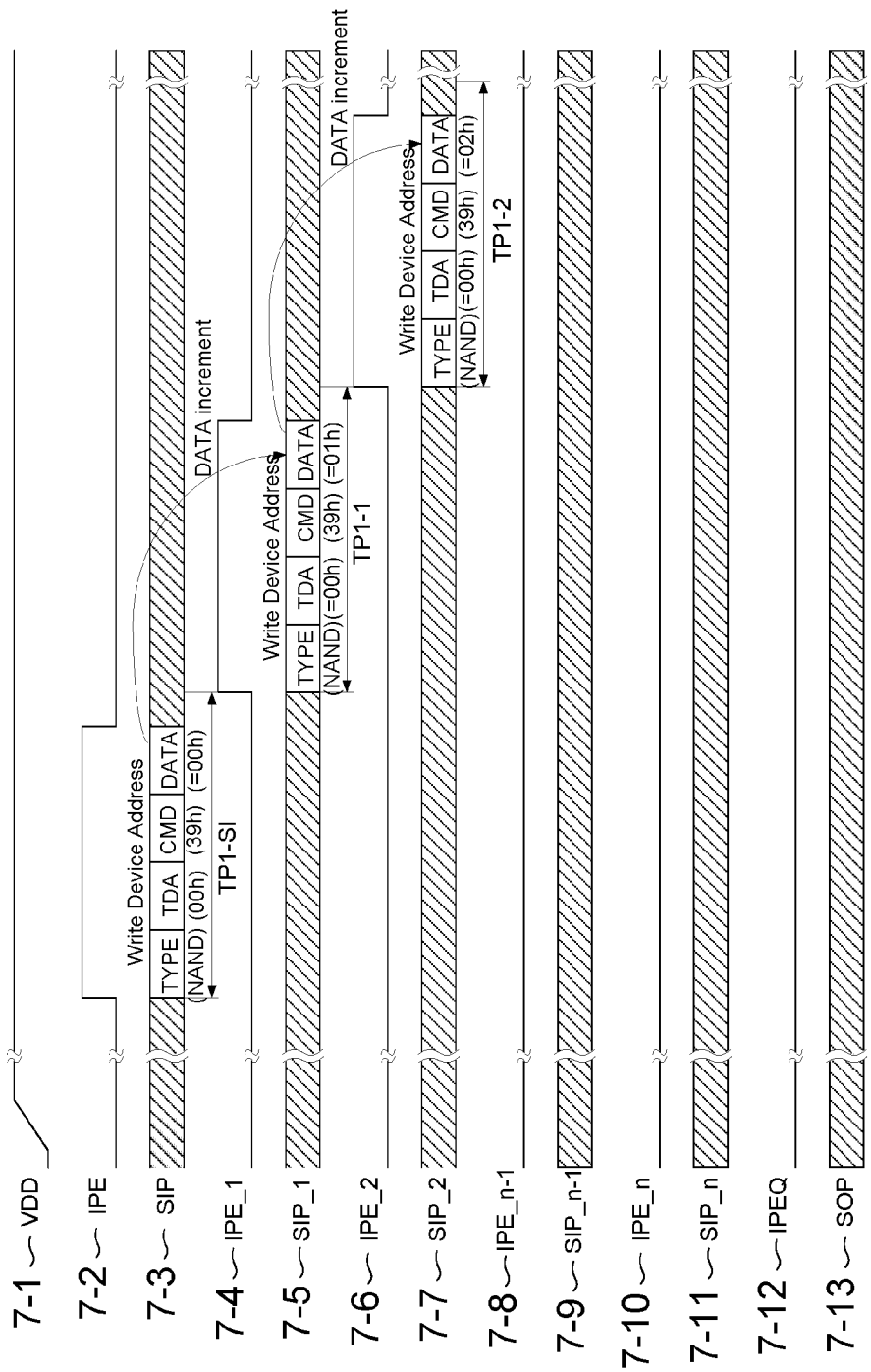
FIGS. 7A, 7B, 7C and 7D are timing diagrams of assigning device addresses with type-dependent addressing.
Figure 7B:
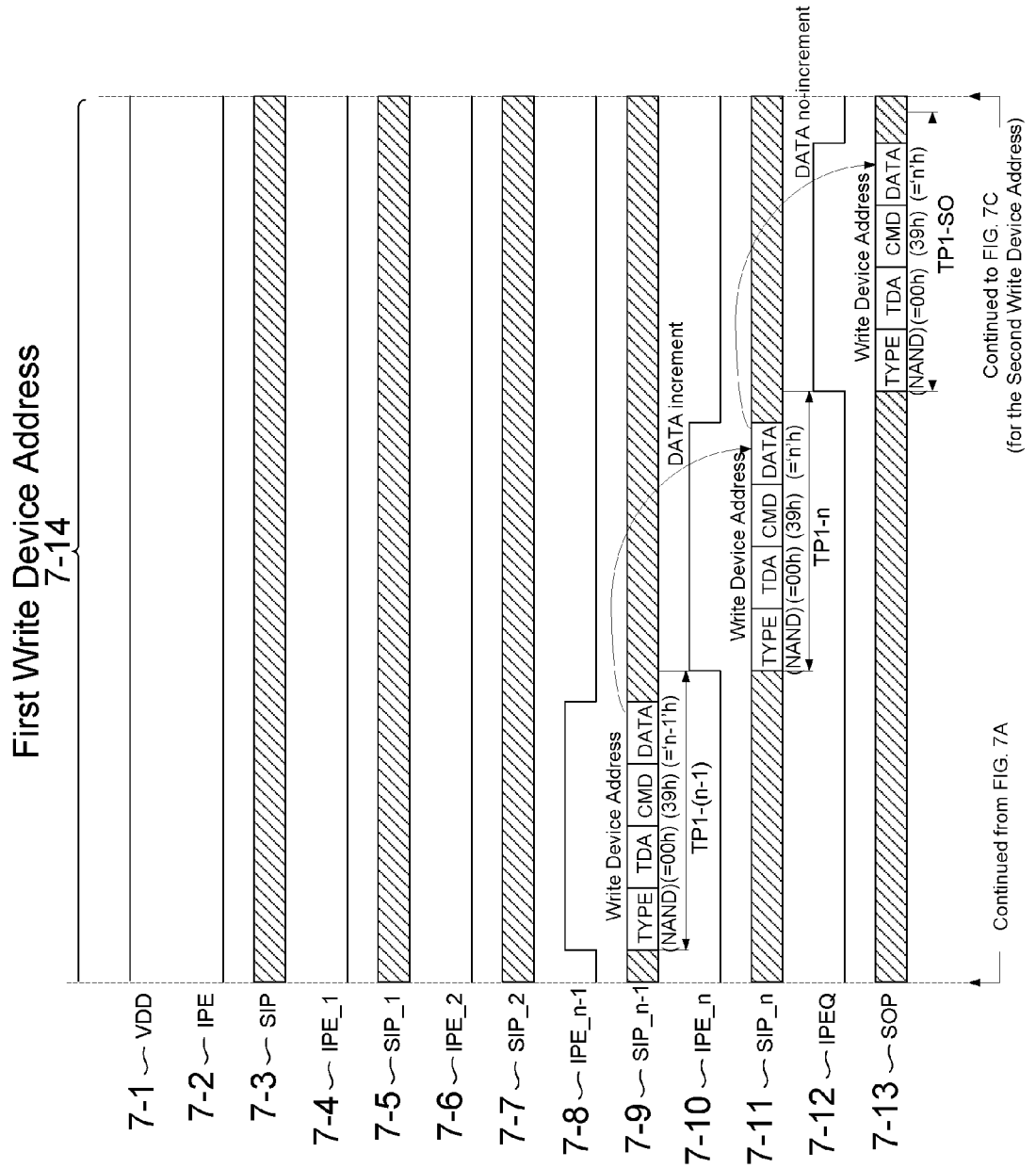
Figure 7C:
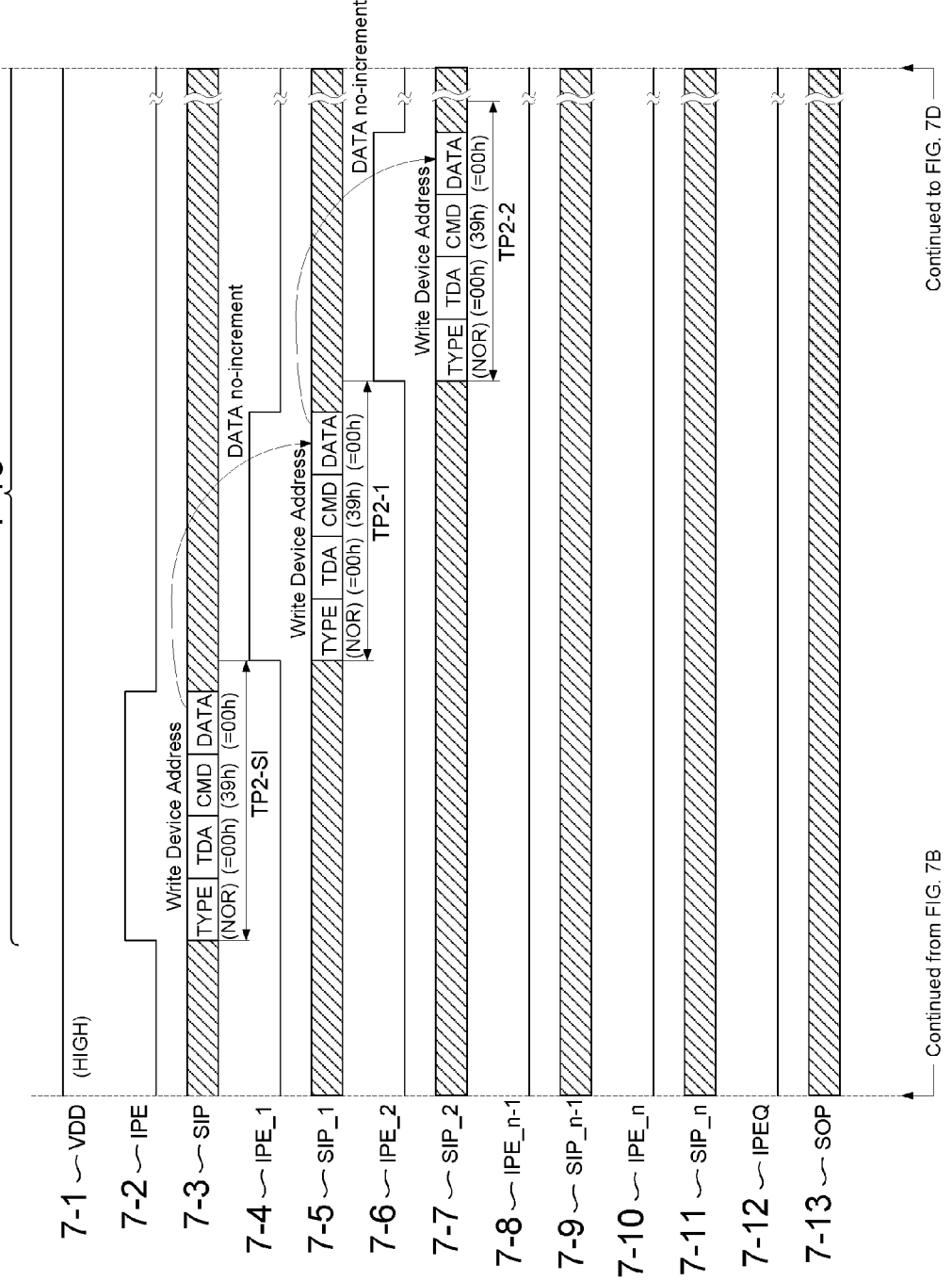
Figure 7D:
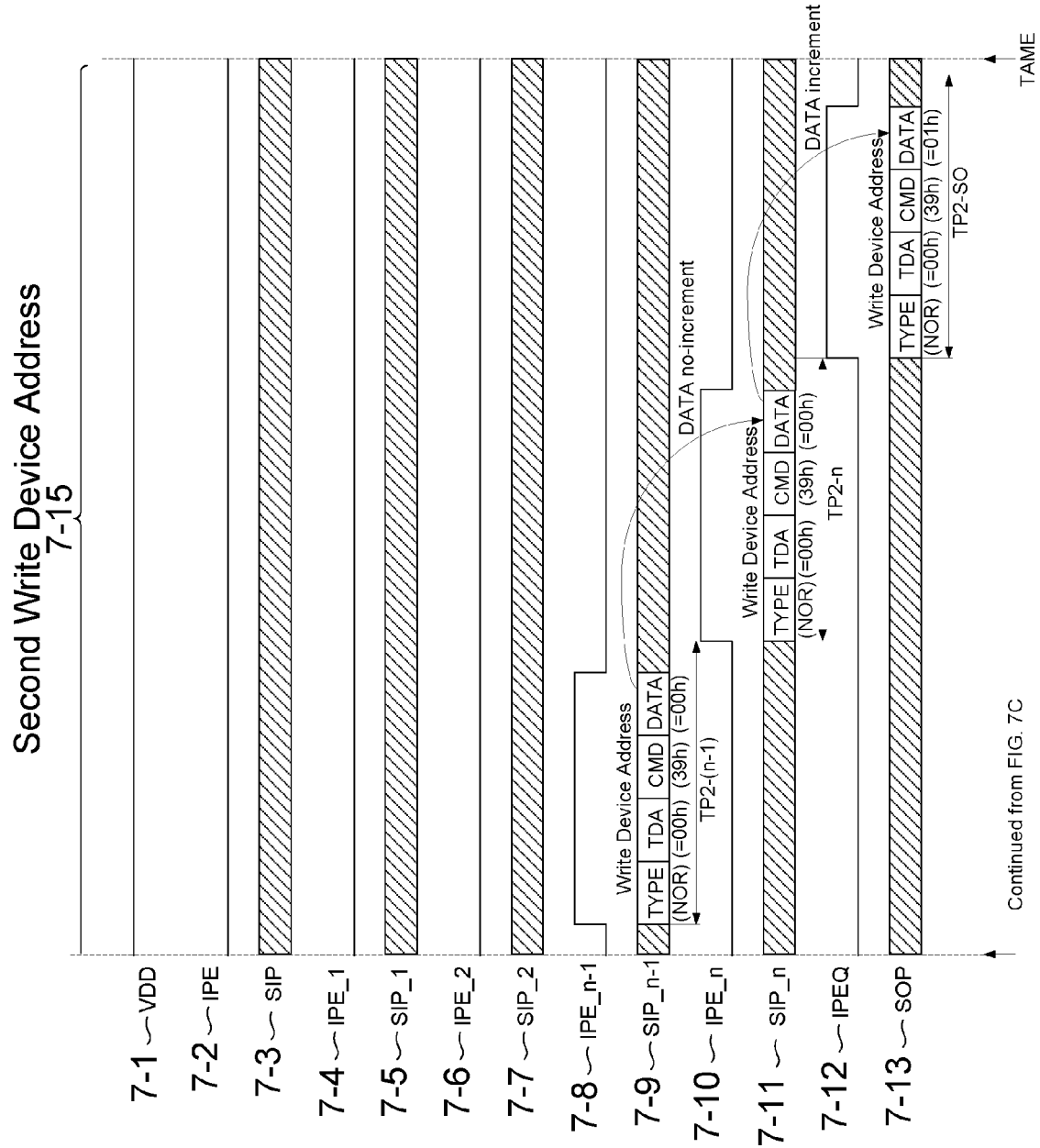

Details of above-mentioned step 6-2 are shown in FIG. 6B. Referring to FIGS. 3B, 4A, 6A and 6B, the device received the write device address operation determines whether the received device type 'm' matches the device type thereof registered in the device type register 146 (step 6-8). This is performed by the device controller/processor 142A and the device type match determiner 143. If there is a device type match (YES at step 6-8), the device will further determine whether the target device address (TDA) matches the device address registered in the device address register 148 (step 6-9). This is performed by the device controller/processor 142A and the address match determiner 147. If there is a device address match (YES at step 6-9), the received device address will be registered in the device address register 148 (step 6-10) and the received device address will be incremented (DA+1) (step 6-11). Such a device address increment is performed by the device controller/processor 142A and the address increment operator 149. If there is no device type match (NO at step 6-8), neither device address assignment nor device address increment will be performed. Also, there is no device address match (NO at step 6-9), neither device address assignment nor address increment will be performed.

To provide further explanation of the process described above with reference to FIGS. 6A and 6B, a timing diagram is described below with reference to FIGS. 7A, 7B, 7C and 7D.

FIGS. 7A, 7B, 7C and 7D show timing sequences for the signals for assigning device addresses with type-dependent addressing. The timing diagram shows example signals that may result from a memory system having one NOR-type flash device and 'n' NAND-type flash devices interconnected. This sort of memory system is similar to the memory system 42 of FIG. 3D.

As described above, memory commands issued by the memory controller are formatted. For example, in the memory system only NAND flash devices are assigned with device addresses from "0", the memory command issued by the memory controller is:

| Memory Command (2) | | | |
| --- | --- | --- | --- |
| TYPE (00h) | TDA (00h) | CMD (39h) | DATA (00h) |

In the memory command:
TYPE (00h) identifies "NAND flash" devices (see FIG. 5B).
TDA (00h) identifies devices holding device address "0" when the initialization operations are performed. It is presumed that all memory devices of the serial interconnection configuration have been reset to "0".
CMD (39h) identifies the operation to be executed is the "write device address" (see Table 1).
DATA (00h) identifies that the initial number of the device address is "0".

Referring to FIGS. 7A-7D, at the top of the timing diagram, there is a signal for power (VDD) as indicated by 7-1. The timing diagram includes signals for the input enable (IPE) and the serial input (SIP) for device_0 as indicated by 7-2 and 7-3, respectively. The timing diagram includes signals for the input enable (IPE_1) and the serial input (SIP_1) for device_1 as indicated by 7-4 and 7-5, respectively. The timing diagram includes signals for the input enable (IPE_2) and the serial input (SIP_2) for device_2 as indicated by 7-6 and 7-7, respectively. The timing diagram includes signals for the input enable (IPE_n−1) and the serial input (SIP_n−1) for device_(n−1) as indicated by 7-8 and 7-9, respectively. The timing diagram includes signals for the input enable (IPE_n) and the serial input (SIP_n) for device_n as indicated by 7-10 and 7-11, respectively. Finally, the timing diagram includes signals for the input enable echo (IPEQ) and the serial output (SOP) for device_n, which is the last memory device in the serial interconnection configuration of the memory system, as indicated by 7-12 and 7-13, respectively.

For example, if this sort of memory system is applied to the memory system 42 of FIG. 3D, devices_0, _1, . . . , _(n−1) and _n will correspond to the memory devices 92, 93, . . . , 94 and 95, respectively.

Referring to FIGS. 3D and 7A-7D, the memory system is powered on as indicated by VDD 7-1 transitioning to a high state. Shortly thereafter, a first write device address operation 7-14 is issued by the memory controller 50. The first write device address operation 7-14 indicates a device type of NAND flash. The first write device address operation 7-14 traverses each memory device. Each NAND flash memory device is assigned its device address based on the device address indicated by the write device address operation. Each memory device that is assigned its device address increments the device address indicated by the first write device address operation before forwarding it along to the next memory device. There are 'n' increments in total corresponding to 'n' NAND flash memory devices. There is no increment by the last memory device because this memory device is not a NAND flash device, rather it is a NOR flash device. The first write device address operation 7-14 makes it way back to the memory controller. The memory controller determines the number of NAND flash devices to be equal to 'n' as indicated by the first write device address operation.

The memory controller 50 issues an additional write device address operation for each additional device type. A second write device address operation 7-15 indicating a device type of NOR flash is issued. The memory command for device address assignments of the NOR flash devices is:

| Memory Command (3) | | | |
|---|---|---|---|
| TYPE (01h) | TDA (00h) | CMD (39h) | DATA (00h) |

The second write device address operation 7-15 traverses each memory device. None of the NAND flash devices increment the device address indicated by the second write device address operation. The last memory device, which is a NOR device, is assigned its device address (TDA) as '00h'. The last memory device also increments the device address indicated by the second write device address operation before forwarding it to the memory controller. Upon receiving the second write device address operation 7-15, the memory controller determines that there is one NOR device based on the device address indicated by the second write device address operation.

Additional write device address operations may be issued by the memory controller, but are not shown for sake of simplicity. If, for example, SRAMs are assigned with devices addresses, TYPE of the memory command issued by the memory controller will be "03h" (see FIG. 5B).

The devices of the serial interconnection configurations perform operations in response to commands issued by the memory controller.

Referring to FIGS. 3D, 4A and FIGS. 7A-7D, the memory controller 50 issues a first write device address operation for a device type of NAND flash. During the IPE high, TYPE (NAND flash), TDA (00h), CMD (39h) and DATA (00h) contained in the SIP are fed to the first device 92 (i.e., device_0). The CMD (39h) causes the device controller/processor 142A of the device 92 to perform the "write device address" operation. Both of the TYPE of the SIP (DTs) and the device type (DTr) held in the device type register 146 are NAND flash and thus, the device type match determiner 143 provides a device type match result (i.e., the type match indication 143M). Also, the TDA is '00h' (DAs) matches the device address (DAr) held in the device address register 148 and thus, the address match determiner 147 provides a device address match result (i.e., the address match indication 147M). In response to the device type match result, the address increment operator 149 performs an addition of DATA and one to achieve an address increment ("DA+1"). In response to the device address match result, the device controller/processor 142A causes the device address register 148 to replace the previously held address with the received address (the value or number of DATA of the SIP), so that the device 92 is set as "NAND-0". The number of DATA of the SIP is replaced by the incremented address number. The whole instruction (of the SIP) except the DATA is bypassed. Therefore, a modified SIP (SIP_1) containing the TYPE (NAND flash), TDA (00h), CMD (39h) and incremented DATA (01h) is transmitted to the next device 93 (i.e., device_1).

These operations are performed during a time period TP1-SI between the IPE transition to high and the IPE_1 transition to high. The device 93 performs the same operations and is set as "NAND-1". The whole instruction (of the SIP_1) except the DATA is bypassed. These operations are performed during a time period TP1-1 between the IPE_1 transition to high and the IPE_2 transition to high. The received DATA is incremented by one and the incremented DATA (02h) is included in the SIP_2 from the device 93 to the next device 94 (i.e., device_2). These operations are performed during a time period TP1-2. Similarly, the device 94 performs the same operations and is set as "NAND-(n−1)". The whole instruction (of the SIP_(n−1)) except the DATA is bypassed. These operations are performed during a time period TP1-(n−1) between the IPE_(n−1) transition to high and the IPE_n transition to high. The device 95 does not, however, perform the same operations. In response to the input instruction of TYPE (NAND flash), TDA (00h), CMD (39h) and DATA (nh) contained in the SIP_n, the device 95 determines no device type match (i.e., mismatch) and ignores the instruction. Therefore, the DATA (nh) remains same for the next device with DATA no-increment. The instruction output from the device 95 (the last device) is transferred to the memory controller 50 as a feedback during a time period TP1-SO. The memory controller 50 recognizes the total number of the NAND-type devices being "n" from the number or value of the DATA.

Then, the memory controller 50 issues a second write device address operation for a device type of NOR flash. During the IPE high again, TYPE (NOR flash), TDA (00h), CMD (39h) and DATA (00h) contained in the SIP are fed to the first device 92 (i.e., device_0). The CMD (39h) causes the device controller/processor 142A of the device 92 to perform the device type match determination. The TYPE of the SIP (DTs) is NOR flash and the device type (DTr) held in the device type register 146 is NAND flash. Thus, the device type match determiner 143 provides a no-device type match result (or a mismatch) and the device 92 ignores the received (or input) write device address instruction. The DATA remains same with no increment. The device 92 (the device controller/processor 142A) forwards the TYPE (NOR flash), TDA (00h), CMD (39h) and DATA (00h) to the next device 93. A non-modified SIP (SIP_1) containing the TYPE (NOR flash), TDA (00h), CMD (39h) and non-incremented DATA (00h) is transmitted to the next device 93 (i.e., device_1). These operations are performed during a time period TP2-SI between the IPE transition to high and the IPE_1 transition to high.

In response to the received SIP_1, the device 93 performs the same operations. Due to a mismatch of the device type, the device 93 (the device controller/processor 142A) ignores the received instruction (a write device address) and the DATA byte remains same with no increment. The device 93 forwards the TYPE (NOR flash), TDA (00h), CMD (39h) and DATA (00h) contained in the SIP_2 to the next device 94 (i.e., device_2). These operations are performed during a time period TP2-1 between the IPE transition to high and the IPE_2 transition to high. Similarly, in response to the SIP_2 containing the TYPE (NOR flash), TDA (00h), CMD (39h) and DATA (00h), the device 94, the device 94 performs the same functions. Due to a mismatch of the device type, the device 94 ignores the write device address and the DATA byte remains same with no increment. These operations are performed during a time period TP2-(n−1).

In response to the SIP_n containing the TYPE (NOR flash), TDA (00h), CMD (39h) and DATA (00h), the device 95 performs the device type match determination. Both of the TYPE of the SIP (DTs) and the device type (DTr) held in the device type register 146 are NOR flash and thus, the device type match determiner 143 provides a device type match result (i.e., the type match indication 143M). Also, the TDA is '00h' (DAs) matches the device address (DAr) held in the device address register 148 and thus, the address match determiner 147 provides a device address match result (i.e., the address match indication 147M).

In response to the device type match result, the address increment operator 149 performs an addition of DATA and one to achieve an address increment ("DA+1"). In response to the device address match result, the device controller/processor 142A of the device 95 causes the device address register 148 to replace the previously held address with the received address (the value or number of DATA of the SIP), so that the device 95 is set as "NOR-0". The number of DATA of the SIP is replaced by the incremented address number. The whole instruction (of the SIP) except the DATA is bypassed. Therefore, the TYPE (NAND flash), TDA (00h), CMD (39h) and incremented DATA (01h) contained in the SOP is output. Since the device 95 is the last device the output SOP is transmitted to the memory controller 50. These operations are performed during a time period TP2-n between the IPE_n transition to high and the IPEQ transition to high. The instruction output from the device 95 is transferred to the memory controller 50 as a feedback during a time period TP2-SO. The memory controller 50 recognizes the total number of the NO-type devices being "1" from the number or value of the DATA.

Thereafter, at time TAME, the memory controller 50 issues another write device address operation for another device type. If there is no more device type to be initialized, then the system 44 is ready for the normal operation (e.g., the phase 11 as shown in FIG. 2C).

Example details will now be provided in the context of the examples presented above with reference to FIGS. 3A-3F.

These details relate to implementations having type-dependent addressing. In these implementations, each memory device has a device type and a device address, both of which are used for addressing purposes. Alternative implementations use type-independent addressing, details of which are provided below under a different section header. It is to be understood that details provided in this section are very specific for example purposes only.

Figure 8:
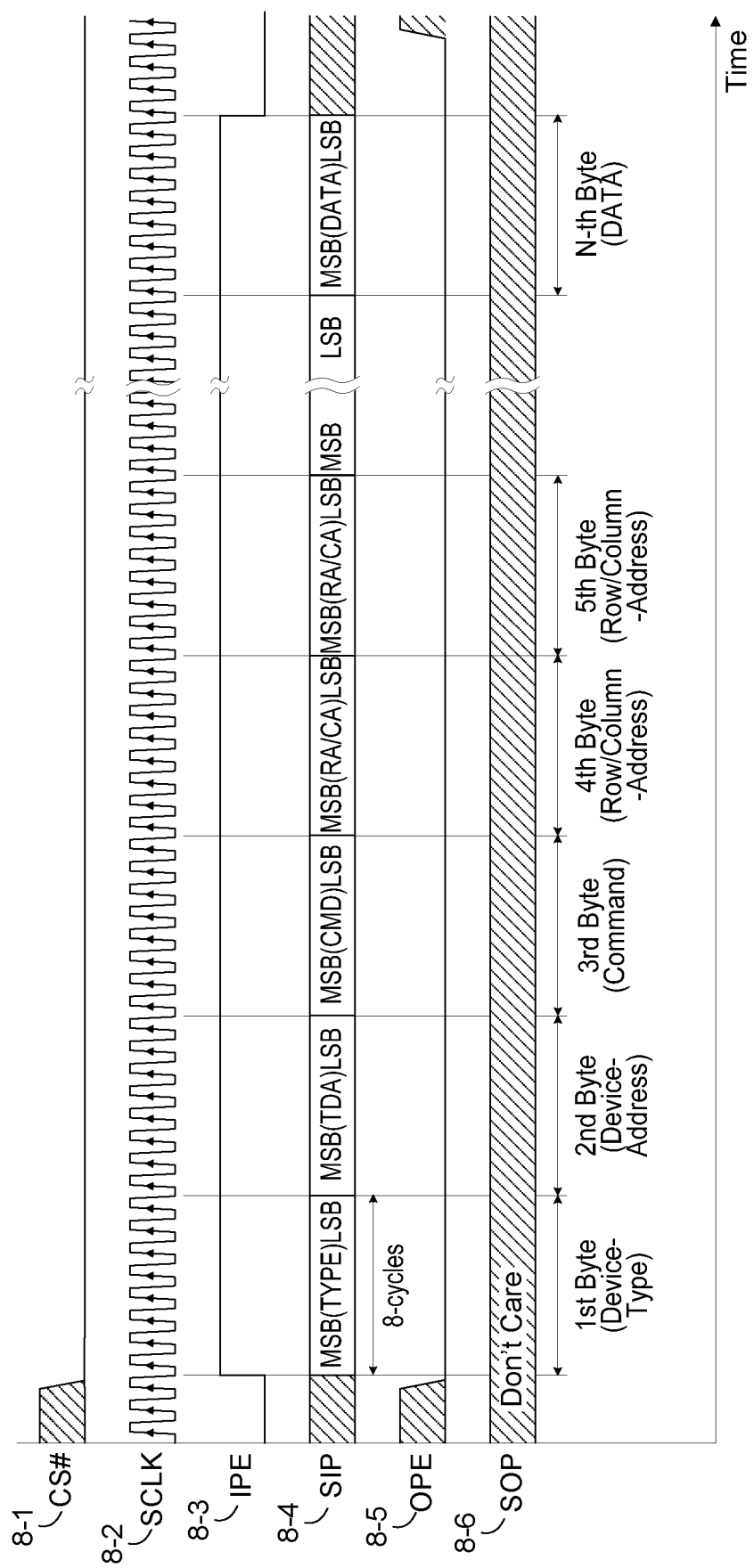
FIG. 8 is a timing diagram of an example input with type-dependent addressing.

FIG. 8 shows a timing sequence for the signals of an example input with type-dependent addressing. This timing diagram is applicable to every memory device of the example memory systems described above with reference to FIGS. 3A-3F. At the top of the timing diagram, signals are plotted for the chip select (CS#) as indicated by 8-1 and the serial clock (SCLK) as indicated by 8-2. Also, the timing diagram includes signals for the input interface, namely the input enable (IPE) as indicated by 8-3, the serial input (SIP) as indicated by 8-4, and the output enable (OPE) as indicated by 8-5. Furthermore, the timing diagram includes a signal from the output interface, namely the serial output (SOP) as indicated by 8-6.

The chip select CS#8-1 is active 'low' and therefore should be logic 'low' in order to enable all of the memory devices connected in the memory system. The SCLK 8-2 is a free running serial clock signal. The IPE 8-3 has a transition point from logic 'low' to logic 'high' indicating the beginning of an input stream in serialized byte mode. The memory device receiving IPE 8-3 in the logic 'high' state should be ready to process data streaming through the SIP port in byte mode definition. The first byte of SIP 8-4 carries the information of 'Device Type'. The first byte includes eight cycles of SCLK 8-2 referenced to the rising edges, MSB (Most Significant Bit) first, LSB (Least Significant Bit) last. Following the first byte, the second byte of the SIP 8-4 continues carrying the 'Device Address' information (e.g., a target device address (TDA). The third byte follows the second byte carrying the 'Command' information, and fourth, fifth, and/or sixth and more bytes follow carrying the 'Row/Column Addresses'. If applicable (e.g., write-related operations), one or more data input bytes follow.

As shown in the timing diagram, alignment of a 'serial byte' of the SIP 8-4 along with IPE 8-3 is defined as a series of eight clock cycles using the rising edge of the SCLK 8-2. In other implementations, falling edges of the SCLK 8-2 can be used too. If both rising edges and falling edges of the SCLK 8-2 are used, then only 4 clock cycles will be necessary for forming one 'serial byte' because of 'double-edges' of clocking. One byte includes eight bits, and one bit represents either a state of logic 'high' or logic 'low'.

In the illustrated example, the SOP 8-6 is indicated as a logic 'don't care', as the memory device is not enabling data output to the next memory device. However, if the memory device were to be enabling data output to the next memory device, then the memory device would have the output enable (OPE) driven to a logic 'high' state and the SOP 8-6 would not be a logic 'don't care'.

Alternatively, the byte of the SIP 8-4 carrying the information may the LSB go first and the MSB goes to last position.

An example when a memory device is receiving data and forwarding data to a next memory device is provided below with reference to FIG. 9.

Figure 9:
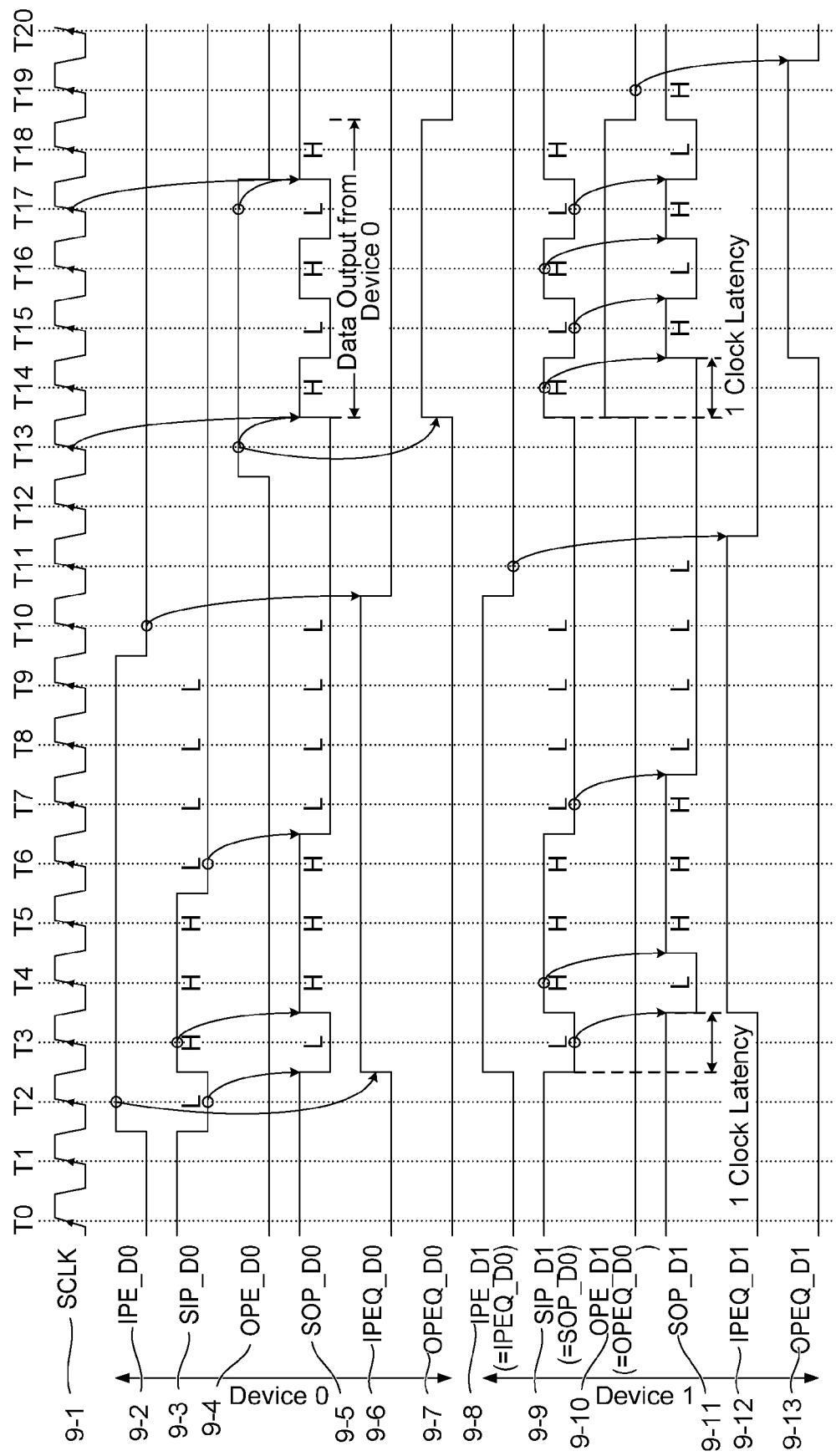
FIG. 9 is a timing diagram of example signaling through two adjacent memory devices.

FIG. 9 shows a timing sequence of example signaling through two adjacent memory devices. This timing diagram is applicable to each pair of adjacent memory devices of the example memory systems described above with reference to FIGS. 3C, 3D, 3E and 3E. In this example, the first device, named Device 0, and the second device, named Device 1, are chosen for the purpose of description. The suffix '_D0' and '_D1' in every signal name represent two devices, Device 0 and Device 1, respectively, for the purpose of description. At the top of the timing diagram, a signal is plotted for the serial clock (SCLK) as indicated by 9-1. Next, the timing diagram includes signals for the input interface of Device 0, namely the input enable (IPE_D0), the serial input (SIP_D0) and the output enable (OPE_D0) as indicated by 9-2, 9-3 and 9-4, respectively. Next, the timing diagram includes signals from the output interface of Device 1, namely the serial output (SOP_D0), the input enable echo (IPEQ_D0) and the output enable echo (OPEQ_D0) as indicated by 9-5, 9-6 and 9-7, respectively. Next, the timing diagram includes signals from the input interface of Device 1, namely the input enable (IPE_D1), the serial input (SIP_D1) and the output enable (OPE_D1) as indicated by 9-8, 9-9 and 9-10, respectively. Note that the signals input to the input interface of the second memory device, Device 1, are identical to the signals output from the output interface of the first memory device, Device 0. Next, the timing diagram includes signals from the output interface of Device 1, namely the serial output (SOP_D1), the input enable echo (IPEQ_D1) and the output enable echo (OPEQ_D1) as indicated by 9-11, 9-12 and 9-13, respectively.

The timing diagram is provided only for description purpose; therefore all waveforms are not showing real operation. At time T2, IPE_D0 9-2 transitions to a logic 'high' state on the rising edge of the SCLK 9-1, which means the beginning of serial data stream-in through SIP_D0 9-3. Next, Device 0 starts to receive SIP_D0 9-3 and processes appropriate operation according to the serial stream-in information. Also, Device 0 echoes the logic 'high' state of IPE_D0 9-4 to IPEQ_D0 9-6, which is connected to the IPE port of Device 1. Also, stream-in data of SIP_D0 9-3 is echoed to SOP_D0 9-5, which is connected to the SOP port of Device 1. This procedure continues until time T10, where a logic 'low' state of IPE_D0 9-2 is detected on the rising edge of the SCLK 9-1. In Device 1 level, IPE_D1 9-8 shows the same signal waveforms logically with IPEQ_D0 9-7 signal in Device 0 level because IPEQ_D0 9-6 connects to IPE_D1 9-8 directly through a wire or other interconnecting method. Also SIP_D1 9-9 shows the same signal waveforms logically with SOP_D0 9-5 signal in Device 0 level because SOP_D0 9-5 connects to SIP_D1 9-9 directly through a wire or other interconnecting method. In Device 1, similar procedure as in Device 0 occurs, resulting in echoing of SIP_D1 9-9 to SOP_D1 9-11 and IPE_D1 9-8 to IPEQ_DL 9-12.

In the illustrated example, there is a one clock cycle latency for the echoing procedure. However, more generally, any appropriate clock cycle latency may be implemented. For example, clock cycle latencies of a half clock cycle, two clock cycles, or more than two clock cycles may be implemented. The clock cycle latency through each memory device determines the total clock latency of the memory system. Assuming a one clock cycle latency and four devices in the system, then the last device's SOP_D3, IPEQ_D3 will have four clock cycles of latencies from the original SIP_D0 9-3, IPE_D0 9-2 signals. From T13 to T17 in Device 0 level, OPE_D0 9-4 signal is active, causing the serial output operation from Device 0 through the signal SOP_D0 9-5. At time T13, OPE_D0's 9-4 logic 'high' state is detected on the rising edge of SCLK 9-1, then Device 0 starts to output serial data stream through SOP_D0 9-5 port according to the device's previous condition. In this example, Device 0 is selected to output serial data, and Device 1 is not selected; therefore, Device 1 just echoes SIP_D1 9-9 signal (same to SOP_D0 9-5) to the SOP_D1 9-11 port. Serial output operation along with OPE ports has the same clock latency as the serial input procedure.

In the examples described with reference to FIGS. 3A-3F, the output enable echo (OPEQ) 69 from the last device 83, 87. 91, 95 or 99 is connected to the respective memory controller 50. In this manner, the memory controller 50 does not need to count the number of clock latencies, which is determined by the number of interconnected devices. The memory controller can detect the rising point of the OPEQ signal from the last device and can decide the starting point of serial data output streaming from the devices in the interconnection. In alternative implementations where the output enable echo (OPEQ) 69 from the last device 83, 87. 91, 95 or 99 is not connected to the memory controller 10, the memory controller 50 may predict based on prior knowledge of clock latencies as to when serial data will be received over the serial input (SIP) 59.

In the timing diagrams described above with reference to FIGS. 8 and 9, the signals plotted for SIP and (if applicable) SOP contain a memory operation, which follows a predetermined format. A table of example predetermined formats for memory operations is described below with reference to FIG. 10.

FIG. 10 shows a table of example predetermined formats for memory operations with type-dependent addressing. It is to be understood that this table is very specific for example purposes only. In the table, TYPE: Target Device Type
TDA: Target Device Address
CMD: Command Code
CA: Column Address
RA: Row Address
Note *1: TDA (Target Device Address) is '00h' when the first Write Device Address command is issued after power-up or hard reset.

Referring to FIG. 10, the table shows varying formats for different memory operations. In the table, there are 8 memory operations listed: read, write, erase, read status, read ID, write configuration register, write device address, and reset. There may be other memory operations, but they are not shown for sake of simplicity. The first byte defines the device type (TYPE). This information can be compared with on-chip pre-programmed device type register values in order to decide whether a serial input stream of data through the SIP port should be processed or not. Along with the device type, the second column designates the target device addresses (TDA), which is used to distinguish between memory devices of the same device type. The third byte defines a command definition (CMD). If appropriate (e.g., read operations), the 4th, 5th and/or more bytes define row address (RA) and/or column address (CA) information. If appropriate (e.g., write operations), additional bytes define the data (DATA) transmitted by the operation.

The device type, the device address, and the command are encoded in such a way that they are specific to the device type. Example encoding schemes are described below with reference to FIGS. 10 through 13. It is to be understood that these encoding schemes are very specific for example purposes only. Encoding schemes can be changed in different ways by manufacturers for their own purpose FIG. 11 shows a table of an example encoding scheme for type-dependent addressing. In the table,
DA[7:0]: Device Address (In this example, the maximum number of devices=$2^8$=256)
CA[11:0]: Column Address (In this example, the maximum number of columns=$2^{12}$=4,096)

RA[17:0]: Row Address (In this example, the maximum number of rows=$2^{18}$=262,144)

Referring to FIG. 11, the table defines the encoding scheme for the device address (TDA), the row address (RA), and the column address (CA). In this example, device address has eight bits in total so the maximum number of devices can be configured in this system is $2^8$=256. However, this device address definition can be expanded using another serial byte(s) as appropriate. Also, row address and column address bytes are shown in a similar way as device address format. As noted above for the table of FIG. 5B, the table definition can alternatively be in reverse order to have the LSB first.

FIG. 12 shows a table of an example encoding scheme for NAND flash commands with type-dependent addressing.

In the table,
*1: Target DA should be 00h when the 'Write Device Address' command is issued after power-up or hard reset.
*2: Row and Column Address bytes may not be provided if the same location page read command was issued before.

Referring to FIG. 12, the table defines the encoding scheme for each of 13 commands: Page Read, Random Data Read, Page Read for Copy, Target Address Input for Copy, Serial Data Input, Random Data Input, Page Program, Block Erase, Read Status, Read ID, Write Configuration Register, Write Device Address, and Reset. Each command includes the device type (Device TYPE), which according to the table of FIG. 5B is '00h' for the NAND flash memory. Next, each command includes the device address (Target DA), which is indicated as 'valid'. The device address can identify any device address to select a specific device in the serial interconnection. The device address column can be expanded to more bytes if appropriate. Next, each command includes a command definition. The command definition shown is similar to the conventional NAND flash memory command definition. The 4th column and 5th column in the table represents row address and column address, respectively, for selection of a specific row and column location in memory cell array block of NAND flash device. As shown in the table some commands do not include row and/or column address.

The number of bytes for each row and column address range can be changed according to the memory array size for the specific density. Row address and column address can be switched in either way. Therefore, column address bytes can alternatively be first and row address bytes can follow the column address. It depends on a specific memory chip design preference. The last column shows an input data column definition for 'write' operation commands, like 'Serial Data Input (80h)', 'Random Data Input (85h)' and 'Write Configuration Register (A0h)', for example. This input data byte can be as small as one byte or as large as N-bytes according to device specification. 'Read Status (70h)' command is necessary in order to check the status of each device using the same serial link port SOP, otherwise each device needs separate extra hard pin for the purpose of status indication. It also can be changed to different hex-number definition. 'Write Device Address (39h)' command is used if the interconnected devices use the soft generated device number instead of hard pin configuration. 'Reset (FFh)' command may perform a soft reset function to each selected device. This soft reset distinguishes from 'hard reset' using 'RST#' port which is connected to every device in the interconnection.

FIG. 13 shows a table of an example encoding scheme for NOR flash command with type-dependent addressing. In the table, Note *1: Target DA should be '00h' when the 'Write Device Address' command is issued after power-up or hard reset.
Note *2: Row and Column Address bytes may not be provided if the same location read command was issued before.

The table of FIG. 13 follows a similar format as the table of FIG. 12. However, the table of FIG. 13 can be seen to have a different set of 12 commands: Read, Write To Buffer, Program Buffer to Flash (confirm), Chip Erase, Sector Erase, Program/Erase Suspend, Program/Erase Resume, Read Status, Read ID, Write Configuration Register, Write Device Address, and Reset. Each command includes the device type (Device TYPE), which according to the table of FIG. 5B is '01h' for the NOR flash memory. 'Write DN Entry (39h)' command is used if the interconnected devices use the soft generated device number instead of hard pin configuration. As with the table of FIG. 12, the 'Reset (FFh)' command may perform a soft reset function to each selected device. This soft reset distinguishes from 'hard reset' using 'RST#' port which is connected to every device in the interconnection.

Figure 14:
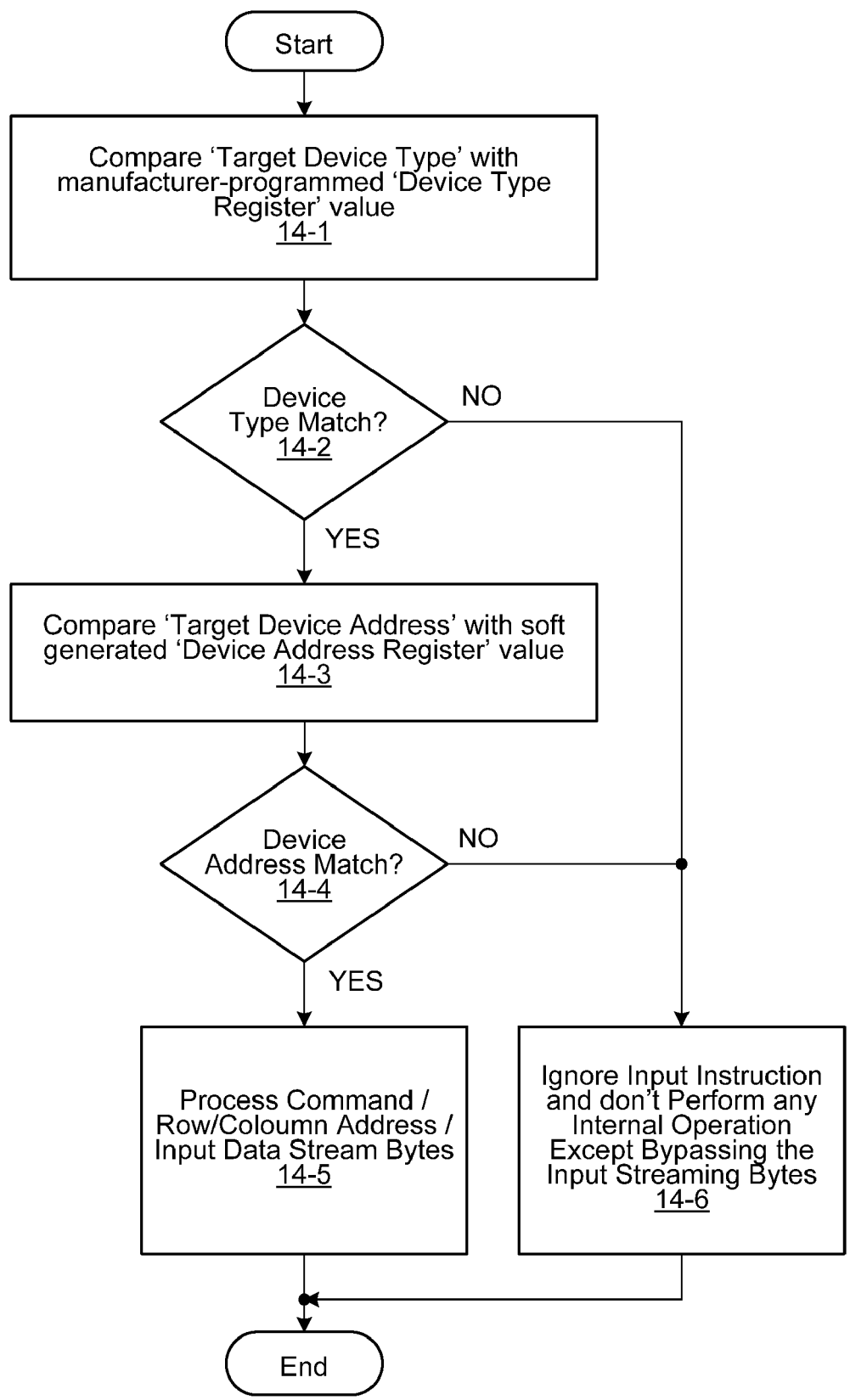
FIG. 14 is a flowchart of a method of processing memory operations with type-dependent addressing.

FIG. 14 shows a method of processing memory operations with type-dependent addressing. This process shows a general concept. A specific command or operation flow chart may be different from this example. An operation that does not involve reading or writing data, for example, does not involve transferring data. Also, if a command does not involve row or column address, then the memory device does not transfer row/column address bytes. When serial signal stream bytes are bypassed through IPE, SIP, OPE or SOP of each device in the interconnection, there is one clock cycle latency delay if bypass circuit is designed with one clock latency.

Referring to FIG. 14, upon a memory device receiving a memory command, the memory device compares the device type indicated by the memory command with its own device type as indicated by its type register (step 14-1). The memory command is specific to the device type indicated by the memory command. If the memory device determines whether the device type of the memory command matches the device type of its register (step 14-2). In a case where there is a type match between the two device types (YES at step 14-2), the memory device further compares the device address indicated by the memory command with its own device address as indicated by its device address register (step 14-3). If the memory device determines whether the device address of the memory command matches the device address of its register (step 14-4). In a case where there is an address match (YES at step 14-4), the memory device executes the command (step 14-5). Depending on the command, this may involve the memory device processing the row and column address indicated by the memory command, and may also involve processing data received as part of the memory command. However, if there is no match in the device type (NO at step 14-2), or there is no match in the device address (NO at step 14-4), then the memory device does not perform internal processing of the memory command except for forwarding the memory command to the next memory device (step 14-6).

To provide further explanation of the process of processing memory operations described above with reference to FIG. 14, a timing diagram is described below with reference to FIGS. 15A and 15B.

Figure 15A:
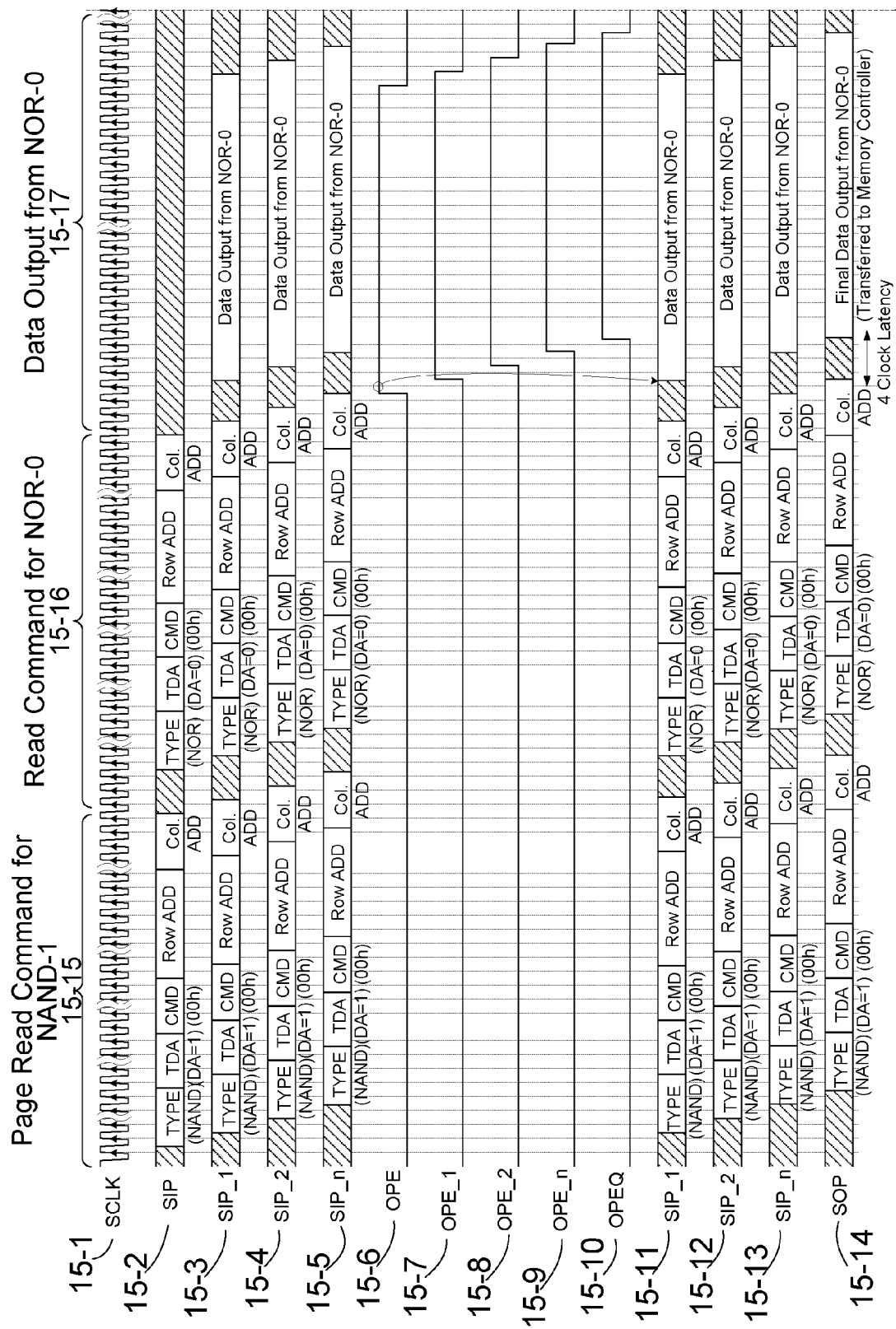
FIGS. 15A and 15B are timing diagrams of processing memory operations with type-dependent addressing.
Figure 15B:
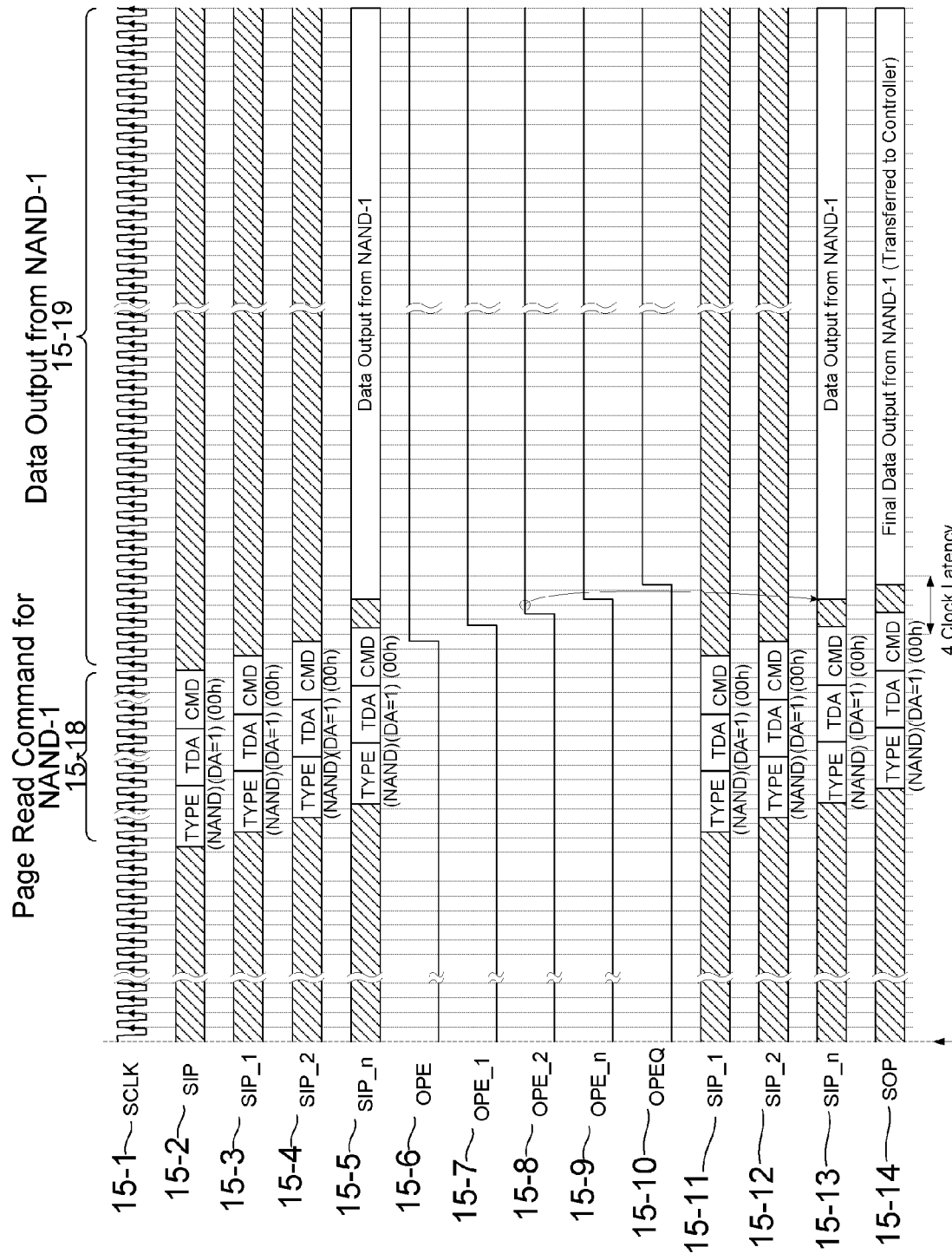

FIGS. 15A and 15B show timing sequences for the signals for processing memory operations with type-dependent addressing. The timing diagram shows example signals that may result from the memory system of FIG. 3B, which has one NOR-type flash device 84 and three NAND-type flash devices 85, 86, . . . , and 87 interconnected.

The memory command for page read of NAND flash devices issued by the memory controller is:

| Memory Command (4) | | | |
|---|---|---|---|
| TYPE (00h) | TDA (01h) | CMD (00h) | Raw/Column Addresses |

In the memory command:
TYPE (00h) identifies "NAND flash" devices (see FIG. 5B).
TDA (01h) identifies devices holding device address "1".
CMD (00h) identifies the operation to be executed is the "page read".
Raw/Column Addresses, instead of DATA, identify the raw and column addresses of the memory.

Similarly, the memory command for page read of NOR flash devices is:

| Memory Command (4) | | | |
|---|---|---|---|
| TYPE (01h) | TDA (01h) | CMD (00h) | Raw/Column Addresses |

Referring to FIGS. 3B, 15A and 15B, the NOR-type flash device 84 is the first device in the interconnection (i.e., closest to the memory controller 50). It has unique type plus device number (or type plus device identification, or type plus device address) as 'NOR-0'. The NAND-type flash devices 85, 86, . . . , and 87 are connected in series next to the NOR-0 device 84, having unique device numbers as 'NAND-0', 'NAND-1' and 'NAND-(n−1)'. At the top of the timing diagram, there is a signal for the serial clock (SCLK) as indicated by 15-1. Next, the timing diagram includes signals for the serial input (SIP) for each memory device 84, 85, 86, . . . , and 87 as indicated by 15-2, 15-3, 15-4, 15-5, respectively. Next, the timing diagram includes signals for the output enable (OPE) for each memory device 84, 85, 86, . . . , and 87 as indicated by 15-6, 15-7, 15-8, 15-9, respectively. Next, the timing diagram includes a signal for the output enable echo (OPEQ) for the last memory device 87 as indicated by 15-10. Finally, the timing diagram includes signals for the serial output (SOP) for each memory device 84, 85, 86, . . . , and 87 as indicated by 15-11, 15-12, 15-13, 15-14, respectively. For the simple descriptive purpose, other signals like IPE, CS#, RST# are not shown in the timing diagram.

In the timing diagram, as indicated by 15-15, a 'page read command set for NAND-1' is issued first with device type (TYPE=NAND), target device address (DA=1), command (00h), and row/column addresses. This serial stream of input signals is passed through the devices in sequence, and only the selected device (in this case, NAND-1) processes the given 'page read' command inside the device. Usually NAND-type flash memory takes much longer time (typically 20 μs) for internal 'page read operation' which transfers data from the NAND flash cells to data registers block. Therefore, the memory controller should wait for that time of 20 μs. However, the memory controller can access NOR-type flash device, NOR-0, while waiting for NAND-1's long page read time. So, as indicated by 15-16, a 'page read command set for NOR-0' is issued right after the 'page read command set for NAND-1'. NOR-type flash memory has very fast read access time, such as 100 ns for example; therefore, the memory controller can perform many fast operations like 'demand paging' from NOR-0. 'Demand paging' is a simple method of implementing virtual memory.

In a system that uses demand paging, the operating system copies a page into physical memory only if an attempt is made to access it (i.e., if a page fault occurs). It follows that a process begins execution with none of its pages in physical memory, and many page faults will occur until most of a process's working set of pages is located in physical memory. As indicated by 15-17, the final read data output from NOR-0 appears on SOP port at NAND-2, which directly connects to the SOP port of the controller after 4 clock cycle latency because the total number of connected memory devices is four. After waiting for long time, the memory controller can access NAND-1. At this time, as indicated by 15-18, the memory controller issues 'page read command set for NAND-1' without row/column address bytes, and raises OPE 15-6 signal from logic 'low' to logic 'high' state, which enables output circuitry in NAND-1 device, then read data output from NAND-1 starts to be streamed out through SIP/SOP ports connected in series as indicated by 15-19. There is 4 clock cycle latency at the final data output on SOP port of the memory controller.

Figure 16A:
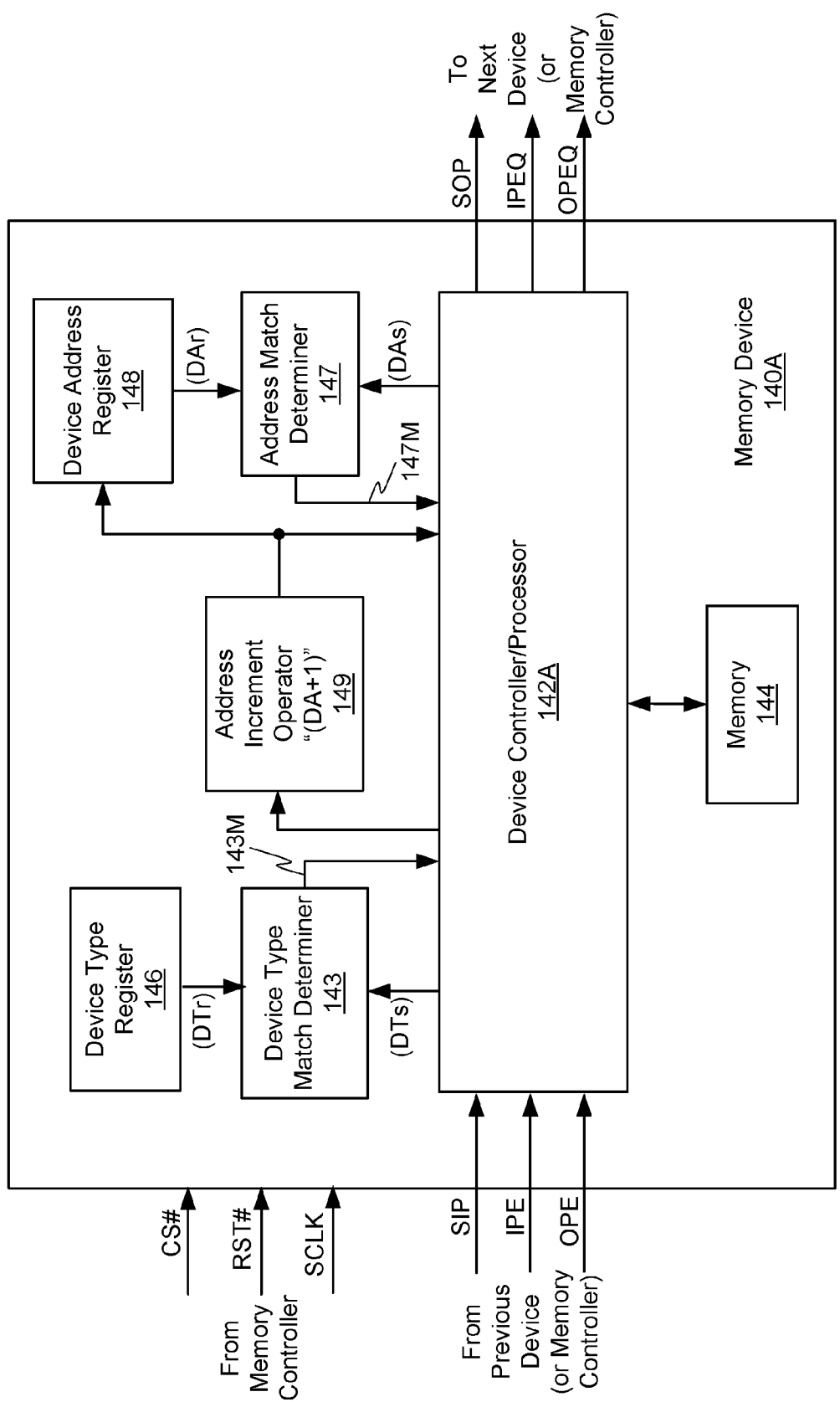
FIG. 16A is a schematic of another example memory device block used as the memory devices shown in FIGS. 3A, 3B, 3C, 3D and 3E.
Figure 16B:
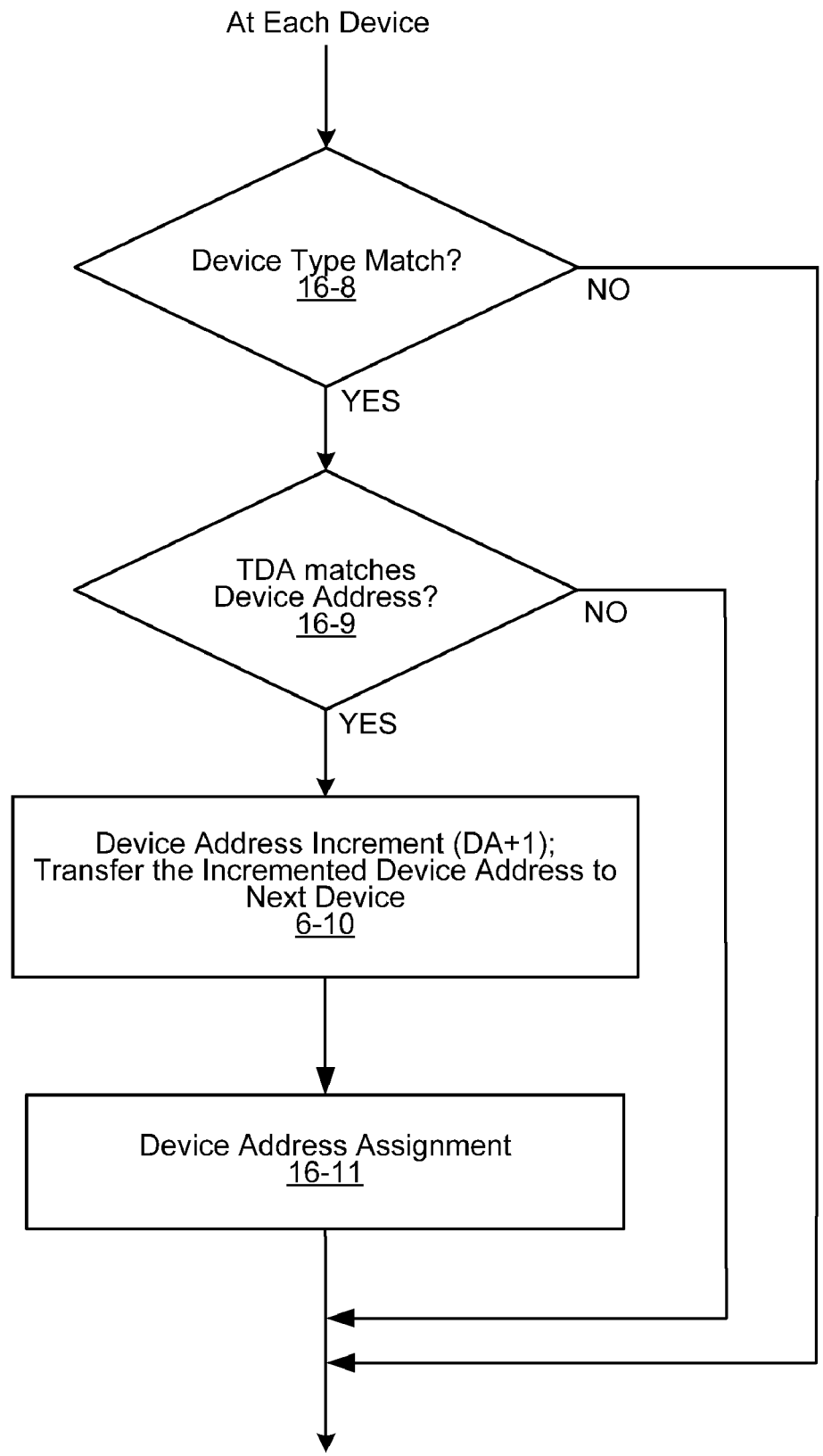
FIG. 16B is a flowchart of a device address assignment operation by the device shown in FIG. 16A.

FIG. 16A shows another example memory device block used as the memory devices shown in FIGS. 3A-3E. A memory device 140A shown in FIG. 16A is similar to the memory device 140A shown in FIG. 4A. Referring to FIG. 16A, an address increment operator 149 performs operation in response to a request in the initial phase from the device controller/processor 142A. In such a particular example, the device address to be assigned is the device address incremented by that device. Each device performs the device address assignment method shown in FIG. 6A. However, steps 6-10 and 6-11 shown in FIG. 6B are reversed, as shown in FIG. 16B.

Referring to FIGS. 3B, 4A, 16A and 16B, the device that received the write device address operation determines whether the received device type ('DTs") matches the device type thereof registered in the device type register 146 (step 16-8). If there is a device type match (YES at step 16-8) or a device type match result, then the address match determiner 147 determines whether the target device address (TDA) (i.e., 'DAs') matches the device address (DAr) registered in the device address register 148 (step 16-9). If there is a device address match (YES at step 16-9) or a device address match result, the device address match determiner 147 outputs the address match indication 147M. Then, the received device address ('DA') is incremented by the address increment operator 149 (step 16-10). The incremented address ('DA+1') is registered in the device address register 148 (step 16-11) and the incremented device address is transmitted to the next device. If there is no device type match (NO at step 16-8) or a non-device type match result, neither device address assignment nor device address increment will be performed. Also, if there is no device address match (NO at step 16-9) or a non-device address match result, neither device address assignment nor address increment will be performed.

Figure 16C:
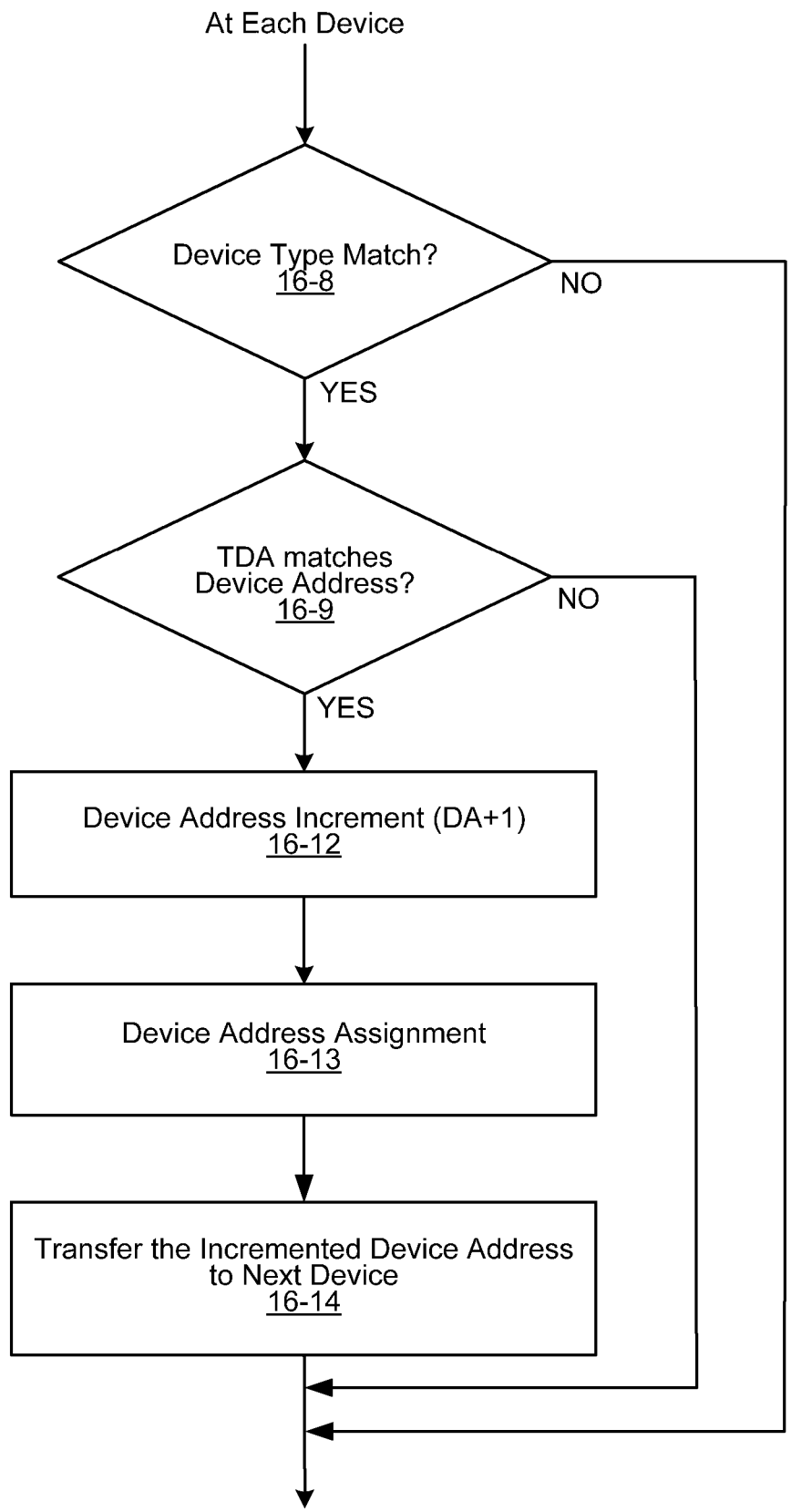
FIG. 16C is a flowchart of another device address assignment operation by the device shown in FIG. 16A.

FIG. 16C shows another device address assignment operation performed by the device of FIG. 6A. Steps 16-8 and 16-9 of FIG. 16C are identical to those of FIG. 16B. If there is a device type match (YES at step 16-8) and a device address match (YES at step 16-9), the received device address ('DA') is incremented by the address increment operator 149 (step 16-12). The incremented address ('DA+1') is registered in the device address register 148 (step 16-13) and the incremented device address is transmitted to the next device (step 16-14).

Figure 17:
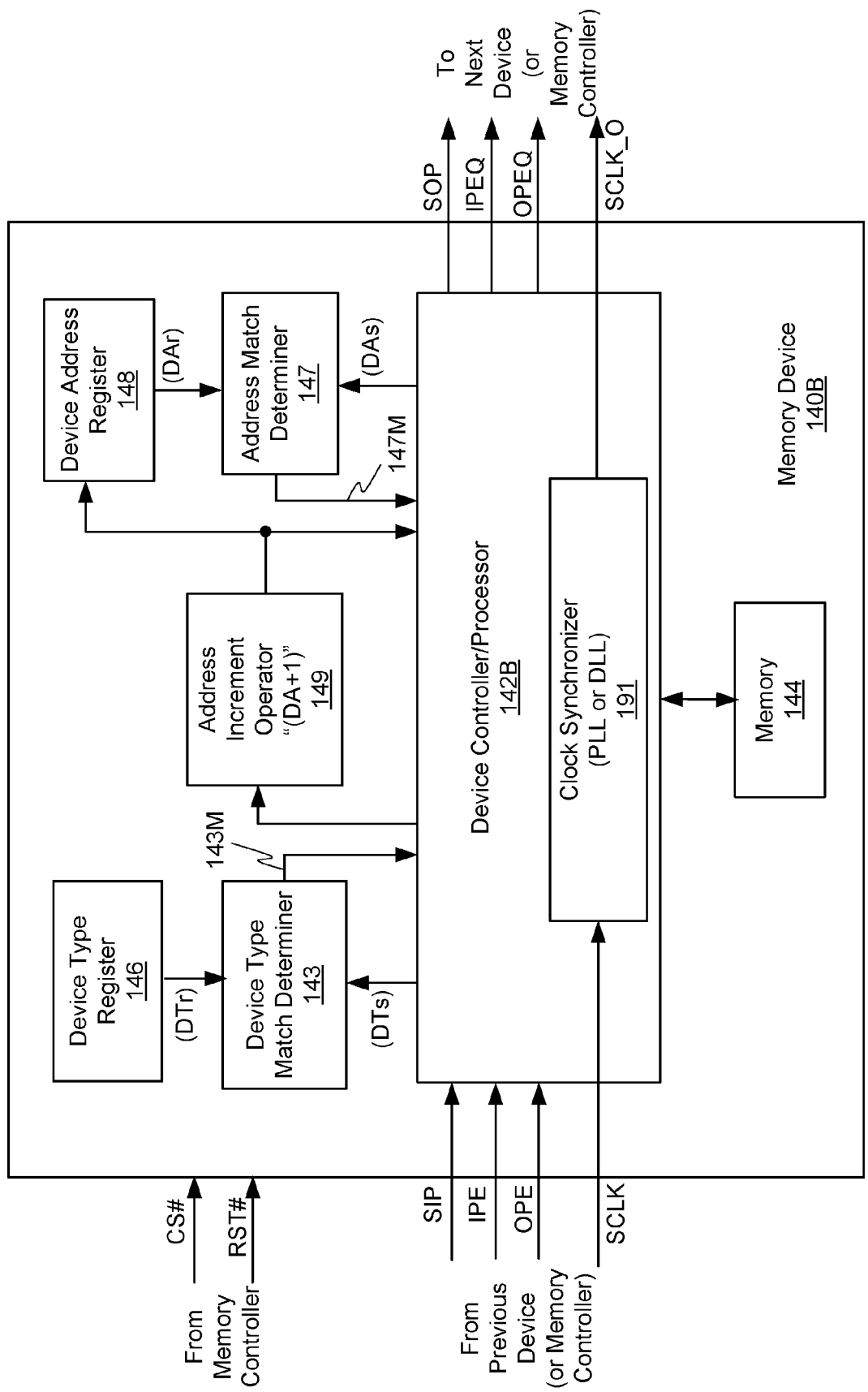
FIG. 17 is a schematic of another example memory device block used as the memory devices shown in FIG. 3F.

FIG. 17 shows another example memory device block used as the memory devices shown in FIG. 3F. A memory device 140B shown in FIG. 17 is similar to the memory device 140A shown in FIG. 4A. Referring to FIG. 17, an address increment operator 149 performs operation in response to a request in the initial phase from the device controller/processor 142B. The device 140B performs similar operations to those of FIG. 16B. The incremented device address provided by the address increment operator 149 is registered in the device address register 148 and transmitted to the next device.

Figure 18:
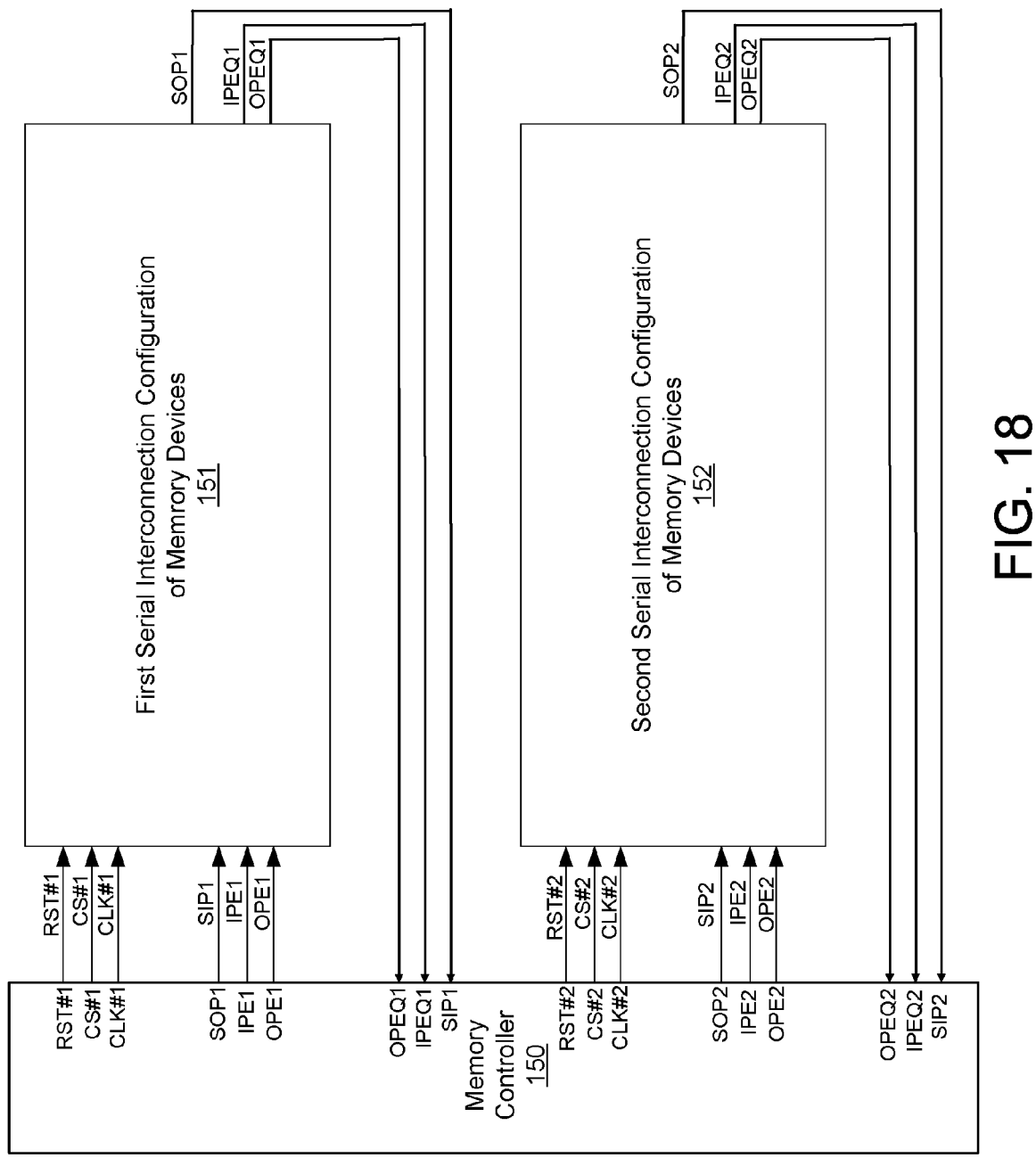
FIG. 18 shows a memory system of two channels according to another embodiment of the present invention.

FIG. 18 shows a memory system of two channels according to another embodiment of the present invention. Referring to FIG. 18, a first channel of the memory controller 150 is connected to a first serial interconnection configuration of memory devices 151 that are connected via serial links. Similarly, a second channel of the memory controller 150 is connected to a second serial interconnection configuration of memory devices 152 that are connected via serial links. The serial output (SOP), the input enable echo (IPEQ) and the output enable echo (OPEQ) from the last device of each of the serial interconnection configuration 131 are feed backed to the memory controller 150.

Figure 19A:
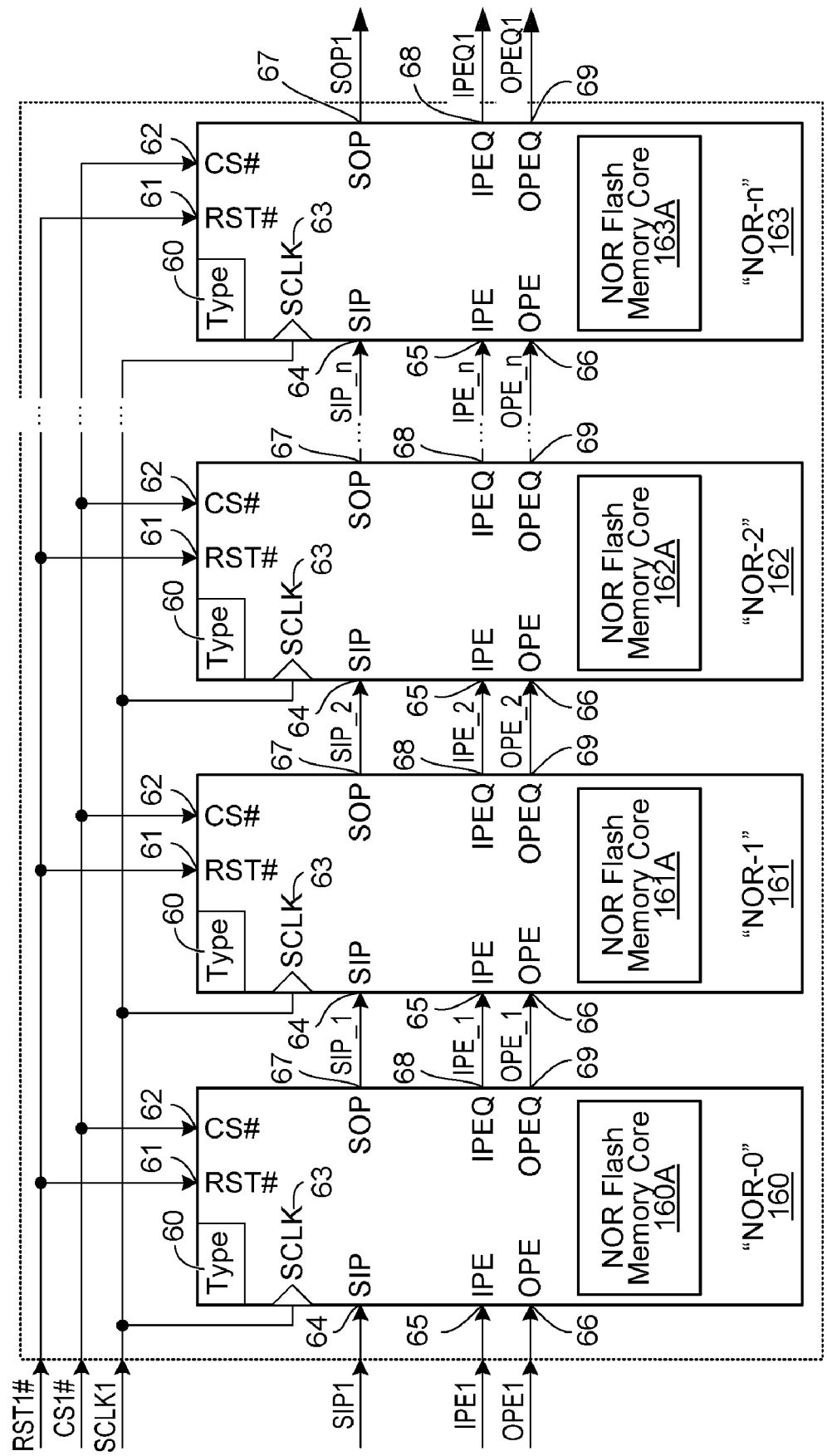
FIGS. 19A and 19B are schematics of specific example memory devices used in the memory system shown in FIG. 18.

Details of the first serial interconnection configuration of memory devices 151 are shown in FIG. 19A. Details of the second serial interconnection configuration of memory devices 152 are shown in FIG. 19B.

Referring to FIG. 19A, the first serial interconnection configuration of memory devices 151 includes (n+1) NOR flash memory devices 160, 161, 162, ..., and 163 that are serially interconnected. The devices 160, 161, 162, ..., and 163 have NOR flash memory cores 160A, 161A, 162A, ..., and 163A, respectively. Each of the devices 160, 161, 162, ..., and 163 has a register 60 for holding its memory type (NOR flash). In operation of initialization, the devices 160, 161, 162, ..., and 163 are assigned device addresses "NOR-0", "NOR-1", "NOR-2", ..., and "NOR-n", respectively. The assigned device addresses are held in the registers (not shown) of the devices.

Figure 19B:
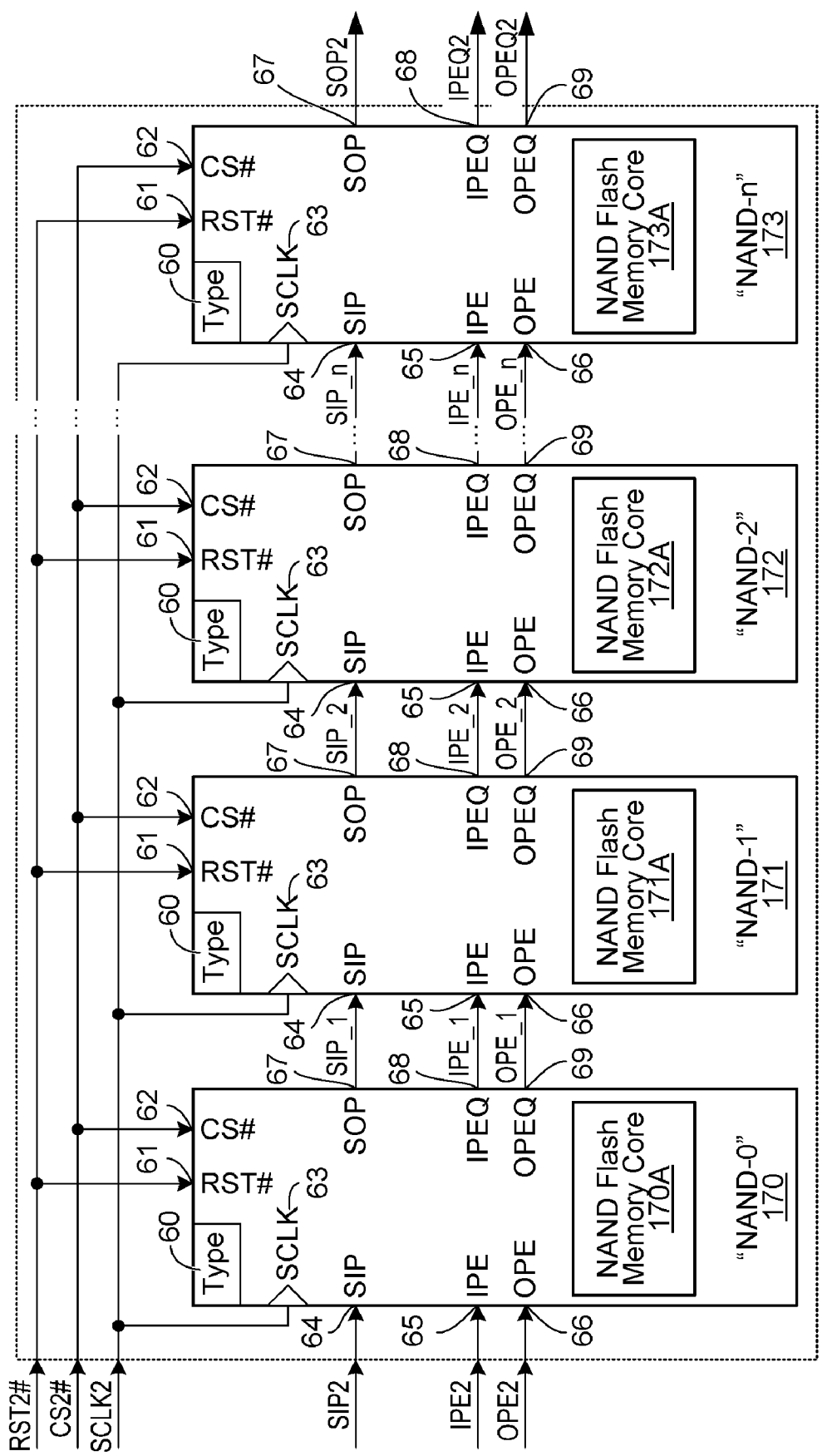

Referring to FIG. 19B, the second serial interconnection configuration of memory devices 152 includes (n+1) NAND flash memory devices 170, 171, 172, ..., and 173 that are serially interconnected. The devices 170, 171, 172, ..., and 173 have NAND flash memory cores 170A, 171A, 172A, ..., and 173A, respectively. Each of the devices 170, 171, 172, ..., and 173 has a register 60 for holding its memory type (NAND flash). In operation of initialization, the devices 170, 171, 172, ..., and 173 are assigned device addresses "NAND-0", "NAND-1", "NAND-2", ..., and "NAND-n", respectively. The assigned device addresses are held in the registers (not shown) of the devices.

Alternatively, the first serial interconnection configuration of memory devices 151 may include devices of mixed type. Also, the second serial interconnection configuration of memory devices 152 may include devices of mixed type.

Figure 20A:
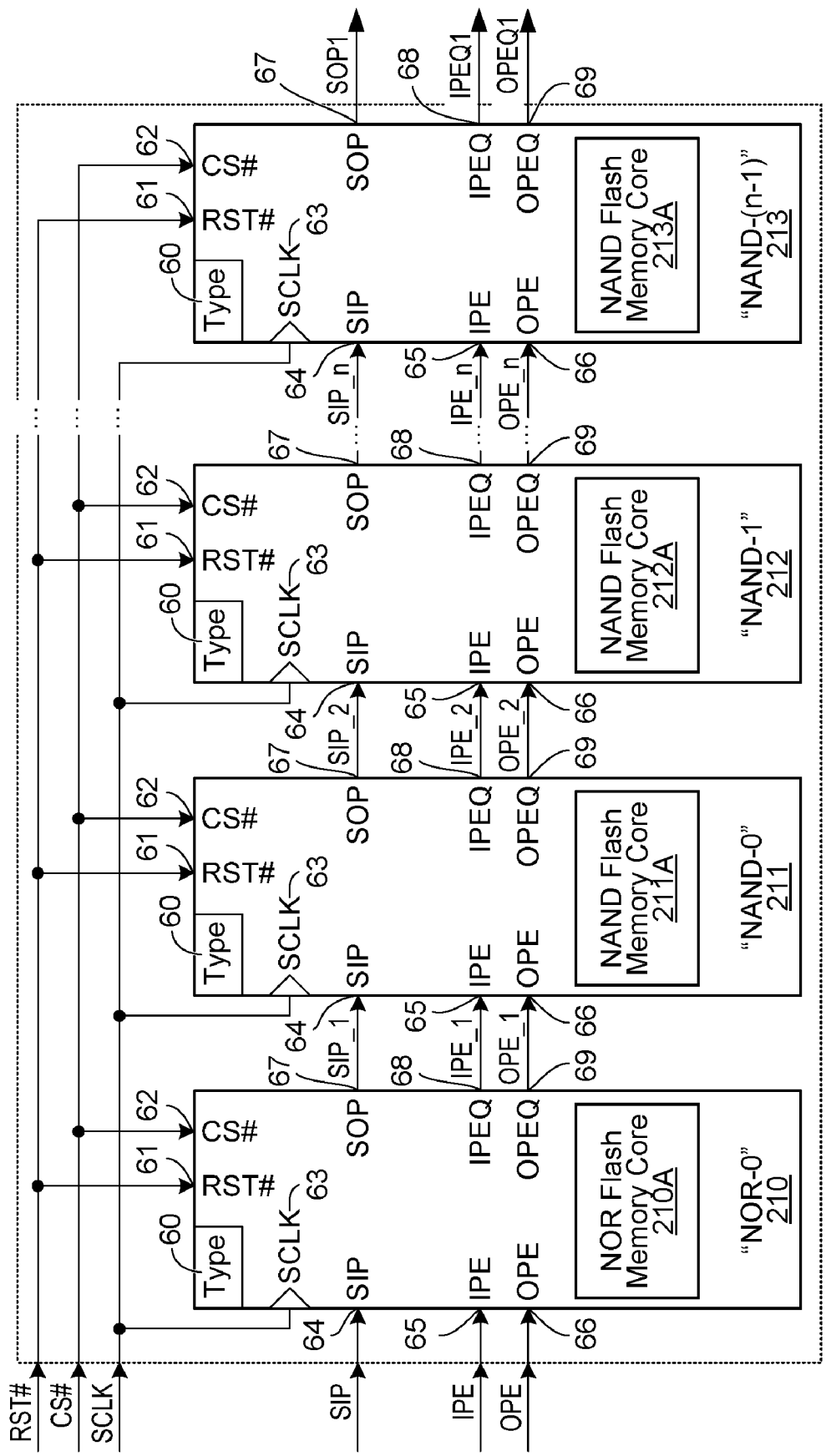
FIGS. 20A and 20B are schematics of other specific example memory devices used in the memory system shown in FIG. 18.
Figure 20B:
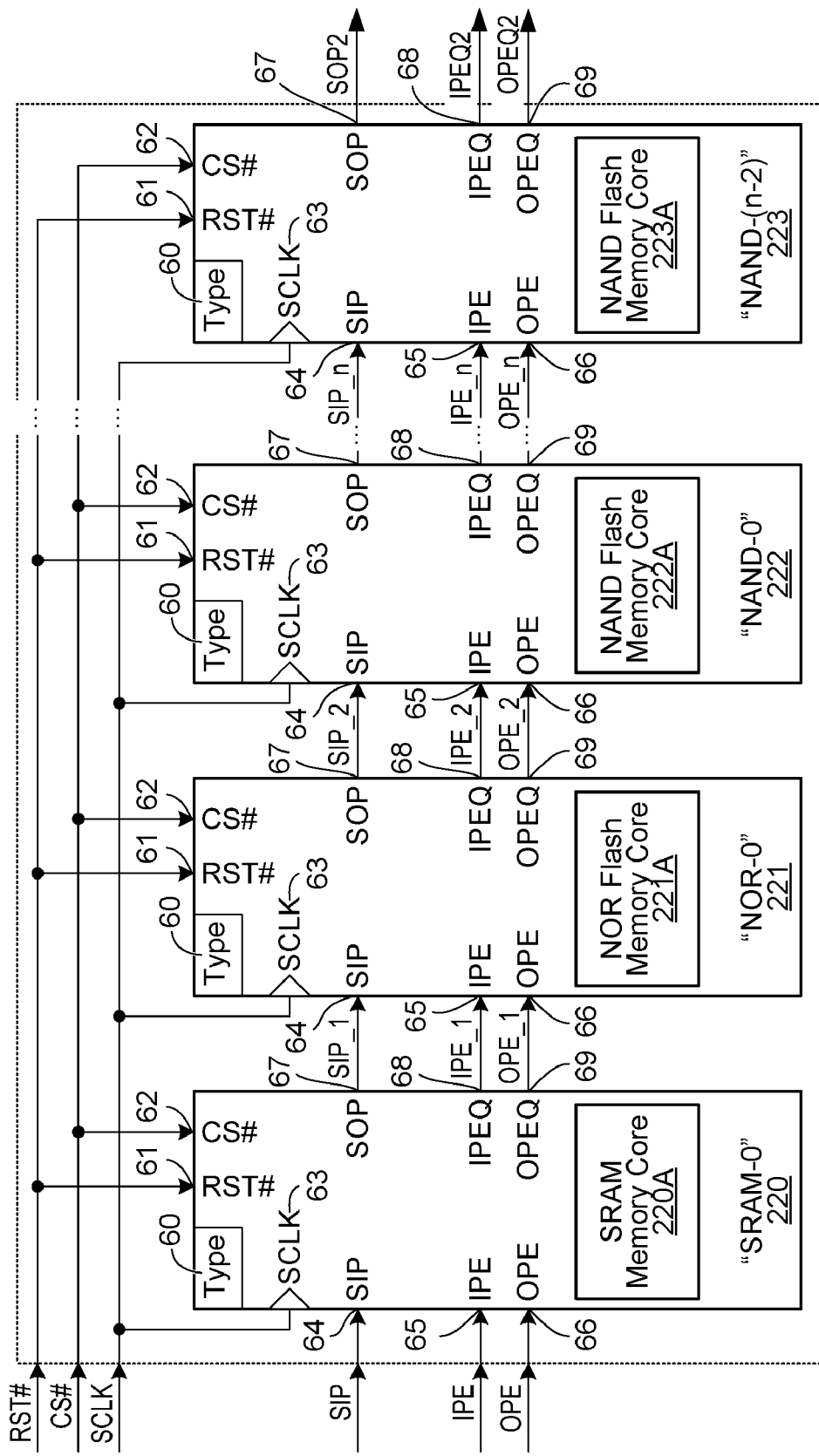

FIGS. 20A and 20B show schematics of other specific example memory devices used in the memory system shown in FIG. 16.

Referring to FIG. 20A, the first serial interconnection configuration of memory devices 151 includes (n+1) memory devices 210, 211, 212, ..., and 213 having the memory cores 210A, 211A, 212A, 213A that are the same as the FIG. 3B example. In the particular example shown in FIG. 3B, the first memory device 210 has a NOR flash memory core 210A and the second, third, ..., and (n+1)-th memory devices 211, 212, ..., and 213 have NAND flash memory cores 211A, 212A, ..., and 213A, respectively. The FIG. 3C example differs from the FIG. 3B example in that the type-wise addressing scheme is employed, namely the first addressing scheme introduced previously. The types plus addresses are indicated as 'NOR-0', 'NAND-0', 'NAND-1', ..., and 'NAND-(n−1)', assuming there is one NOR device and 'n' NAND devices.

Referring to FIG. 20B, the second serial interconnection configuration of memory devices 152 includes a plurality (n+1) memory devices 220, 221, 222, ..., and 223 having mixed memory cores 220A, 221A, 222A, ..., and 223A, respectively. The first memory device 220 has an SRAM memory core 220A and the second memory device 221 has a NOR flash memory core 221A. The third, ..., and (n+1)-th memory device 223 have NAND flash memory cores 222A, ..., and 223A, respectively. The memory devices are addressed using the type-wise addressing scheme. The types plus addresses are indicated as 'SRAM-0', 'NOR-0', 'NAND-0', ..., and 'NAND-(n−2)', assuming there is one SRAM device, one NOR device and '(n−1)' NAND devices.

Figure 21:
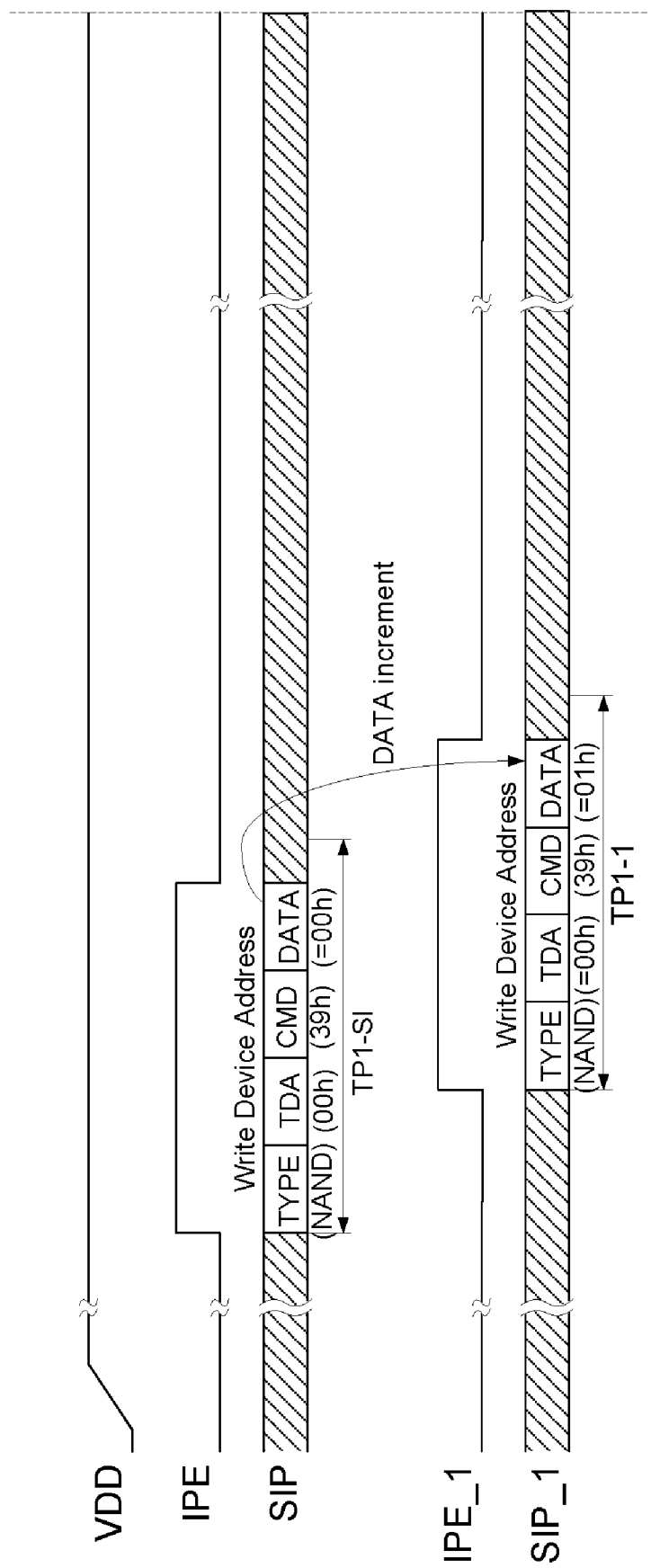
FIG. 21 is a timing diagram of another example of initializing the memory system.

In the embodiments described above, one memory command (e.g., the "write device address" command of the SIP is not overlapped with another memory command (e.g., the "write device address" command of SIP_1). In another implementation, the memory commands in the serial inputs to the devices may be overlapped as shown in FIG. 21. It requires, however, that the device address (DATA) increment by one device should be completed before the other device performs the address (DATA) increment.

Figure 22:
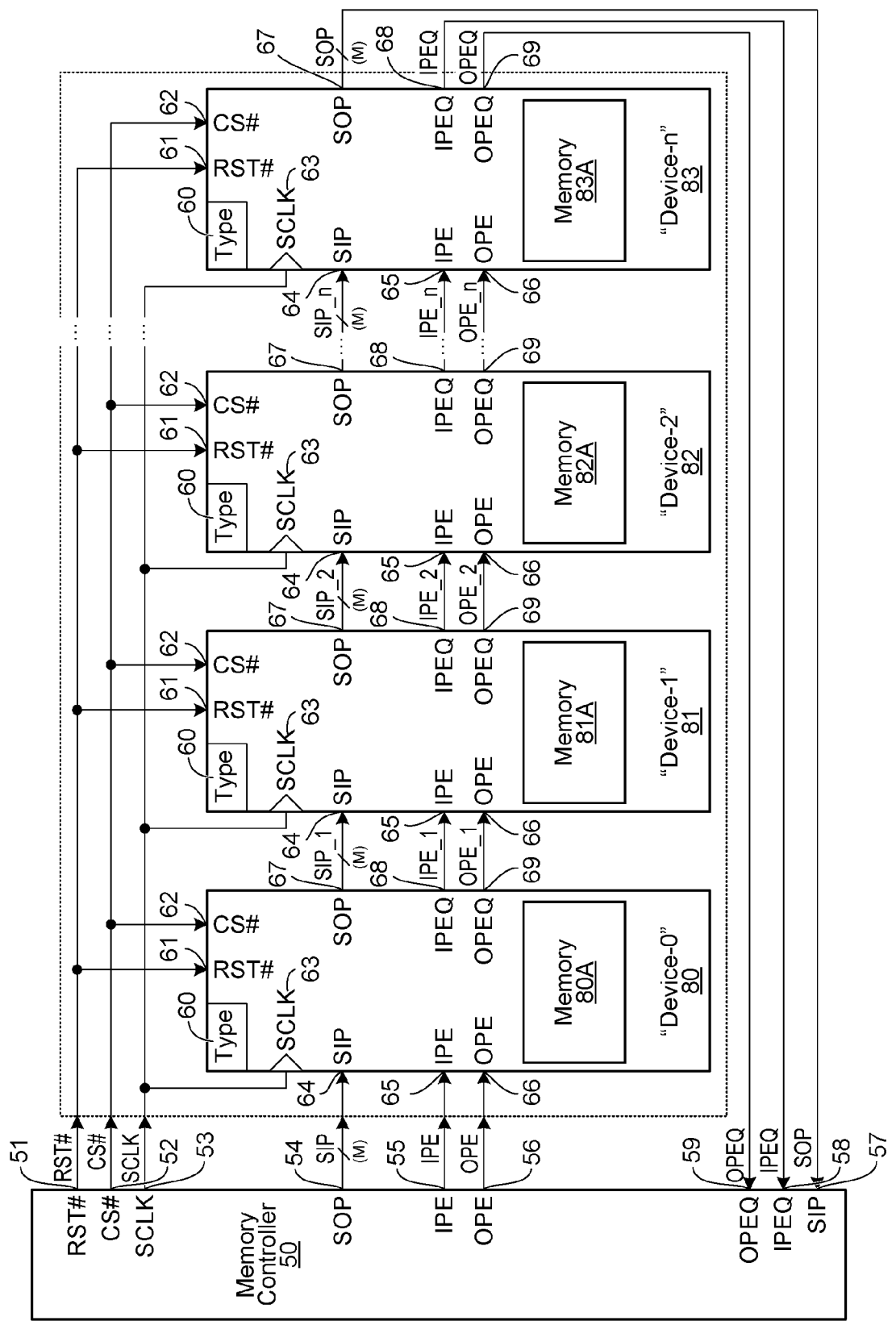
FIG. 22 is a schematic of another example memory system according to an embodiment of the present invention.

It will be apparent to those of ordinary skill in the art that the transmission of data, information or signals is performed by a single bit or a plurality of bits. For example, the data transmission over the serial input SIP and the serial output SOP is performed by a single bit or by a plurality of bits (M bits) as shown in FIG. 22, M being an integer greater than one. The interface may include a single I/O pin or a plurality of I/O pins.

Figure 23:
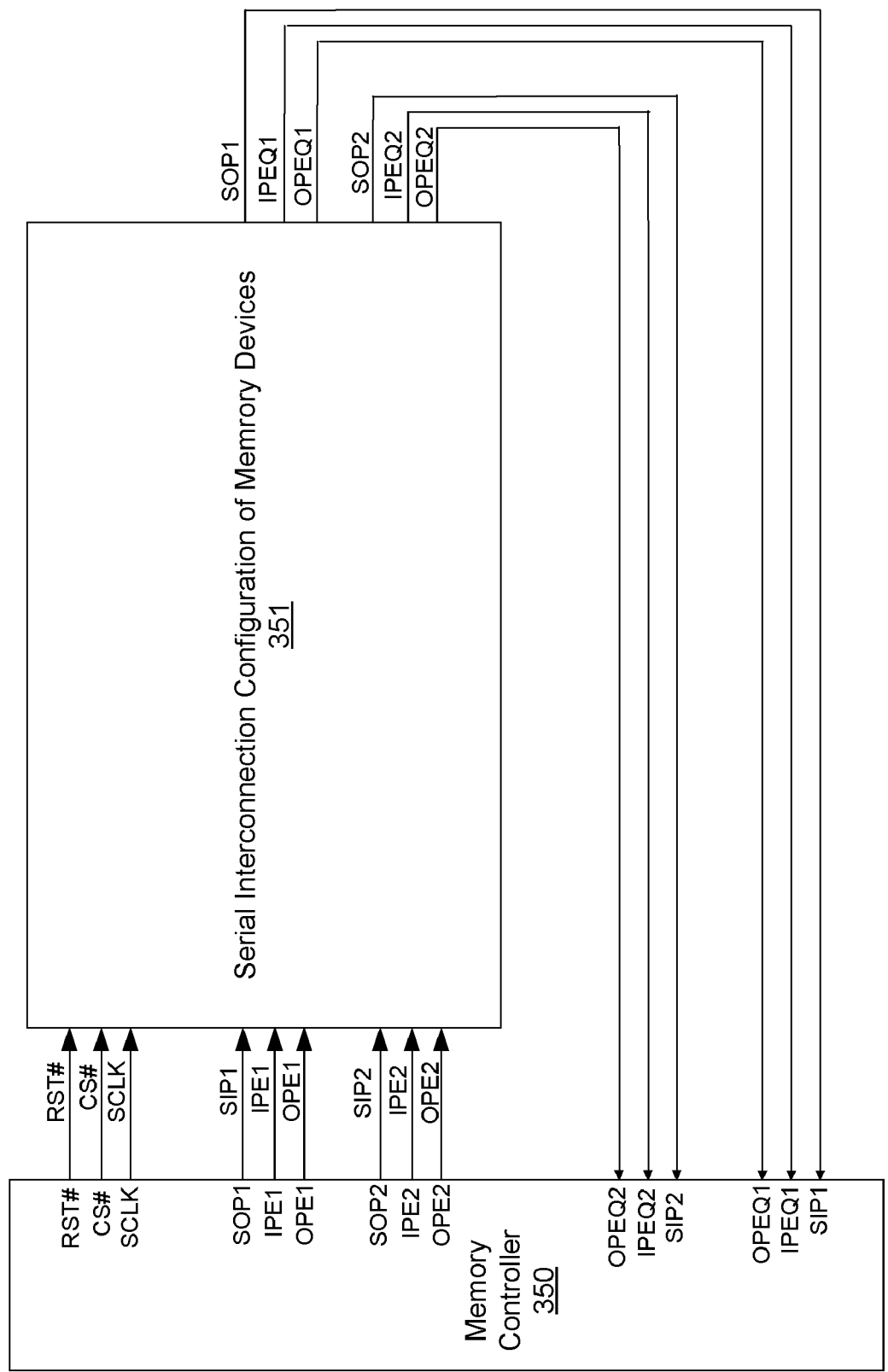
FIG. 23 is a block diagram of a memory system according to another embodiment of the present invention.
Figure 24:
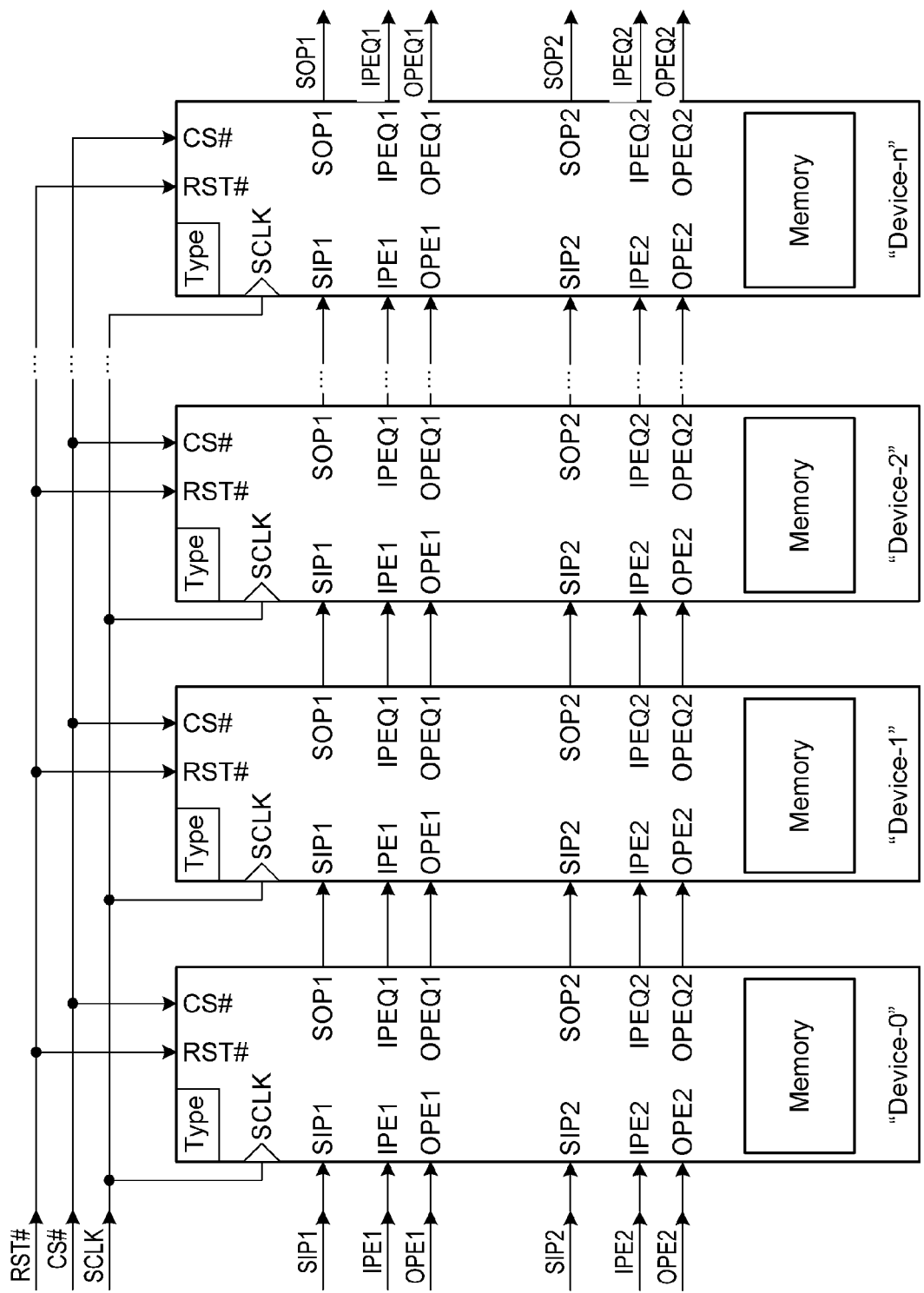
FIG. 24 is a schematic of specific example memory devices used in the memory system shown in FIG. 23.

FIG. 23 shows a memory system according to another embodiment of the present invention. The memory system shown in FIG. 23 includes a serial interconnection configuration of a plurality of memory devices 351 and a memory controller 350 for controlling operations of the devices. Details of memory devices in the configuration are shown in FIG. 24. In the illustrated example, the configuration includes (n+1) memory devices: Device-0, Device-1, Device-2, ... and Device-n. Each of the memory devices has a plurality of ports. In the particular example of FIG. 24, each device is a two port device. The memory controller 350 provides a reset signal "RST#", a chip select signal "CS#" and a serial clock signal "SCLK" to the respective ports of each of the memory devices.

Referring to FIGS. 23 and 24, a first memory device (Device-0) has a plurality of data input ports (SIP1, SIP2), a plurality of data output ports (SOP1, SOP2), a plurality of control input ports (IPE10, IPE2), and a plurality of control output ports (OPE1, OPE2). The data and control signals are sent from the memory controller 350 to the first memory device. A second memory device (Device-1) has the same types of ports as Device-0 to which Device-1 is connected. For example, Device-1 receives data and control signals from Device 0. A last memory device (Device-n) in the configuration provides data and control signals back to the memory controller 350 after a predetermined latency. Each memory device outputs an echo (IPEQ1, IPEQ2, OPEQ1, OPEQ2) of IPE1, IPE2, OPE1, and OPE2 (i.e., control output ports) to the subsequent device.

Figure 25:
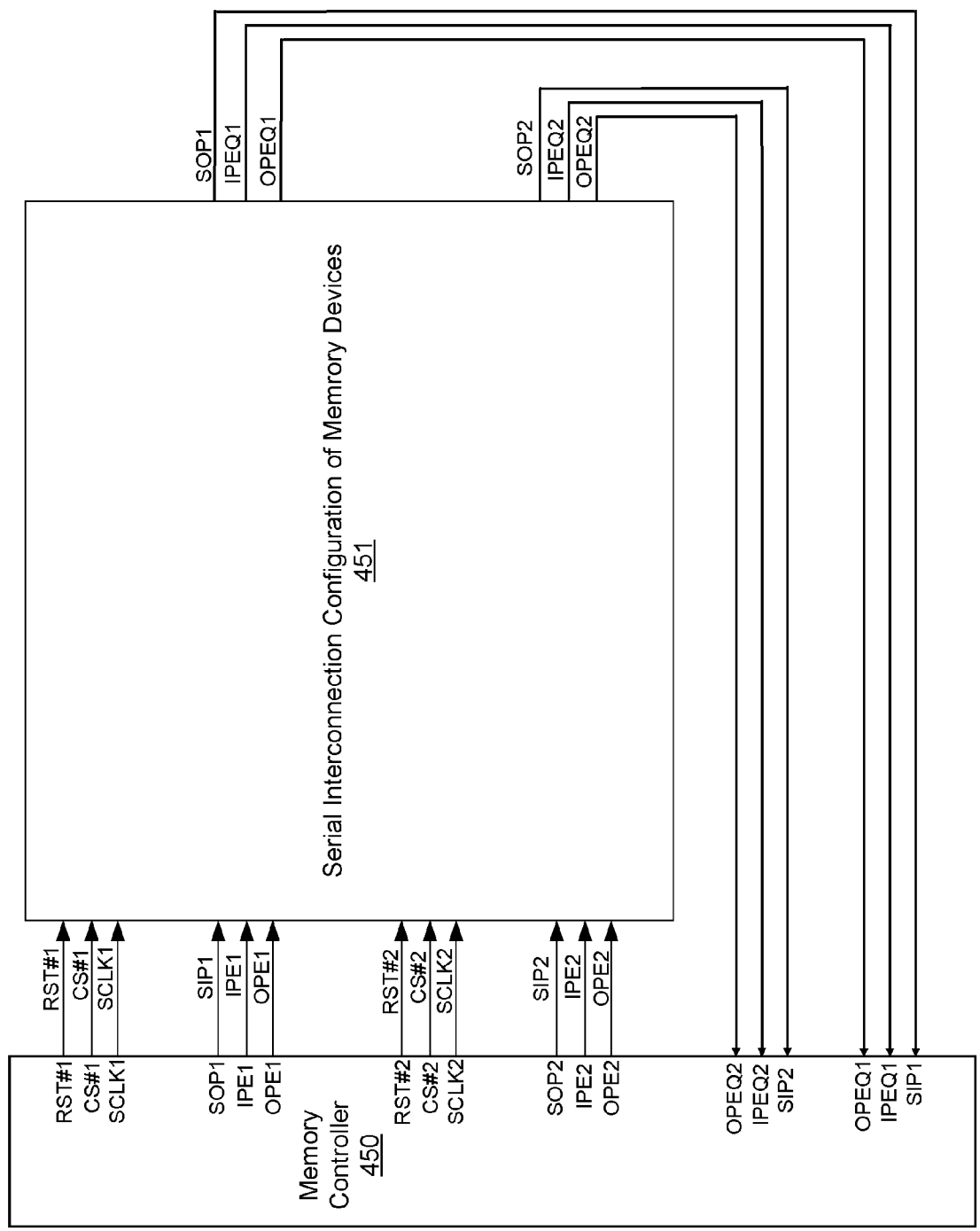
FIG. 25 is a block diagram of a memory system according to another embodiment of the present invention.
Figure 26:
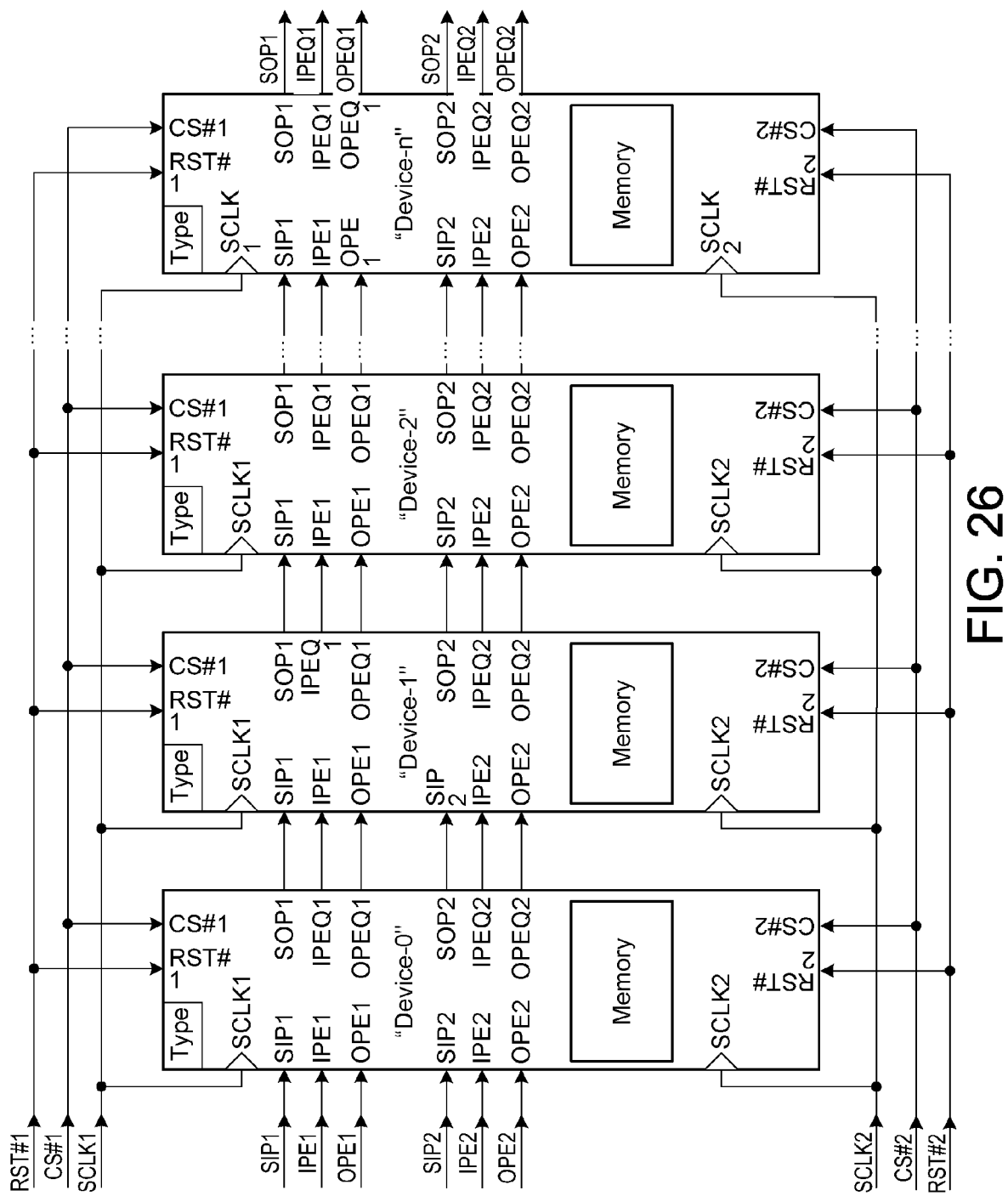
FIG. 26 is a schematic of specific example memory devices used in the memory system shown in FIG. 25.

FIG. 25 shows a memory system according to another embodiment of the present invention. The memory system shown in FIG. 25 includes a memory controller 450 and a serial interconnection configuration of a plurality of memory devices 451. The configuration of devices is shown in FIG. 26. Each of the memory devices has a plurality of ports. In the particular example of FIG. 26, each device is a two port device. The memory controller 450 provides a plurality of groups of signals corresponding to the polarity of pots to the devices. In the illustrated example, a reset signal "RST#1", a chip select signal "CS#1" and a serial clock signal "SCLK1" are provided to the respective ports 1 of each of the memory devices. Similarly, for port 2, a reset signal "RST#2", a chip select signal "CS#2" and a serial clock signal "SCLK2" are provided to the respective ports of each of the memory devices.

In the memory systems and the devices shown in FIGS. 23-26, the devices shown in FIGS. 4A and 16A can be used in the serial interconnection configuration of memory devices. Also, the devices shown in FIGS. 4B and 17 can be used in the serial interconnection configuration of memory devices. In such a case, the clock signal SCLK is required to be transmitted as shown in FIG. 3F and each device has a clock synchronization circuit for providing the output echo clock signal, 'SCLK_O' for the next device.

In the embodiments described above, the device elements and circuits are connected to each other as shown in the figures, for the sake of simplicity. In practical applications of the present invention, elements, circuits, etc. may be connected directly to each other. As well, elements, circuits etc. may be connected indirectly to each other through other elements, circuits, etc., necessary for operation of the devices or apparatus. Thus, in actual configuration of devices and apparatus, the elements and circuits are directly or indirectly coupled with or connected to each other.

It will be apparent to those of ordinary skill in the art that semiconductor devices can be implemented as devices.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A semiconductor device for use in a serial interconnection configuration of a plurality of devices of mixed type wherein the plurality of devices are serially interconnected, the semiconductor device comprising:
   an input for receiving a serial input containing a device type identification, a command and a device address identification;
   a device type holder for holding a device type indicating the type of the device;
   an address holder for holding an assigned device address, the assigned address indicating the address of the device;
   a first comparator for comparing the device type identification of the serial input to the device type held by the device type holder to determine whether the device type identification relates to the held device type, and for providing a device type comparison result;
   a second comparator for comparing the device address identification to the device address held by the address holder to determine whether the device address identification relates to the held device address, and for providing an address comparison result; and
   a command executor for executing the command in response to the device type comparison result and the address comparison result.

2. The semiconductor device of claim 1, wherein the second comparator is configured to perform the comparing the device address identification to the held device address in response to the device type comparison result.

3. The semiconductor device of claim 2, wherein the first comparator comprises a type match determiner for determining whether the device type identification matches the held device type and providing a device type match or a non-device type match result as the device type comparison result; and
   the second comparator comprises an address match determiner for determining whether the device address identification matches the held device address held and providing a device address match or a non-device address match result as the address comparison result.

4. The semiconductor device of claim 3, wherein the command executor comprises a device controller for:
   controlling operation of the device in response to the received serial input; and
   executing the command contained in the received serial input, in response to the device type match result and the address match result.

5. The semiconductor device of claim 4, wherein the device controller transfers the device type identification, the command and the device address identification of the received serial input to a next device of the serial interconnection configuration, in response to any one of the non-device type match result and the non-device address match result.

6. The semiconductor device of claim 4, wherein:
   the device comprises a memory;
   the serial input contains data information that comprises information data relating to the memory; and
   the device controller is configured to execute the command based on the memory related information data to access the memory in response to the device type match result and the device address match result.

7. The semiconductor device of claim 6, wherein the device controller is further configured to transfer the device type identification, the device address identification, the command and the data contained in the received serial input to a next device of the serial interconnection configuration, in response to any of the non-device type match result and the non-device address match result.

8. The semiconductor device of claim 6, wherein the memory includes any one of NAND Flash EEPROM, NOR Flash EEPROM, AND Flash EEPROM, DiNOR Flash EEPROM, Serial Flash EEPROM, DRAM, SRAM, ROM, EPROM, FRAM, MRAM, and PCRAM.

9. A system comprising:
   a plurality of devices of mixed type, the devices being configured in a serial interconnection configuration wherein the devices are serially interconnected, each of the devices comprising:
   serial input and output connections, the serial input connection being configured to receive a serial input containing a device type identification, a command and a device address identification;
   a device type holder for holding a device type indicating the type of the device;
   an address holder for holding an assigned device address, the assigned address indicating the address of the device;
   a first comparator for comparing the device type identification of the serial input to the device type held by the device type holder to determine whether the device type identification relates to the held device type, and for providing a device type comparison result;
   a second comparator for comparing the device address held by the device address holder to determine whether the device address identification relates to the held device address, and for providing an address comparison result; and a command executor for executing the command in response to the device type comparison result and the address comparison result; and a serial output/input controller having a serial output connection for providing the serial input to the serial input connection of a first device of the serial interconnection configuration, the serial input being propagated through the serial interconnection configuration, the serial output/input controller having a serial input connection for receiving a serial output from a last device of the serial interconnection configuration.

10. The system of claim 9, wherein the plurality of devices is configured in one serial interconnection configuration, the type of the devices being mixed.

11. The system of claim 10, wherein the command executor comprises a device controller for controlling operation of the device in response to received serial input.

12. The system of claim 11, wherein each of the devices further comprises:
a device address indicator for indicating a device address to be assigned to the device; and
a device type indicator for indicating a device type of that device.

13. The system of claim 9, wherein the serial output/input controller provides the serial input containing the device type identification for identifying device type of a target device, the command and the device address identification for identifying a target device address to the serial interconnection configuration of the devices.

14. The system of claim 9, wherein:
the first comparator comprises a type match determiner for determining whether the received device type identification matches the device type held by the device type holder, the type match determiner providing a device type match result or a non-device type match result; and
the second comparator comprises an address match determiner for determining whether the received device address identification matches the device address held by the address holder, the address match determiner providing an address match result or a non-device address match result.

15. The system of claim 14, wherein the device controller of the device transfers the device type identification, the command and the device address identification of the received serial input to a next device of the serial interconnection configuration, in response to any one of the non-device type match result and the non-device address match result.

16. The system of claim 9, wherein:
the device comprises a memory;
the data information contained in the serial input further comprises information data relating to the memory, and
the device controller configured to execute the command based on the memory related information data to access the memory in response to the device type match result and the device address match result.

17. The system of claim 16, wherein the device controller is further configured to transfer the device type identification, the command and the device address identification of the received serial input to a next device of the serial interconnection configuration, in response to any one of the non-device type match result and the non-device address match result.

18. The system of claim 17, wherein the serial output/input controller further comprises:
a clock output connection for providing a serial clock signal to each of the devices of the serial interconnection configuration, the serial input being propagated in synchronization with the clock signal.

19. The system of claim 17, wherein:
each of the devices further comprises a clock synchronizer; and
the serial output/input controller further comprises a clock output connection for providing a clock signal to the first device of the serial interconnection configuration,
the clock synchronizer of each of the devices outputting an output clock signal synchronized with the input clock signal, the output clock signal being provided to the next device of the serial interconnection configuration, the serial input being propagated with synchronization with the clock signal.

20. A method for operating a plurality of devices of mixed type, the devices being configured in a serial interconnection configuration wherein the devices are serially interconnected, the method comprising:
providing a serial input to a first device of the serial interconnection configuration, the serial input being propagated through the serial interconnection configuration, the serial input containing a device type identification, a command and a device address identification;
determining at each device:
whether the received device type identification relates to a device type held in the device, and providing a device type comparison result;
whether the received device address identification relates to an assigned device address held in the device, and providing a device address comparison result; and
executing the received command of the serial input in response to the device type comparison result and the device address comparison result.

21. The method of claim 20, wherein:
determining whether the received device type identification relates to the held device type, comprises:
in a case where the received device type identification matches the held device type, a device type match result is provided; and
in a case where the received device type identification does not match the held device type, a non-device type match result is provided.

22. The method of claim 21, wherein:
determining whether the received device address identification matches the held device address, comprises:
in a case where the received device address identification matches the held device address, a device address match result is provided; and
in a case where the received device address identification does not match the held device address, a non-device address match result is provided.

23. The method of claim 22, further comprising:
executing the received command of the serial input in response to the device type match result and the device address match result.

24. The method of claim 21, wherein the device type identification, the command and the device address identification of the received serial input are transferred to a next device of the serial interconnection configuration, in response to any one of the non-device type match result and the non-device address match result.

25. The method of claim 21, wherein:
each device comprises a memory;
the data information contained in the serial input further comprises information data relating to the memory; and each device controller is configured to execute the command based on the memory related information data to access the memory in response to the device type match result and the device address match result.

26. The method of claim 25, wherein the device controller is further configured to transfer the device type identification, the command, the device address identification and the information data of the received serial input to a next device of the serial interconnection configuration, in response to non-match determination result.

27. An apparatus for operating a plurality of devices of mixed type, the devices being configured in a serial interconnection configuration wherein the devices are serially interconnected, the apparatus comprising:
a controller for providing a serial input to a first device of the serial interconnection configuration, the serial input being propagated through the serial interconnection configuration, the serial input containing a device type identification, a command and a device address identification,
each of the devices having
a device type holder for holding a device type indicating the type of the device,
an address holder for holding an assigned device address, the assigned address indicating the address of the device;
a first comparator for comparing the device type identification of the serial input to the device type held by the device type holder to determine whether the device type identification relates to the held device type, and for providing a device type comparison result, and
a second comparator for comparing the device address held by the device address holder to determine whether the device address identification relates to the held device address, and for providing an address comparison result.

28. The apparatus of claim 27, wherein:
each of the devices has serial input and output connections; and
the controller has a serial output connection connected to the serial input connection of the first device and a serial input connection connected to the serial output connection of a last device of the serial interconnection configuration.

29. The apparatus of claim 27, wherein the controller comprises:
a serial output connection for providing the serial input to the devices of the serial interconnection configuration, the serial input comprising first and second commands, the second command being subsequent to the first command,
the first command activating at least one device of a first type to process the first command,
the second command activating at least one device of a second type to process the second command, the process of the second command by at least one device of the second type being completed before the completion of the process of the first command by at least one device of the first type.

30. The apparatus of claim 29, wherein:
the device of the first type is a NAND-type flash memory device; and
the device of the second type is a NOR-type flash memory device.

31. A method comprising:
assigning device addresses to a plurality of devices of mixed type, the devices being configured in a serial interconnection configuration wherein the devices are serially interconnected, each of the devices being configured to hold its respective device type;
providing a serial input containing a device type identification, a device address identification and an address number to a first device of the serial interconnection configuration;
propagating the serial input through the plurality of devices of mixed type; and
accessing a device of the serial interconnection configuration in response to a device type comparison result and a device address comparison result determined by comparing the respective device type and the respective assigned address for the device to the device type identification and the device address identification, respectively.

32. The method of claim 31, wherein the step of assigning comprises: establishing addresses in each of the devices of one type.

33. The method of claim 31, wherein the step of accessing comprises:
activating at least one device of a first type to process a command; and
activating at least one device of a second type prior to completion of command processing in the at least one device of the first type.

34. The method of claim 33, wherein the command processing time of the at least one device of the first type is greater than that of the at least one device of the second type.

35. The method of claim 34, further comprising:
providing a series of first and second commands, the second command being subsequent to the first command, wherein:
activating the at least one device of the first type in response to the first command; and
activating the at least one device of the second type in response to the second command, processing of the second command by the at least one device of the second type being completed before the completion of processing of the first command by at least one device of the first type.

36. The method of claim 35, wherein:
the device of the first type is a NAND-type flash memory device; and
the device of the second type is a NOR-type flash memory device.

* * * * *